(12) United States Patent
Yoshinaga et al.

(10) Patent No.: US 9,263,561 B2
(45) Date of Patent: Feb. 16, 2016

(54) SEMICONDUCTOR DEVICE AND AN ELECTRONIC DEVICE

(71) Applicant: Renesas Electronics Corporation, Kawasaki-shi (JP)

(72) Inventors: Yasuyuki Yoshinaga, Kawasaki (JP); Kenta Sadakata, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/732,546

(22) Filed: Jun. 5, 2015

(65) Prior Publication Data

US 2015/0364587 A1    Dec. 17, 2015

(30) Foreign Application Priority Data

Jun. 16, 2014    (JP) .................. 2014-123776

(51) Int. Cl.
| | |
|---|---|
| *H01L 29/66* | (2006.01) |
| *H01L 29/739* | (2006.01) |
| *H01L 23/00* | (2006.01) |
| *H01L 23/492* | (2006.01) |
| *H01L 29/45* | (2006.01) |
| *H01L 29/417* | (2006.01) |

(52) U.S. Cl.
CPC .......... *H01L 29/7397* (2013.01); *H01L 23/492* (2013.01); *H01L 24/32* (2013.01); *H01L 29/41708* (2013.01); *H01L 29/45* (2013.02); *H01L 2224/32245* (2013.01); *H01L 2924/01013* (2013.01); *H01L 2924/01022* (2013.01); *H01L 2924/01028* (2013.01); *H01L 2924/01029* (2013.01); *H01L 2924/0132* (2013.01); *H01L 2924/01046* (2013.01); *H01L 2924/01074* (2013.01); *H01L 2924/01079* (2013.01)

(58) Field of Classification Search
CPC ............ H01L 29/7371; H01L 29/0817; H01L 29/41708
USPC .......................... 257/197, 330, 331, 332, 205
See application file for complete search history.

(56) References Cited

U.S. PATENT DOCUMENTS 8,633,510 B2    1/2014    Matsuura et al.

FOREIGN PATENT DOCUMENTS

| JP | 2000-021914 | 1/2000 |
|---|---|---|
| JP | 2008-091618 A | 4/2008 |
| JP | 2012-256839 A | 12/2012 |

*Primary Examiner* — Tan N Tran
(74) *Attorney, Agent, or Firm* — McGinn IP Law Group, PLLC

(57) ABSTRACT

The reliability of a semiconductor device is improved. The semiconductor device includes a wire which is a conductive film pattern for a terminal formed over a first insulation film over a semiconductor substrate, a second insulation film formed over the first insulation film in such a manner as to cover the wire, and a nickel layer formed over the wire at a portion thereof exposed from an opening in the second insulation film. The wire is formed of a lamination film having a main conductor film containing aluminum as a main component, and a conductor film formed over the entire top surface of the main conductor film. The conductor film is formed of a titanium film, a tungsten film, or a titanium tungsten film. The nickel layer is formed over the conductor film at a portion thereof exposed from the opening.

28 Claims, 39 Drawing Sheets

FIG. 31

| MATERIAL | SOLDER (LEAD-FREE SOLDER) | Ni | Al | Si | Ti | Pd |
|---|---|---|---|---|---|---|
| THERMAL EXPANSION COEFFICIENT [ppm/K] | 28.4 | 12.8 | 24.0 | 3.0 | 8.4 | 11.8 |
| ELASTIC MODULUS [GPa] | 38.2 (ORDINARY TEMPERATURE) | 219 | 70 | 170 | 109 | 113 |

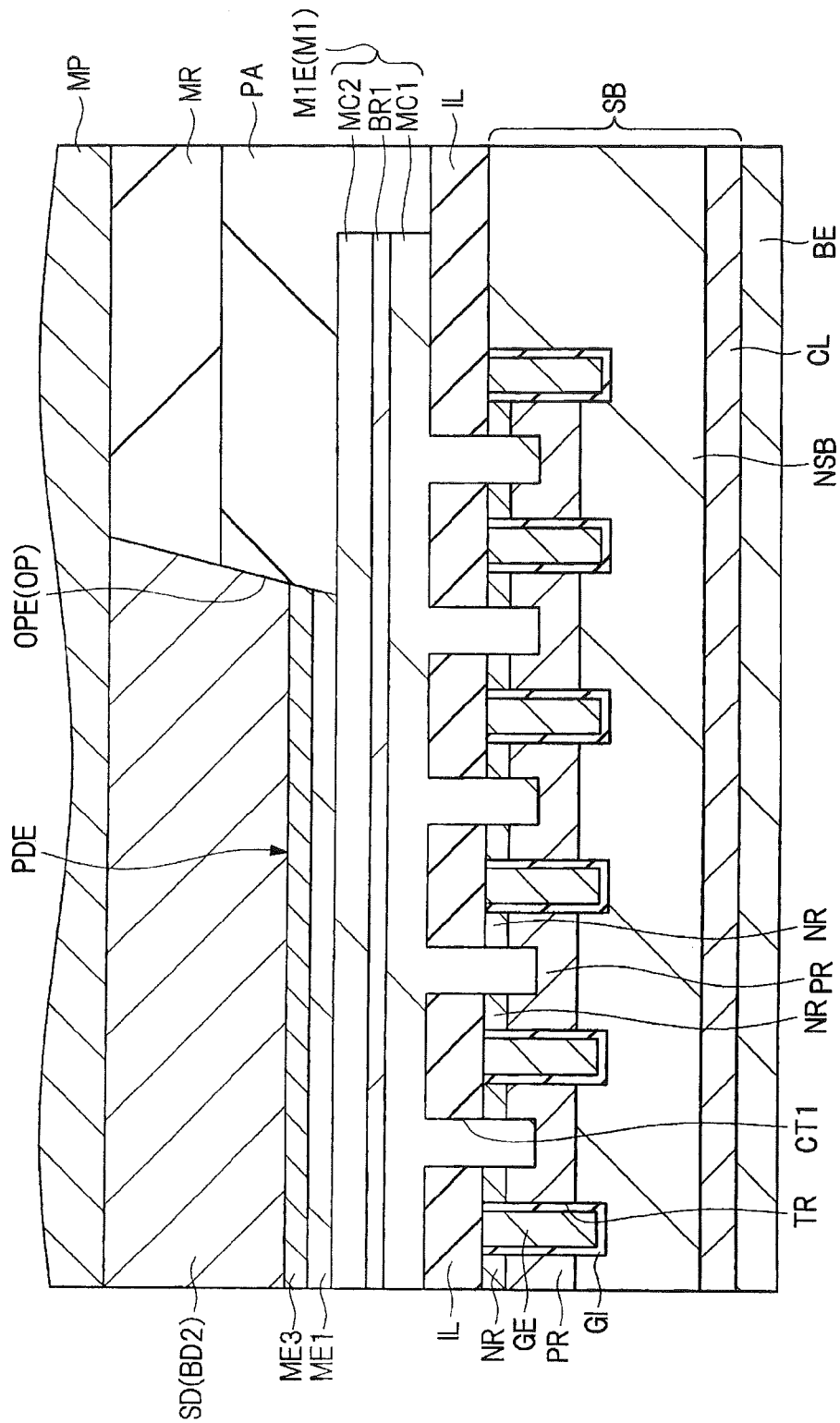

SEMICONDUCTOR DEVICE AND AN ELECTRONIC DEVICE

CROSS-REFERENCE TO RELATED APPLICATIONS

The disclosure of Japanese Patent Application No. 2014-123776 filed on Jun. 16, 2014 including the specification, drawings and abstract is incorporated herein by reference in its entirety.

BACKGROUND

The present invention relates to a semiconductor device and an electronic device, and is preferably applicable to, for example, a semiconductor device having a power semiconductor element, and an electronic device using the same.

In a semiconductor chip including power semiconductor elements such as IGBTs formed therein, the current flowing between a pad provided on the main surface side and a back surface electrode provided on the back surface side can be controlled by the power semiconductor elements formed in the semiconductor chip. For this reason, such a semiconductor chip can be used for a switching element through which a large current flows, and the like. For packaging such a semiconductor chip, a metal plate is coupled via a solder to the pad of the semiconductor chip in consideration of the resistance reduction.

In Japanese Unexamined Patent Application Publication No. 2012-256839 (Patent Document 1), there is described a technology regarding a semiconductor device including a trench gate IGBT.

In Japanese Unexamined Patent Application Publication No. 2008-91618 (Patent Document 2), there is described a technology regarding a semiconductor device including a soldered electrode formed over the surface of an element electrode exposed from the opening in a protective film.

In Japanese Unexamined Patent Application Publication No. 2000-21914 (Patent Document 3), there is described a technology regarding a semiconductor device in which a gold-plated bump is formed over each pad.

CITED DOCUMENTS

Patent Documents

[Patent Document 1]
Japanese Unexamined Patent Application Publication No. 2012-256839
[Patent Document 2]
Japanese Unexamined Patent Application Publication No. 2008-91618
[Patent Document 3]
Japanese Unexamined Patent Application Publication No. 2000-21914

SUMMARY

A semiconductor device having pads is also desired to be improved in reliability as much as possible.

Other objects and novel features will be apparent from the description of this specification and the accompanying drawings.

In accordance with one embodiment, a semiconductor device has a semiconductor chip, and a metal plate electrically coupled to a terminal at the main surface of the semiconductor chip via a solder. The semiconductor chip has a conductive film pattern for the terminal formed over an interlayer insulation film over the semiconductor substrate, an insulation film formed over the interlayer insulation film in such a manner as to cover the conductive film pattern, and a nickel film formed over the conductive film pattern at a portion thereof exposed from an opening in the insulation film. The conductive film pattern is formed of a lamination film having a first conductor film containing aluminum as a main component, and a second conductor film formed over the entire top surface of the first conductor film. The second conductor film is formed of a titanium film, a tungsten film, or a titanium tungsten film.

Further, in accordance with another embodiment, a semiconductor device has a conductive film pattern for a coupling terminal formed over an interlayer insulation film over a semiconductor substrate, an insulation film formed over the interlayer insulation film in such a manner as to cover the conductive film pattern, and a nickel film formed over the conductive film pattern at a portion thereof exposed from an opening in the insulation film. The conductive film pattern is formed of a lamination film having a first conductor film containing aluminum as a main component, and a second conductor film formed over the entire top surface of the first conductor film. The second conductor film is formed of a titanium film, a tungsten film, or a titanium tungsten film.

Still further, in accordance with a still other embodiment, an electronic device has a semiconductor device individually electrically coupled with a power supply and a load, and for driving the load, and a control part for controlling the semiconductor device. The semiconductor device has a semiconductor chip, and a metal plate electrically coupled to a terminal at the main surface of the semiconductor chip via a solder. The semiconductor chip has a conductive film pattern for the terminal, formed over an interlayer insulation film over a semiconductor substrate, an insulation film formed over the interlayer insulation film in such a manner as to cover the conductive film pattern, and a nickel film formed over the conductive film pattern at a portion thereof exposed from the opening in the insulation film. The conductive film pattern is formed of a lamination film having a first conductor film containing aluminum as a main component, and a second conductor film formed over the entire top surface of the first conductor film. The second conductor film is formed of a titanium film, a tungsten film, or a titanium tungsten film.

Furthermore, in accordance with a still other embodiment, a semiconductor device has a semiconductor chip, and a metal plate electrically coupled with a terminal at the main surface of the semiconductor chip via a solder. The semiconductor chip has a conductive film pattern for the terminal formed over an interlayer insulation film over the semiconductor substrate, an insulation film formed over the interlayer insulation film in such a manner as to cover the conductive film pattern, and a nickel film formed over the conductive film pattern at a portion thereof exposed from an opening in the insulation film. The conductive film pattern is formed of a lamination film having a first conductor film containing aluminum as a main component, a second conductor film formed over the first conductor film, and a third conductor film formed over the second conductor film, and containing aluminum as a main component. The second conductor film is formed of a titanium film, a tungsten film, or a titanium tungsten film. The first conductor film is not doped with copper. The third conductor film is doped with copper.

Furthermore, in accordance with a still other embodiment, an electronic device has a semiconductor device individually electrically coupled with a power supply and a load, and for driving the load, and a control part for controlling the semiconductor device. The semiconductor device has a semiconductor chip, and a metal plate electrically coupled to a terminal at the main surface of the semiconductor chip via a solder. The semiconductor chip has a conductive film pattern for the terminal, formed over an interlayer insulation film over a semiconductor substrate, an insulation film formed over the interlayer insulation film in such a manner as to cover the conductive film pattern, and a nickel film formed over the conductive film pattern at a portion thereof exposed from the opening in the insulation film. The conductive film pattern is formed of a lamination film having a first conductor film containing aluminum as a main component, a second conductor film formed over the first conductor film, and a third conductor film formed over the second conductor film, and containing aluminum as a main component. The second conductor film is formed of a titanium film, a tungsten film, or a titanium tungsten film. The first conductor film is not doped with copper. The third conductor film is doped with copper.

Whereas, in accordance with another embodiment, a semiconductor device has a conductive film pattern for a coupling terminal, formed over an interlayer insulation film over a semiconductor substrate, an insulation film formed over the interlayer insulation film in such a manner as to cover the conductive film pattern, and a nickel film formed over the conductive film pattern at a portion thereof exposed from the opening in the insulation film. The conductive film pattern is formed of a lamination film having a first conductor film containing aluminum as a main component, a second conductor film formed over the first conductor film, and a third conductor film formed over the second conductor film, and containing aluminum as a main component. The second conductor film is formed of a titanium film, a tungsten film, or a titanium tungsten film. The first conductor film is not doped with copper. The third conductor film is doped with copper.

In accordance with one embodiment, it is possible to improve the reliability of a semiconductor device.

BRIEF DESCRIPTION OF THE DRAWINGS

FIG. 31 is a table showing the thermal expansion coefficients and the elastic moduli of various materials;

FIG. 40 is an essential part cross sectional view of the semiconductor device of the still other embodiment;

DETAILED DESCRIPTION

Figure 1:
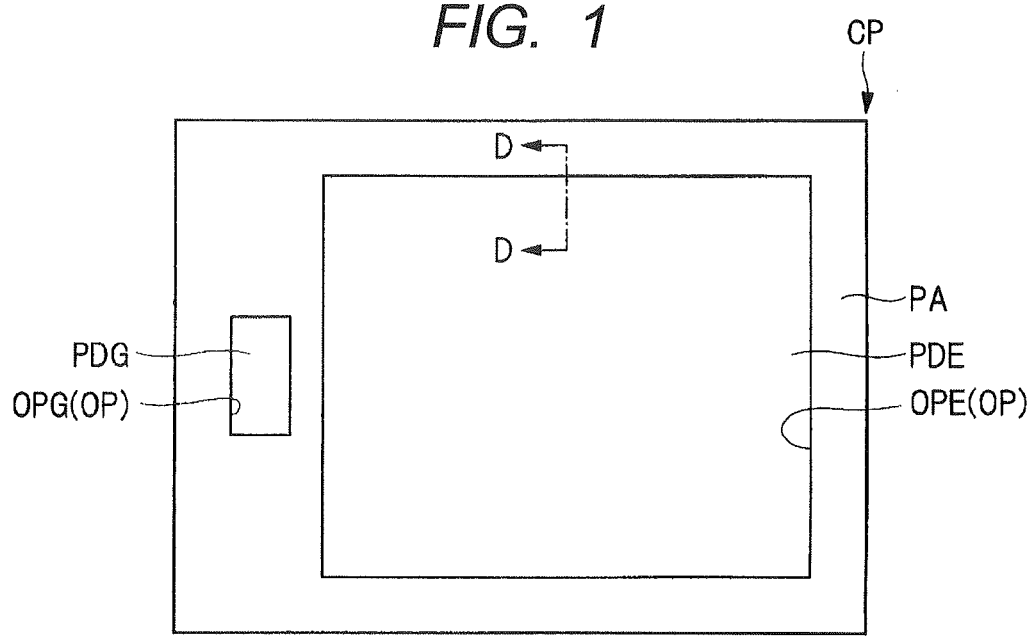
FIG. 1 is an overall plan view of a semiconductor device of one embodiment.

In the following description of embodiments, the description may be divided into a plurality of sections, or embodiments for convenience, if required. However, unless otherwise specified, these are not independent of each other, but are in a relation such that one is a modified example, a detailed description, a complementary explanation, or the like of a part or the whole of the other. Further, in the following embodiments, when a reference is made to the number of elements, and the like (including number, numerical value, quantity, range, or the like), the number of elements is not limited to a specific number, but may be greater than or less than the specific number, unless otherwise specified, except for the case where the number is apparently limited to the specific number in principle, and except for other cases. Further, in the following embodiments, the constitutional elements (including element steps, or the like) are not always essential, unless otherwise specified, except for the case where they are apparently considered essential in principle, and except for other cases. Similarly, in the following embodiments, when a reference is made to the shapes, the positional relationships, or the like of the constitutional elements, or the like, it is understood that they include ones substantially analogous or similar to the shapes or the like, unless otherwise specified, unless otherwise considered apparently in principle, and except for other cases. This also applies to the numerical value and the range.

Below, embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar portions will not be repeated in principle, unless otherwise required.

Further, in the accompanying drawing for use in embodiments, hatching may be omitted even in cross section for ease of understanding of the drawing. Further, hatching may be added even to a plan view in order to ease of understanding of the drawing.

First Embodiment

Regarding the Whole Structure of a Semiconductor Chip

A semiconductor device of the present embodiment will be described by reference to the accompanying drawings.

Figure 2:
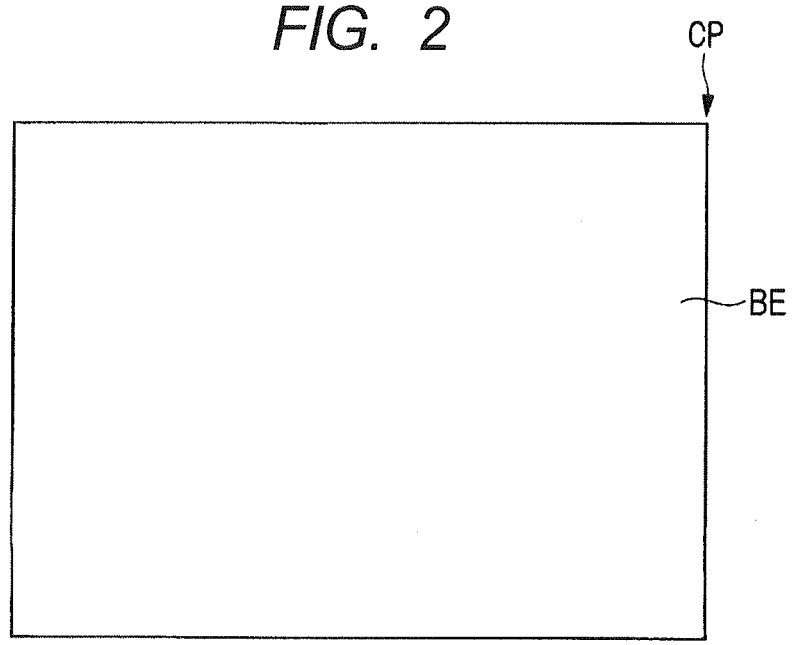
FIG. 2 is an overall plan view of the semiconductor device of the one embodiment.

FIGS. 1 and 2 are each an overall plan view of a semiconductor device (semiconductor chip) CP of the present embodiment. FIG. 1 shows an overall plan view of the top surface side of the semiconductor device CP. FIG. 2 shows an overall plan view of the back surface (bottom surface) side of the semiconductor device CP.

As shown in FIGS. 1 and 2, the semiconductor device (semiconductor chip) CP of the present embodiment has a top surface which is one main surface, and a back surface (bottom surface) which is a main surface opposite to the top surface. FIG. 1 shows the top surface of the semiconductor device CP. FIG. 2 shows the back surface of the semiconductor device CP.

The semiconductor device CP has, as shown in FIG. 1, an emitter pad PDE as a first terminal and a gate pad PDG as a control terminal on the top surface side, and has, as shown in FIG. 2, a back surface electrode BE as a second terminal on the back surface side. The emitter pad PDE, the gate pad PDG, and the back surface electrode BE can function as external coupling terminals of the semiconductor device CP, respectively.

Specifically, at the uppermost layer on the top surface side of the semiconductor device CP, there is formed an insulation film PA as a surface protective film. The emitter pad PDE is exposed through an emitter opening OPE provided in the insulation film PA. The gate pad PDG is exposed through a gate opening OPG provided in the insulation film PA. Further, the uppermost layer on the back surface (bottom surface) side of the semiconductor device CP is the back surface electrode BE. The back surface electrode BE is formed at the entire back surface of the semiconductor device CP.

Figure 12:
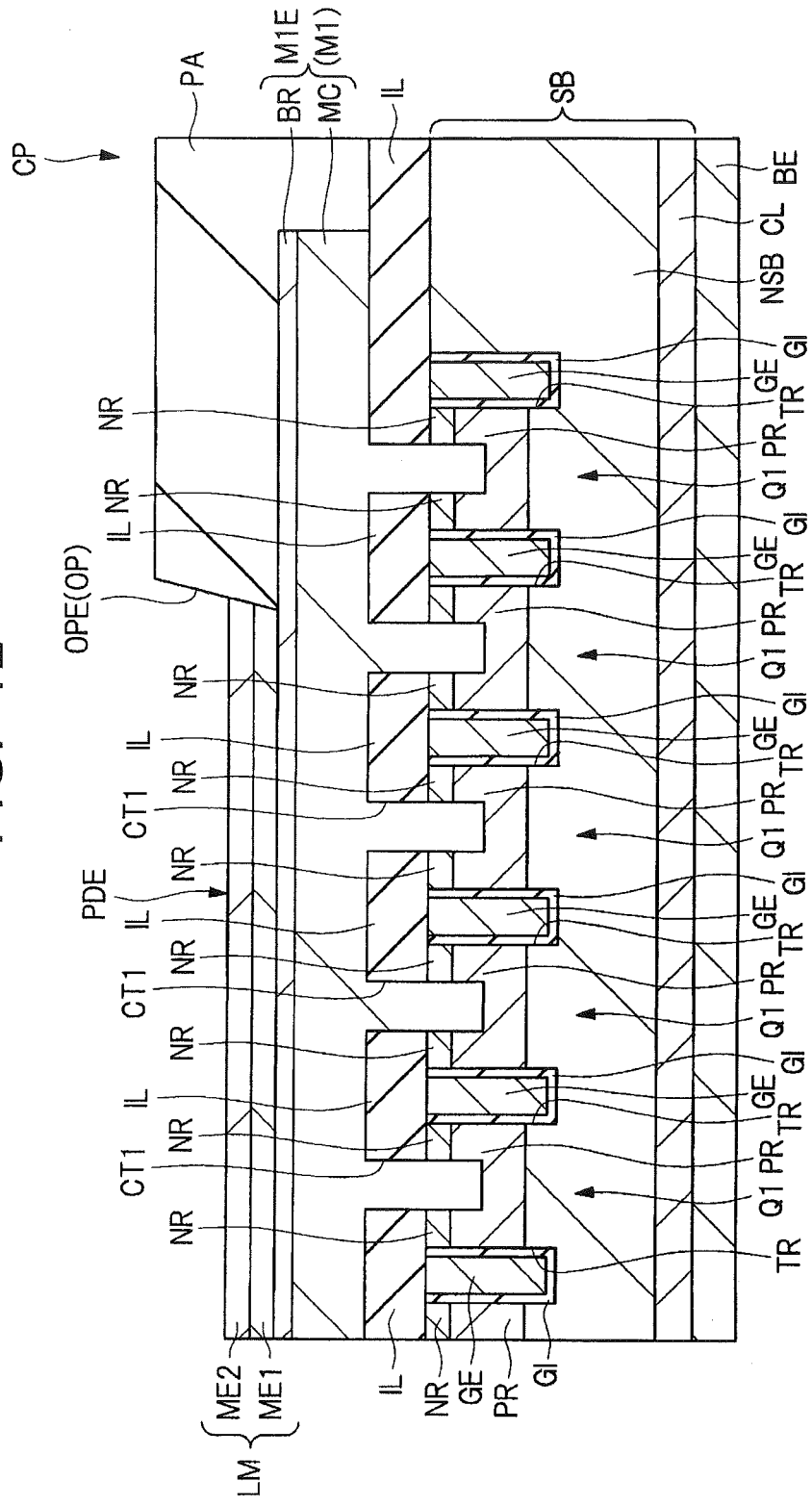
FIG. 12 is an essential part cross sectional view of the semiconductor device of the one embodiment.
Figure 13:
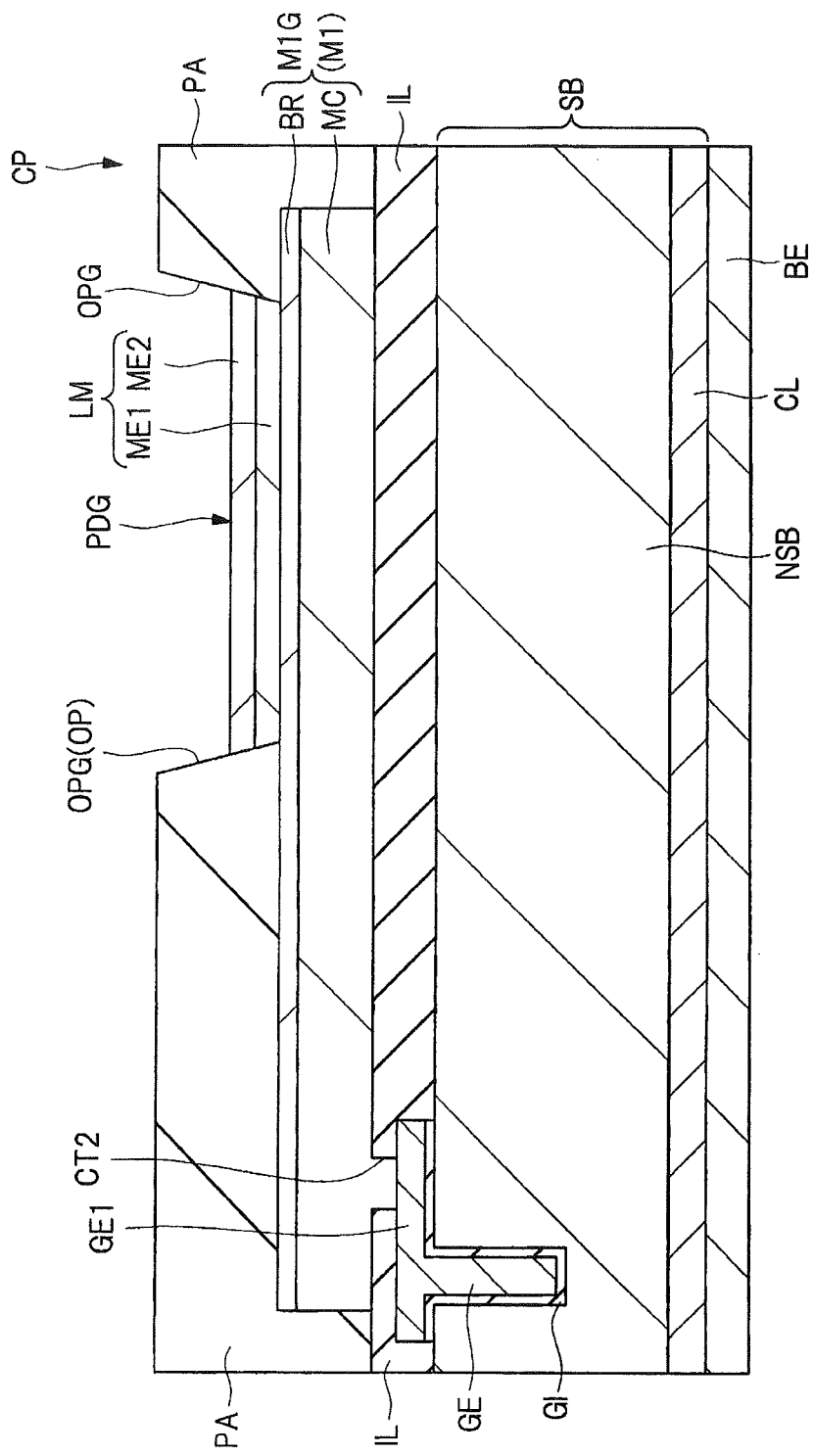
FIG. 13 is an essential part cross sectional view of the semiconductor device of the one embodiment.

At a semiconductor substrate SB forming the semiconductor device CP, there is formed a semiconductor element for controlling the conduction between the first terminal (herein, the emitter pad PDE) formed on the top surface side of the semiconductor device CP, and the second terminal (herein, the back surface electrode BE) formed on the back surface side of the semiconductor device CP. Incidentally, the semiconductor substrate SB forming the semiconductor device CP is not shown in FIGS. 1 and 2, but is shown in FIGS. 12 and 13 shown later. Accordingly, for the semiconductor device CP, the semiconductor element formed at the semiconductor substrate SB is controlled; this controls the conduction between the first terminal (herein, the emitter pad PDE) on the top surface side and the second terminal (herein, the back surface electrode BE) on the back surface side; as a result, a current flows between the first terminal (herein, the emitter pad PDE) on the top surface side and the second terminal (herein, the back surface electrode BE) on the back surface side. For this reason, the semiconductor device CP can be used as a switching element through which a large current flows. The gate pad PDG functions as a control terminal for controlling the conduction between the first terminal and the second terminal.

As a semiconductor element formed at the semiconductor substrate SB, and for controlling the conduction between the first terminal on the top surface side of the semiconductor device CP and the second terminal on the back surface side of the semiconductor device CP, an IGBT can be preferably used, and a trench gate type IGBT can be further preferably used. When an IGBT is used, the first terminal on the top surface side of the semiconductor device CP is an emitter terminal; the second terminal on the back surface side of the semiconductor device CP is a collector terminal; and a control terminal on the top surface side of the semiconductor device CP is a gate terminal.

<Regarding the Semiconductor Package Configuration>

Then, a description will be given to a semiconductor device (semiconductor package) PKG obtained by packaging the semiconductor device (semiconductor chip) CP.

Figure 3:
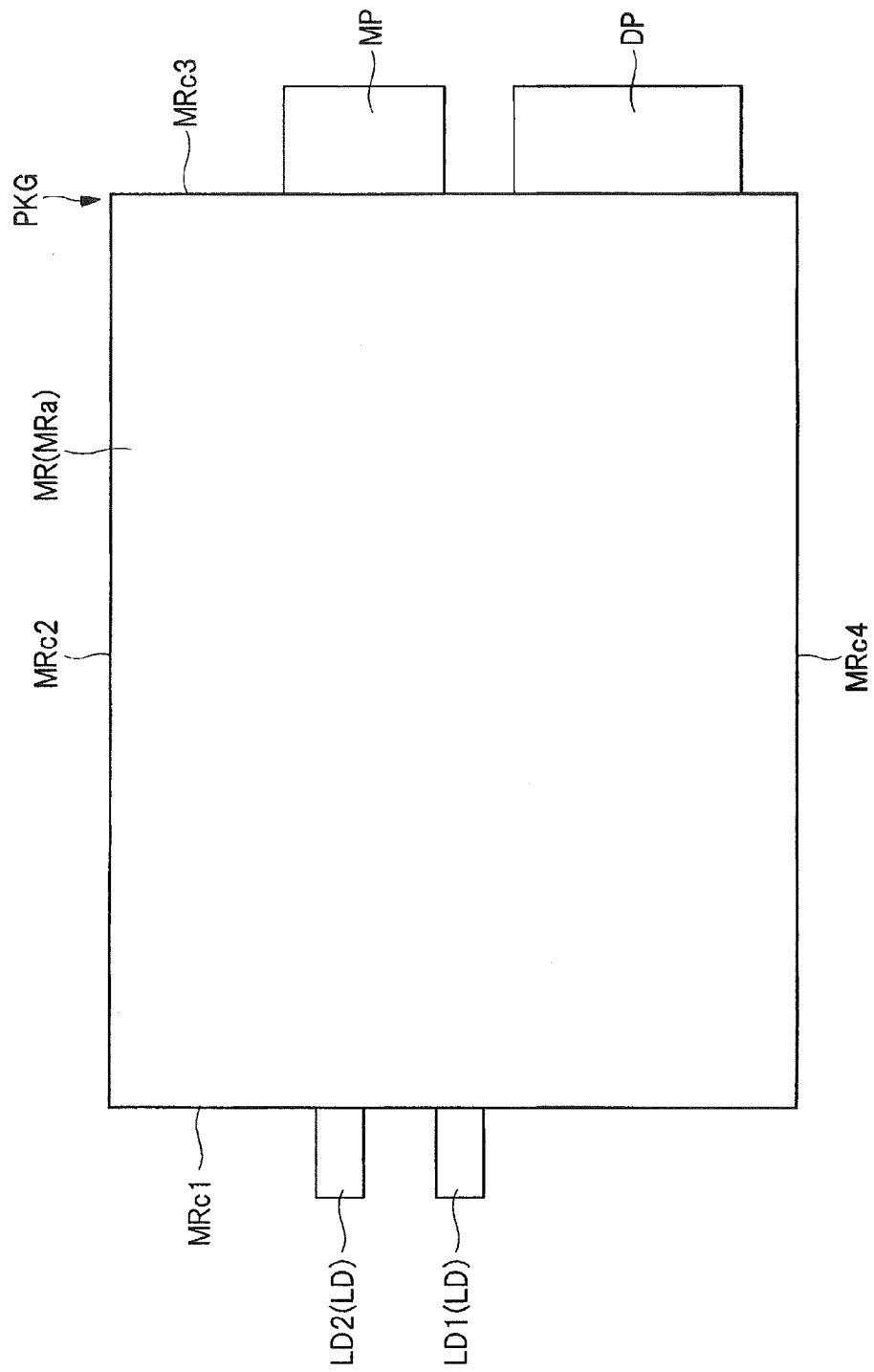
FIG. 3 is a top view of a semiconductor device of one embodiment.
Figure 4:
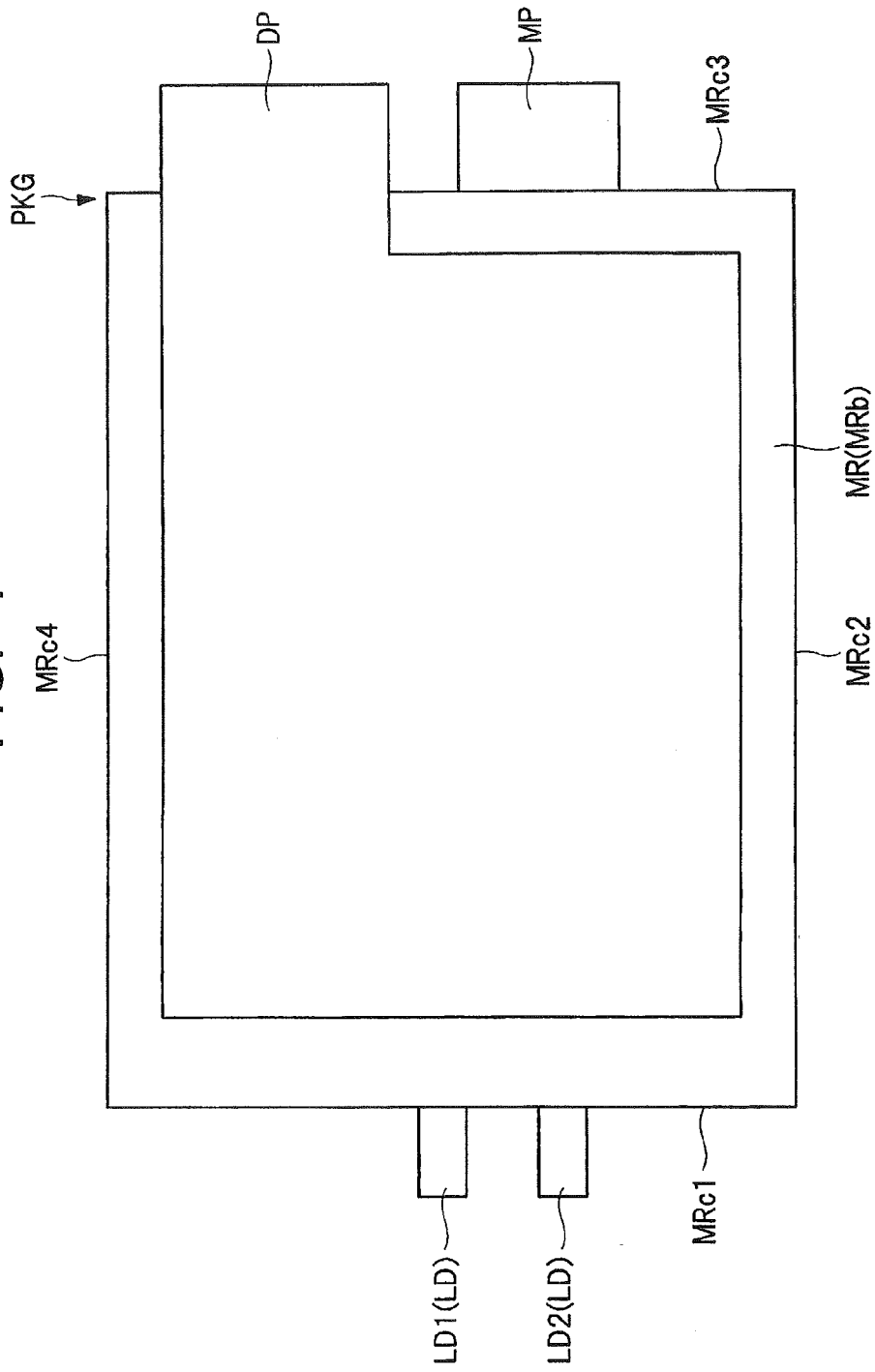
FIG. 4 is a bottom view of the semiconductor device of the one embodiment.
Figure 5:
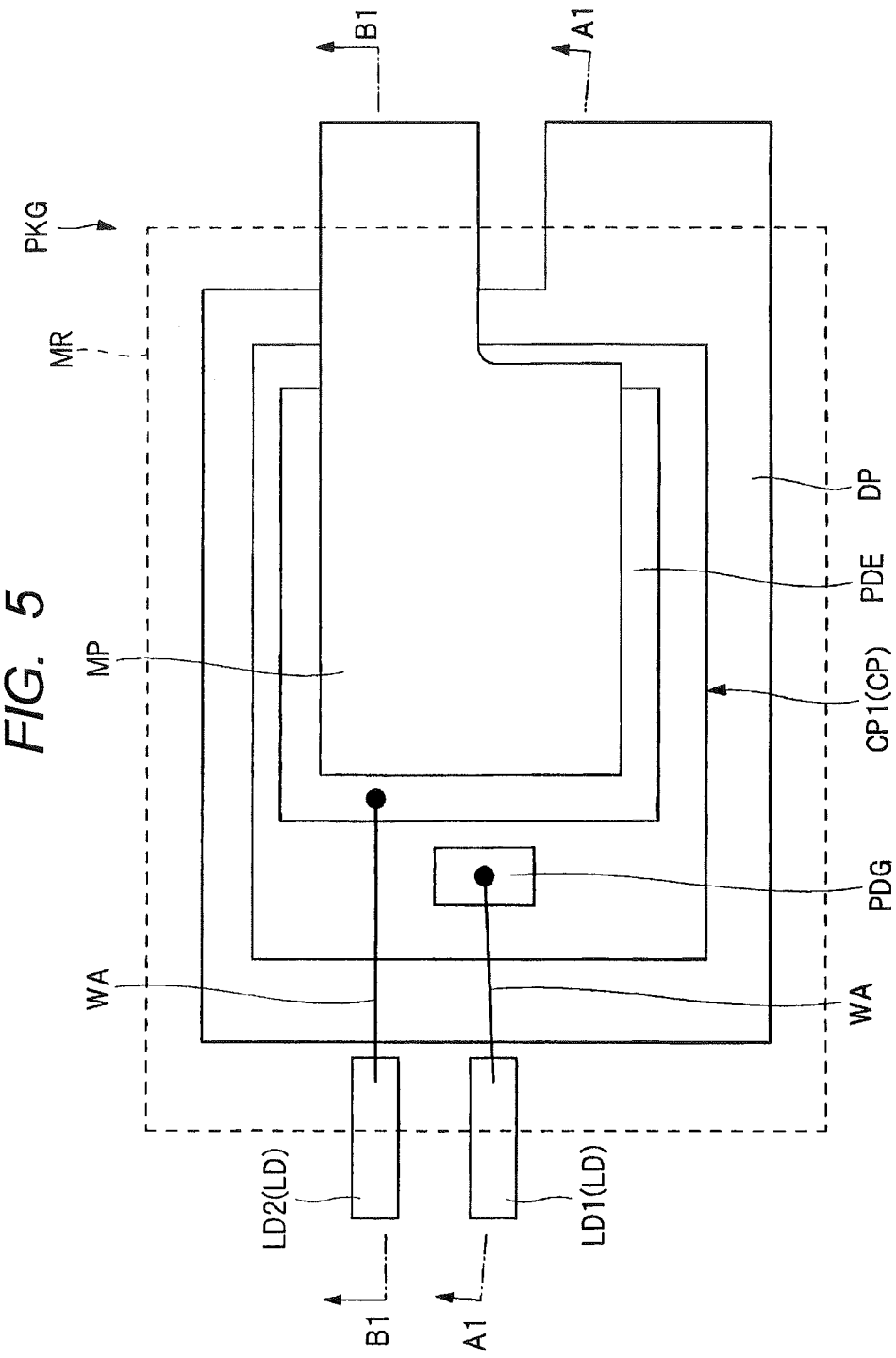
FIG. 5 is a plan perspective view of the semiconductor device of the one embodiment.
Figure 6:
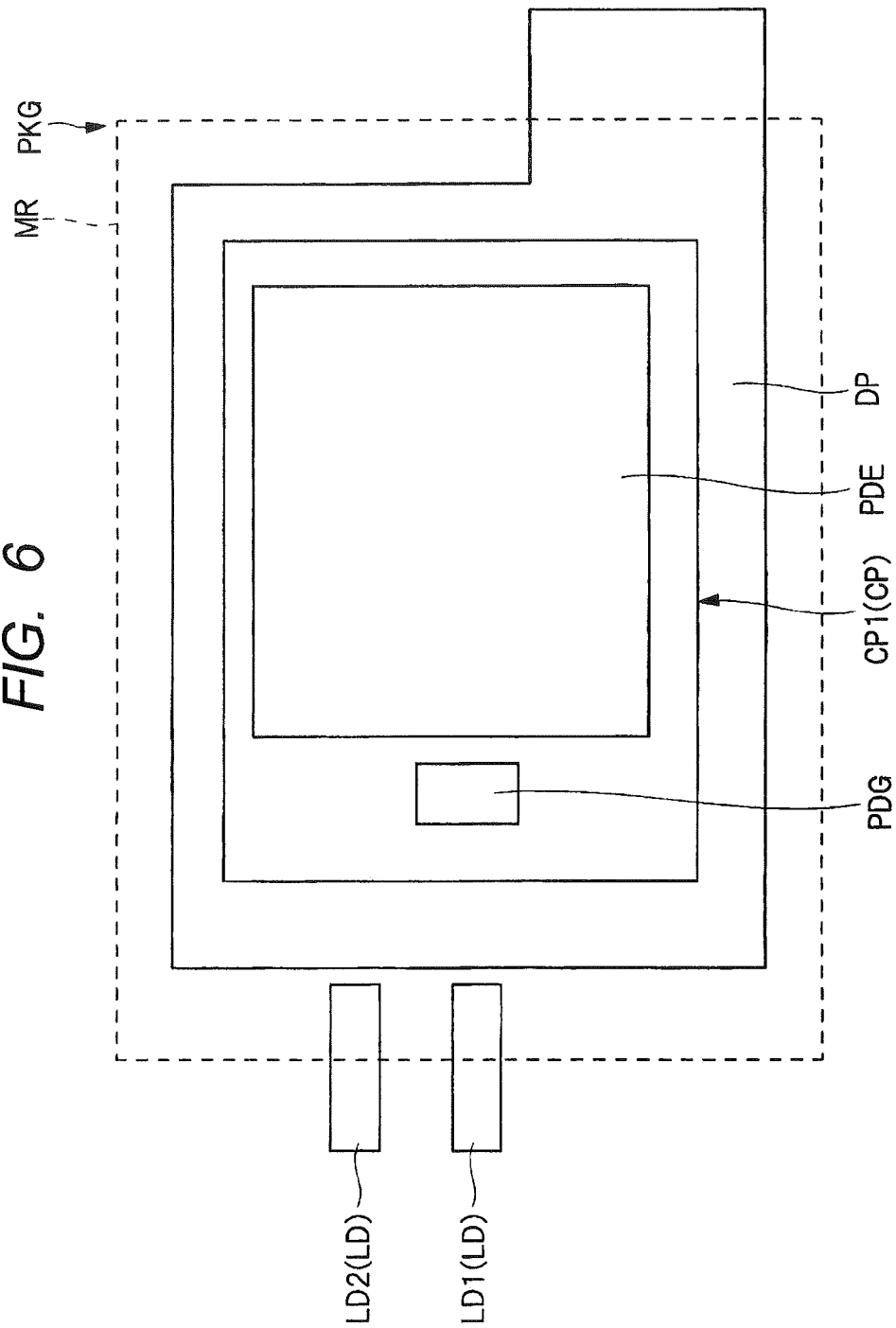
FIG. 6 is a plan perspective view of the semiconductor device of the one embodiment.
Figure 7:
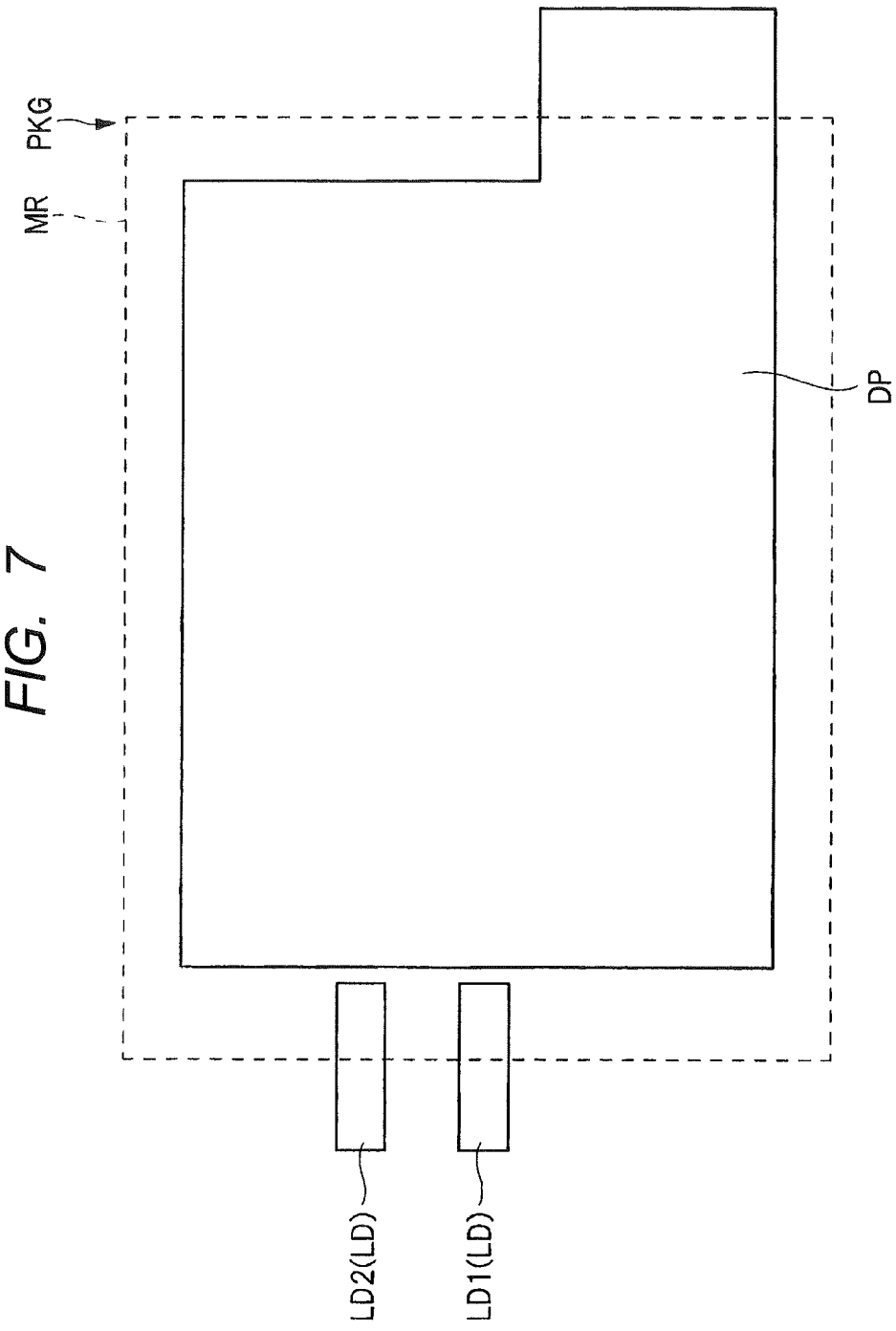
FIG. 7 is a plan perspective view of the semiconductor device of the one embodiment.

FIGS. 3 to 9 are a top view (FIG. 3), a bottom view (FIG. 4), plan perspective views (FIGS. 5 to 7), and cross sectional views (FIG. 8 and FIG. 9), each schematically showing one example of the semiconductor device (semiconductor package) PKG obtained by packaging the semiconductor device (semiconductor chip) CP. FIG. 3 shows an overall plan view of the top surface side of the semiconductor device PKG. FIG. 4 shows an overall plan view of the bottom surface (back surface) side of the semiconductor device PKG. FIG. 5 shows a plan view (top view) of the semiconductor device PKG as seen through a sealing part MR from the top surface side thereof. FIG. 6 corresponds to a view obtained by removing a metal plate MP and a wire WA from FIG. 5. FIG. 7 corresponds to a view obtained by further removing a semiconductor chip CP1 from FIG. 6. In FIGS. 5 to 7, the outer circumference position of the the sealing part MR is indicated with a dotted line. Further, the cross sectional view along line A1-A1 of FIG. 5 substantially corresponds to FIG. 8. The cross sectional view along line B1-B1 of FIG. 5 substantially corresponds to FIG. 9.

The semiconductor chip CP1 used in the semiconductor device (semiconductor package) PKG shown in FIGS. 3 to 9 is the same as the semiconductor device (semiconductor chip) CP shown in FIGS. 1 and 2. For this reason, herein, a repeated description on the configuration of the semiconductor chip CP1 will be omitted.

As shown in FIGS. 3 to 9, the semiconductor device PKG has the semiconductor chip CP1, a die pad (chip mounting part or tab) DP for mounting the semiconductor chip CP1 thereover, a metal plate (conductor plate) MP bonded to the emitter pad PDE of the semiconductor chip CP1, leads LD formed of a conductor, conductive wires (bonding wires) WA, and a sealing part (sealing resin part) MR for sealing these.

The sealing part (sealing resin part) MR is formed of a resin material such as a thermosetting resin material, and may also contain a filler or the like. By using, for example, an epoxy resin containing a filler, the sealing part MR can be formed. Other than epoxy type resins, for the reasons of reduction of the stress, and the like, biphenyl type thermosetting resins added with, for example, a phenol type curing agent, silicone rubber, and a filler may be used as the materials for the sealing part MR.

The sealing part MR has a top surface (front surface) MRa which is one main surface, a bottom surface (back surface or bottom surface) MRb which is a main surface opposite to the top surface MRa, and side surfaces MRc1, MRc2, MRc3, and MRc4 crossing with the top surface MRa and the bottom surface MRb. Namely, the outward appearance of the sealing part MR is assumed to be in a thin plate shape surrounded by the top surface MRa, the bottom surface MRb, and the side surfaces MRc1, MRc2, MRc3, and MRc4. The plan configuration of the top surface MRa and the bottom surface MRb of the sealing part MR is formed in, for example, a rectangular shape. The corners of the rectangle (planar rectangle) may also be rounded. When each plan configuration of the top surface MRa and the bottom surface MRb of the sealing part MR is formed in a rectangular shape, the sealing part MR is in a rectangular shape (tetragonal shape) in the planar configuration (outside configuration) crossing with its thickness. Of the side surfaces MRc1, MRc2, MRc3, and MRc4 of the sealing part MR, the side surface MRc1 and the side surface MRc3 face each other; the side surface MRc2 and the side surface MRc4 face each other; the side surface MRc1 and the side surfaces MRc2 and MRc4 cross with each other; and the side surface MRc3 and the side surfaces MRc2 and MRc4 cross with each other.

The lead (lead part) LD is formed of a conductor, and is preferably formed of a metal material such as copper (Cu) or copper alloy. The semiconductor device PKG has at least one lead LD. However, in the case of FIGS. 3 to 9, the semiconductor device PKG has two leads LD, namely, a lead LD1 and a lead LD2. Each lead LD (LD1 or LD2) is sealed at one part thereof in the sealing part MR, and projects at the other part thereof from the side surface of the sealing part MR to the outside of the sealing part MR. Below, in each lead LD, the portion situated in the sealing part MR is referred to as an inner lead part, and the portion situated outside the sealing part MR is referred to as an outer lead part.

Incidentally, the semiconductor device PKG of the present embodiment has a structure in which a part (outer lead part) of each lead LD projects from the side surface of the sealing part MR. Below, a description will be given based on the structure.

However, the structure is not exclusive. It is also possible to adopt, for example, a configuration in which each lead LD hardly projects from the side surface of the sealing part MR, and a part of each lead LD is exposed at the bottom surface MRb of the sealing part MR (QFN type configuration).

Figure 8:
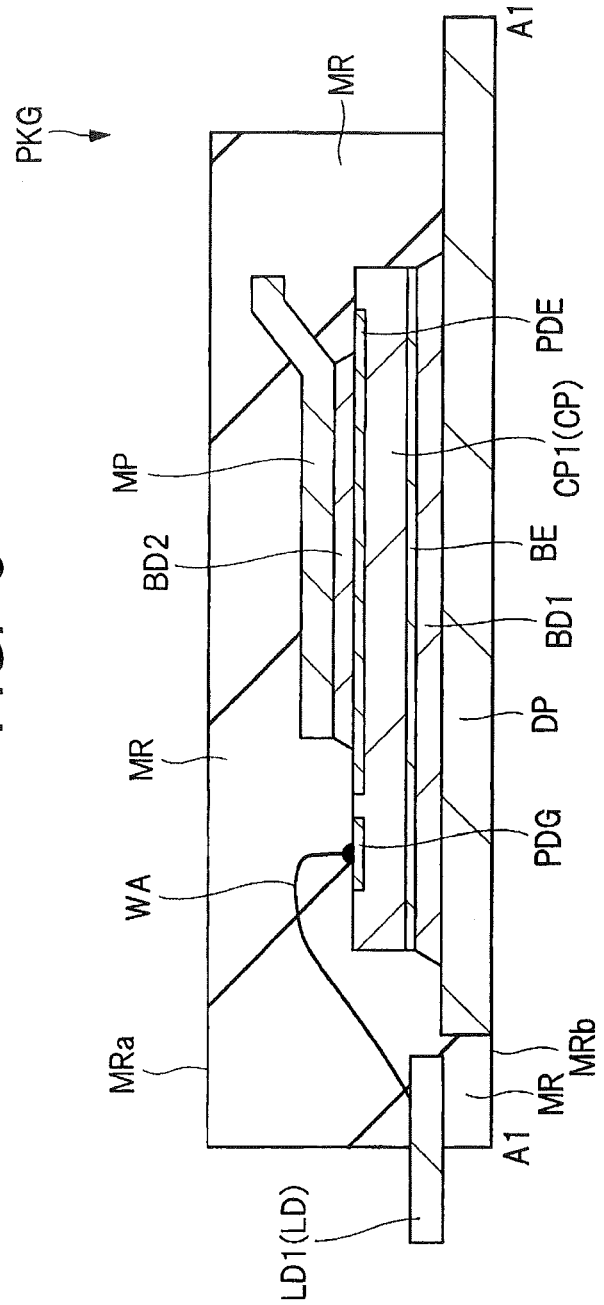
FIG. 8 is a cross sectional view of the semiconductor device of the one embodiment.
Figure 9:
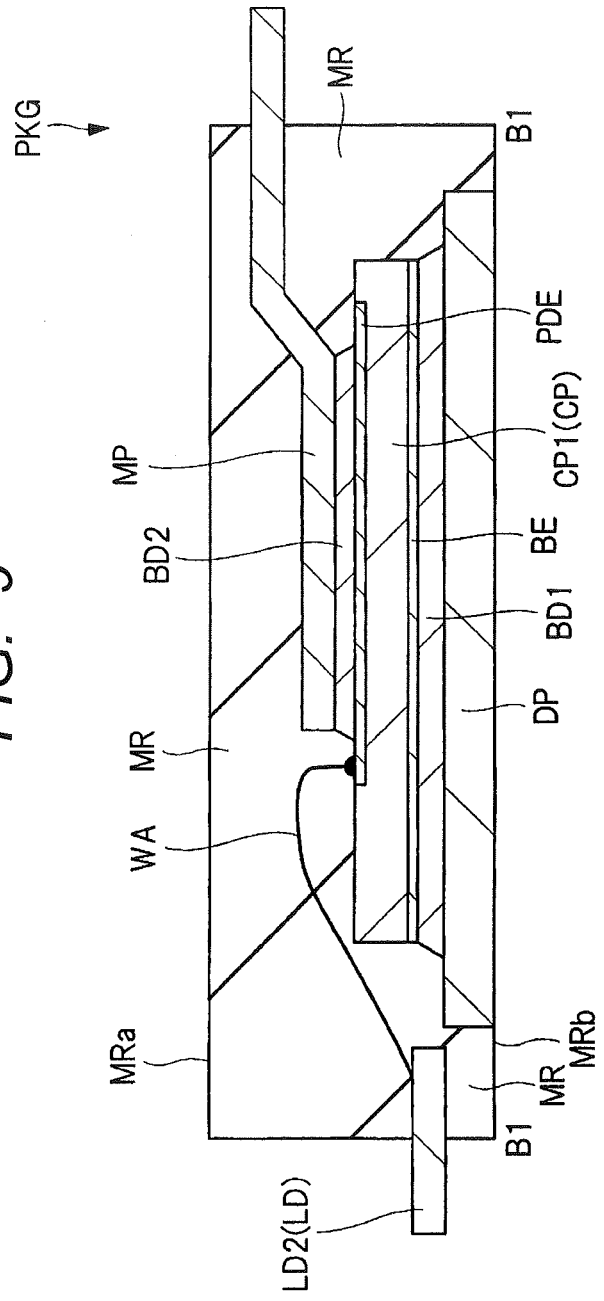
FIG. 9 is a cross sectional view of the semiconductor device of the one embodiment.

The leads LD1 and LD2 are arranged closer to the side surface MRc1 of the the sealing part MR. Respective outer lead parts of the leads LD1 and LD2 project from the side surface MRc1 of the sealing part MR to the outside of the sealing part MR. In the case of FIGS. 8 and 9, respective outer lead parts of the leads LD1 and LD2 are flat. However, as another form, respective outer lead parts of the leads LD1 and LD2 may be bent so that the bottom surface in the vicinity of the end of each outer lead part is situated over substantially the same plane as that of the bottom surface MRb of the sealing part MR. The leads LD1 and LD2 at portions thereof not covered with the sealing part MR (specifically, the outer lead parts of the leads LD1 and LD2) can function as the external coupling terminal parts (external terminals) of the semiconductor device PKG.

At the bottom surface MRb of the sealing part MR, there is exposed the bottom surface (back surface) of the die pad DP. At the top surface MRa of the sealing part MR, there is not exposed the die pad DP. The die pad DP is a chip mounting part for mounting the semiconductor chip CP1 thereover.

The die pad DP is formed of a conductor, and is preferably formed of a metal material such as copper (Cu) or copper alloy. More preferably, the die pad DP and the leads LD1 and LD2 forming the semiconductor device PKG are formed of the same material (the same metal material). This facilitates manufacturing of the semiconductor device PKG.

Over the top surface (main surface) of the die pad DP, there is mounted the semiconductor chip CP1. At the front surface of the semiconductor chip CP1, there are formed an emitter pad PDE and a gate pad PDG. At the back surface of the semiconductor chip CP1, there is formed a back surface electrode (back surface collector electrode) BE. Herein, in the semiconductor chip CP1, of the two main surfaces situated opposite to each other, the main surface on the side of which the emitter pad PDE and the gate pad PDG are formed is referred to as the front surface of the semiconductor chip CP1. The main surface opposite to the surface, and on the side of which the back surface electrode BE is formed is referred to as the back surface of the semiconductor chip CP1.

The semiconductor chip CP1 is mounted over the top surface of the die pad DP with the front surface of the semiconductor chip CP1 pointed upward, and the back surface of the semiconductor chip CP1 pointed toward the top surface of the die pad DP. Namely, the semiconductor chip CP1 is mounted over the top surface of the die pad DP with the back surface electrode BE of the semiconductor chip CP1 pointed toward the die pad DP. The back surface of the semiconductor chip CP1 is bonded and fixed to the top surface of the die pad DP via a conductive adhesive layer (bonding material) BD1 such as a solder. Accordingly, the back surface electrode BE of the semiconductor chip CP1 is bonded and fixed, and electrically coupled to the die pad DP via the conductive adhesive layer BD1. The adhesive layer BD1 has a conductivity, and is formed of, for example, a conductive paste type adhesive material such as a silver (Ag) paste, or solder. The semiconductor chip CP1 is sealed in the sealing part MR, and is not exposed from the sealing part MR.

The heat generated during the operation of the semiconductor chip CP1 can be dissipated mainly from the back surface of the semiconductor chip CP1 through the die pad DP to the outside. For this reason, the die pad DP is preferably set larger than the area of the semiconductor chip CP1 to be mounted thereover. This can improve the heat dissipation property.

The gate pad PDG of the semiconductor chip CP1 and the inner lead part of the lead LD1 are electrically coupled with each other via a wire WA which is a conductive coupling member. Specifically, one end of the wire WA is coupled to the inner lead part of the lead LD1. The other end of the wire WA is coupled to the gate pad PDG of the semiconductor chip CP1. The lead LD1 and the gate pad PDG of the semiconductor chip CP1 are electrically coupled with each other via the wire WA. Whereas, one end of another wire WA is coupled to the inner lead part of the lead LD2. The other end of the wire WA is coupled to the emitter pad PDE of the semiconductor chip CP1. The lead LD2 and the emitter pad PDE of the semiconductor chip CP1 are electrically coupled with each other via the wire WA. The wire WA for establishing a coupling between the lead LD1 and the gate pad PDG of the semiconductor chip CP1 and the wire WA for establishing a coupling between the lead LD2 and the emitter pad PDE of the semiconductor chip CP1 are separate wires WA. For this reason, in the semiconductor device PKG, the emitter pad PDE of the semiconductor chip CP1 and the gate pad PDG of the semiconductor chip CP1 are not coupled with each other via a conductor.

The lead LD1 (namely, the outer lead part of the lead LD1) at a portion thereof exposed without being covered with the sealing part MR can function as an external terminal (gate external terminal) electrically coupled to the gate pad PDG of the semiconductor chip CP1. Whereas, the lead LD2 (namely, the outer lead part of the lead LD2) at a portion thereof exposed without being covered with the sealing part MR can function as an external terminal (emitter external terminal) electrically coupled to the emitter pad PDE of the semiconductor chip CP1.

The wire WA is a conductive coupling member, more specifically, a conductive wire, and is preferably formed of a metal wire (metal thin wire) such as a gold (Au) line, copper (Cu) line, or an aluminum (Al) wire. The wire WA is sealed within the sealing part MR, and is not exposed from the sealing part MR.

To the emitter pad PDE of the semiconductor chip CP1, the metal plate MP is bonded and fixed, and is electrically coupled via the conductive adhesive layer (bonding material) BD2 such as a solder. The adhesive layer BD2 has a conductivity, and is, in the present embodiment, formed of a solder. For this reason, the metal plate MP is electrically coupled with the emitter pad PDE of the semiconductor chip CP1 via the adhesive layer BD2 formed of a solder. To the region of the emitter pad PDE of the semiconductor chip CP1 other than the region thereof to which the metal plate MP is bonded via the adhesive layer BD2, there can be coupled the wire WA (the wire WA for establishing a coupling between the emitter pad PDE and the lead LD2).

The metal plate MP is partially exposed from the sealing part MR. Specifically, a part of the metal plate MP projects from the side surface MRc3 of the sealing part MR to outside the sealing part MR. Namely, the metal plate MP has a portion situated outside the sealing part MR, and a portion situated inside the sealing part MR. The metal plate MP at a portion thereof situated in the sealing part MR is bonded via the adhesive layer BD2 to the emitter pad PDE of the semiconductor chip CP1. The metal plate MP at a portion thereof exposed without being covered with the sealing part MR (specifically, the metal plate MP at a portion thereof projecting from the side surface MRc3 of the sealing part MR) can function as an external coupling terminal part (external terminal) of the semiconductor device PKG. Namely, the metal plate MP at a portion thereof exposed without being covered with the sealing part MR can function as an external terminal (emitter external terminal) electrically coupled to the emitter pad PDE of the semiconductor chip CP1.

The metal plate MP is preferably formed of a metal (metal material) high in electric conductivity and thermal conductivity, and can be preferably formed of, for example, copper (Cu) or copper (Cu) alloy. The metal plate MP is more preferably formed of copper (Cu) or copper (Cu) alloy in terms of being easy to be processed, being high in thermal conductivity, and being relatively inexpensive. Alternatively, the metal plate MP can also be formed of aluminum (Al) or aluminum (Al) alloy. The width of the metal plate MP is larger (wider) than the width (diameter) of the wire WA. To the emitter pad PDE of the semiconductor chip CP1, there is coupled the metal plate MP lower in resistance than the wire WA. For this reason, it is possible to reduce the ON resistance of the semiconductor element (herein, IGBT) formed at the semiconductor chip CP1. Accordingly, in the semiconductor device PKG, the package resistance can be reduced, which can reduce the conduction loss. Still alternatively, by using the metal plate MP formed of a metal material lower in cost than gold in place of the wire formed of gold (Au), it is possible to reduce the cost of the semiconductor device PKG.

Further, in the case of FIGS. 3 to 9, a part of the metal plate MP is exposed (projects) from the sealing part MR to function as an external terminal. As another form, the following is also acceptable: an additional lead is provided in the semiconductor device PKG; in the sealing part MR, the metal plate MP is bonded to the additional lead via a conductive bonding material (preferably, a solder). In this case, the emitter pad PDE of the semiconductor chip CP1 is electrically coupled via the conductive adhesive layer BD2 to the metal plate MP. The metal plate MP is electrically coupled via a conductive bonding material to the additional lead. Accordingly, the emitter pad PDE of the semiconductor chip CP1 is electrically coupled via the metal plate MP, and the like to the additional lead. For this reason, in this case, a part of the additional lead is exposed from the sealing part MR to function as an external terminal (emitter external terminal). This eliminates the necessity for the metal plate MP to be exposed from the sealing part MR. Incidentally, the additional lead herein referred to also has an electrical conductivity as with the lead LD, and can be formed of the same material (metal material) as that for the lead LD.

The bottom surface (back surface) of the die pad DP is exposed from the bottom surface MRb of the sealing part MR. Further, a part of the die pad DP projects from the side surface MRc3 of the sealing part MR to outside the sealing part MR. The die pad DP and the metal plate MP are not in contact with each other. The die pad DP at a portion thereof exposed without being covered with the sealing part MR (specifically, the bottom surface of the die pad DP exposed from the bottom surface MRb of the sealing part MR, or the die pad DP at a portion thereof projecting from the the side surface MRc3 of the sealing part MR) can function as an external coupling terminal part (external terminal) of the semiconductor device PKG. Namely, the die pad DP at a portion thereof exposed without being covered with the sealing part MR can function as an external terminal (a collector external terminal) electrically coupled to the back surface electrode BE of the semiconductor chip CP1.

Further, in the case of FIGS. 3 to 9, a part of the die pad DP projects from the side surface MRc3 of the sealing part MR to outside the sealing part MR. However, as another form, there may be the case where a part of the die pad DP does not project from the side surface MRc3 of the sealing part MR.

Whereas, when a part of the metal plate MP and a part of the die pad DP are set to project from the same side surface MRc3 of the sealing part MR, the metal plate MP at a portion thereof projecting from the side surface MRc3 of the sealing part MR, and the die pad DP at a portion thereof projecting from the side surface MRc3 of the sealing part MR are preferably set so as not to overlap each other in a plan view. This facilitates a coupling of an external device and the like to the metal plate MP which is the emitter terminal and the die pad DP which is the collector terminal of the semiconductor device PKG.

In the semiconductor device PKG of the present embodiment, to the back surface electrode BE of the semiconductor chip CP1, there is electrically coupled the die pad DP (via the conductive adhesive layer BD1). To the emitter pad PDE of the semiconductor chip CP1, there is electrically coupled the metal plate MP (via the conductive adhesive layer BD2). To the gate pad PDG of the semiconductor chip CP1, there is electrically coupled the lead LD1 (via the wire WA). Then, respective parts of the die pad DP, the metal plate MP, and the lead LD1 exposed from the sealing part MR can function as external coupling terminal parts (external terminals) of the semiconductor device PKG. Namely, the die pad DP at a portion thereof exposed from the sealing part MR functions as a terminal (collector terminal) for leading out the back surface electrode BE of the semiconductor chip CP1 to the outside of the semiconductor device PK. Whereas, the metal plate MP at a portion thereof exposed from the sealing part MR functions as a terminal (emitter terminal) for leading out the emitter pad PDE of the semiconductor chip CP1 to the outside of the semiconductor device PKG. Further, the lead LD1 at a portion thereof exposed from the sealing part MR functions as a terminal (gate terminal) for leading out the gate pad PDG of the semiconductor chip CP1 to the outside of the semiconductor device PKG. The metal plate MP is lower in resistance than the wire WA. In other words, the wire WA is higher in resistance than the metal plate MP. However, as compared with the current flowing through the conduction path from the emitter pad PDE to the metal plate MP, the current flowing through the conduction path from the gate pad PDG to the lead LD1 is smaller. For this reason, an electrical coupling can be established by the wire WA between the gate pad PDG and the lead LD1.

Whereas, the lead LD2 is electrically coupled via the wire WA to the emitter pad PDE of the semiconductor chip CP1. Accordingly, the lead LD2 at a portion thereof exposed from the sealing part MR can also function as a terminal (emitter terminal) for leading out the emitter pad PDE of the semiconductor chip CP1 to the outside of the semiconductor device PKG. The conduction current (ON current) of the semiconductor element (herein, IGBT) formed at the semiconductor chip CP1 mainly flows between the metal plate MP and the die pad DP. However, use of the metal plate MP for the conduction path can reduce the conduction loss. Further, the lead LD2 can be used for detecting the emitter potential (corresponding to the electric potential of the emitter pad PDE). Namely, the lead LD2 can be used as a terminal (Kelvin emitter) for establishing a Kelvin coupling to the emitter pad PDE. As compared with the current flowing through the conduction path from the emitter pad PDE to the metal plate MP, the current flowing through the conduction path from the emitter pad PDE to the lead LD2 is smaller. For this reason, an electric coupling can be established by the wire WA between the emitter pad PDE and the lead LD2.

Alternatively, as another form, the lead LD2 can be omitted. When the lead LD2 is omitted, the wire WA for establishing a coupling between the lead LD2 and the emitter pad PDE of the semiconductor chip CP1 also becomes unnecessary.

Figure 10:
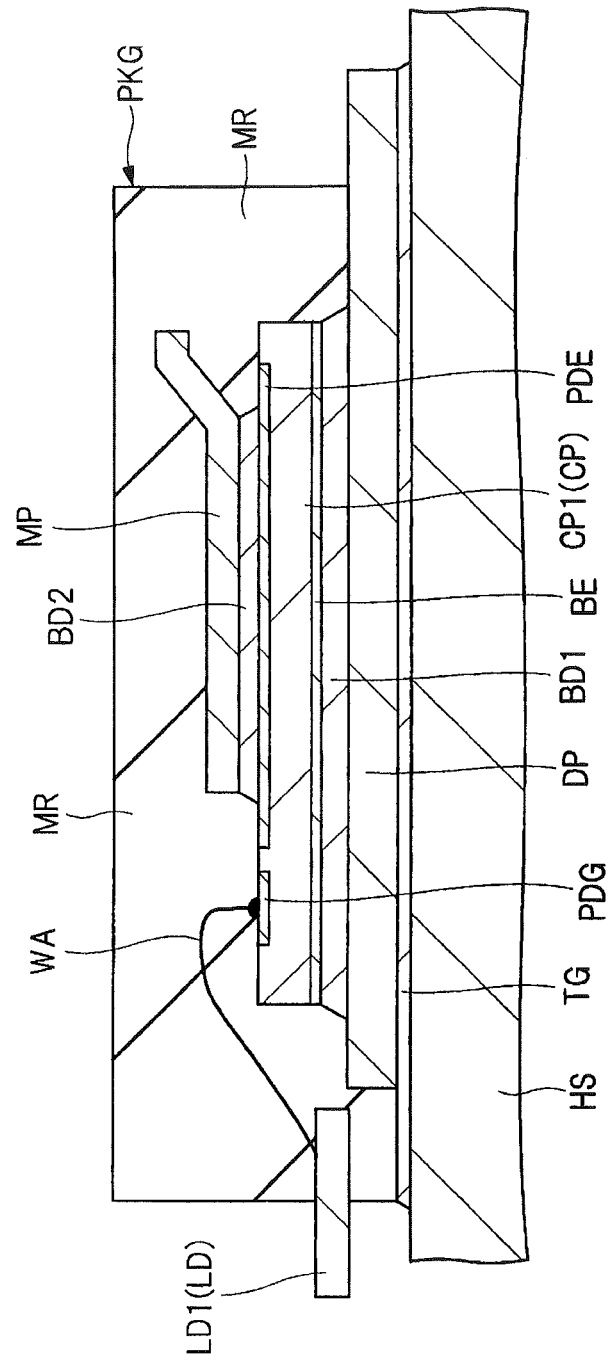
FIG. 10 is a cross sectional view showing one example of a mounting form of the semiconductor device of the one embodiment.

FIG. 10 is a cross sectional view showing one example of the mounting form of the semiconductor device PKG. FIG. 10 shows a cross section corresponding to FIG. 8 described above. In the cross section of FIG. 10, the metal plate MP does not project from the sealing part MR. However, as also shown in FIG. 9 described above, in another cross section, a part of the metal plate MP projects from the side surface of the sealing part MR.

As shown in FIG. 10, the semiconductor device PKG can be mounted over, for example, a metal plate (heat sink) HS. The metal plate HS is, for example, a metal plate including a water-cooling mechanism. In the case of FIG. 10, the semiconductor device PKG is mounted via a thermal conductive grease (heat radiation grease) TG over the top surface of the metal plate HS with the bottom surface of the die pad DP (corresponding to the surface exposed from the sealing part MR) facing the top surface of the metal plate HS. Accordingly, the thermal conductive grease TG is interposed between the die pad DP of the semiconductor device PKG and the metal plate HS. In the case of FIG. 10, the heat generated at the semiconductor chip CP1 of the semiconductor device PKG is dissipated mainly through the conductive adhesive layer BD1, the die pad DP, and the thermal conductive grease TG to the metal plate HS.

Figure 11:
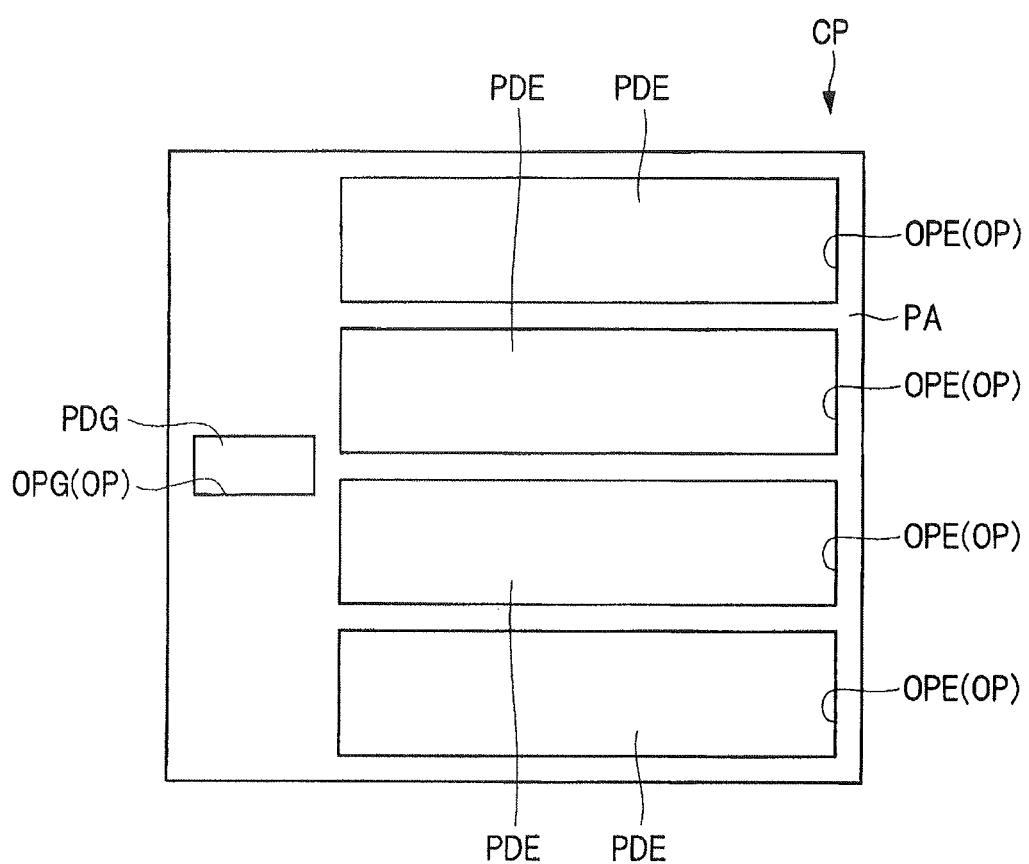
FIG. 11 is a top view of a semiconductor device of a modified example.

FIG. 11 is a top view showing a modified example of the semiconductor device CP of FIGS. 1 and 2, and corresponds to FIG. 1.

The semiconductor device CP has the emitter pad PDE and the gate pad PDG on the top surface side, and has the collector back surface electrode BE on the back surface side. However, in the case of FIG. 1, one emitter pad PDE is formed at the top surface of the semiconductor device CP. In contrast, in the case of FIG. 11, a plurality of emitter pads PDE are formed at the top surface of the semiconductor device CP. Incidentally, in FIG. 11, the number of the emitter pads PDE formed is four. However, the number is not limited to four, and may be set at a given number of two or more.

When a plurality of the emitter pads PDE are formed on the top surface side of the semiconductor device CP as in FIG. 11, in order to package the semiconductor device (semiconductor chip) CP, and to manufacture the semiconductor device PKG as in FIGS. 3 to 10, it is essential only to achieve the following: to the plurality of emitter pads PDE formed at the semiconductor device CP, the metal plate MP is bonded via a conductive bonding material (herein, solder) corresponding to the adhesive layer BD2. Namely, each of the plurality of emitter pads PDE formed at the semiconductor device CP are bonded and electrically coupled via the solder (conductive bonding material) to the common metal plate MP. This results in that the metal plate MP is bonded and electrically coupled to the plurality of emitter pads PDE formed at the semiconductor device CP.

<Regarding the Internal Configuration of the Semiconductor Chip>

Then, the internal structure of the semiconductor device (semiconductor chip) CP will be described by reference to the accompanying drawings.

FIGS. 12 and 13 are each an essential part cross sectional view of the semiconductor device CP of the present embodiment. FIG. 12 roughly corresponds to a cross sectional view at a position along line D-D of FIG. 1. FIG. 13 corresponds to a cross sectional view crossing the gate pad PDG.

The semiconductor device CP of the present embodiment is a semiconductor device in which there is formed a semiconductor element (herein, IGBT) for controlling the conduction between a first terminal (herein, the emitter pad PDE) formed on the top surface side of the semiconductor device CP and a second terminal (herein, the back surface electrode BE) formed on the back surface side of the semiconductor device CP. Therefore, at the semiconductor substrate SB forming the semiconductor device CP, there is formed an IGBT (Insulated Gate Bipolar Transistor: insulation gate type bipolar transistor). The IGBT formed at the semiconductor substrate SB is preferably a trench gate type IGBT. The IGBT formed at the semiconductor substrate SB can also be regarded as a power transistor (power semiconductor element). Accordingly, the semiconductor device CP can also be said to be a semiconductor device including an IGBT as a power transistor (power semiconductor element).

As also shown in FIGS. 12 and 13, the semiconductor substrate SB forming the semiconductor device (semiconductor chip) CP is formed of an n type single crystal silicon doped with an n type impurity such as arsenic (As). As the semiconductor substrate SB, it is also possible to use a semiconductor substrate (so-called epitaxial wafer) in which over a substrate main body formed of an n type single crystal silicon substrate, there is formed an epitaxial layer (a semiconductor layer) formed of an n type single crystal silicon having a lower impurity concentration than that.

The trench gate type IGBT is an IGBT having a trench type gate structure (a gate electrode structure embedded in a trench provided in a substrate). A specific configuration of the trench gate type IGBT formed in the semiconductor substrate SB will be described below.

At the main surface of the semiconductor substrate SB, there is formed a trench gate type IGBT forming a power transistor (power semiconductor element). Specifically, at the main surface of the semiconductor substrate SB, there are formed a plurality of unit transistor cells Q1. The plurality of unit transistor cells Q1 formed at the semiconductor substrate SB are coupled in parallel to one another, thereby to form one power transistor. Each unit transistor cell Q1 is formed of a trench gate type IGBT. Incidentally, the trench gate type IGBT is an IGBT having a trench type gate structure (a gate electrode structure embedded in a trench provided in a substrate). Herein, the plane region of the main surface of the semiconductor substrate SB in which the plurality of unit transistor cells Q1 forming the power transistor are formed (arranged) is referred to as a transistor cell region.

At the bottom of the semiconductor substrate SB, namely, on the back surface side of the semiconductor substrate SB, there is formed a p type semiconductor region (collector region) CL for a collector (for a collector region) with a prescribed thickness. The p type semiconductor region CL can be formed over the entire back surface of the semiconductor substrate SB. Then, over the entire back surface of the semiconductor substrate SB, a collector back surface electrode (collector electrode or back surface collector electrode) BE is formed in such a manner as to be in contact with the p type semiconductor region CL. The back surface electrode BE can be regarded as a terminal (coupling terminal). Herein, the back surface electrode BE is a collector terminal.

The back surface electrode BE can be formed of, for example, a lamination film of an aluminum (Al) layer, a titanium (Ti) layer, a nickel (Ni) layer, and a gold (Au) layer sequentially from the back surface of the semiconductor substrate SB. An Al—Si alloy layer can also be used in place of the aluminum (Al) layer. The back surface electrode BE is in contact with the p type semiconductor region CL. The back surface electrode BE and the p type semiconductor region CL are electrically coupled with each other.

Incidentally, the main surface of the semiconductor substrate SB opposite to the side thereof on which a trench for the gate electrode GE is formed is referred to as a back surface of the semiconductor substrate SB.

In the semiconductor substrate SB, there is formed a p type semiconductor region PR for a p type base region. Further, in the semiconductor substrate SB, over the p type semiconductor region PR, there is formed an $n^+$ type semiconductor region NR for an n type emitter region. Under the $n^+$ type semiconductor region NR, there is present the p type semiconductor region PR.

In the semiconductor substrate SB, there are formed trenches TR extending from the main surface thereof in the thickness direction of the semiconductor substrate SB. In each of the trenches TR, a gate electrode GE is embedded via a gate insulation film GI. At the bottom surface and the side surface of the trench TR formed in the semiconductor substrate SB, there is formed the gate insulation film GI formed of an insulation film such as a silicon oxide film. This results in a state in which the gate insulation film GI is interposed between the gate electrode GE and the semiconductor substrate SB. The gate electrode GE is formed of a conductive film (conductor film) embedded in the trench TR in the semiconductor substrate SB, and is formed of, for example, a polycrystal silicon film (doped silicon film) doped with an n type impurity (e.g., phosphorus).

Although not shown, in the main surface of the semiconductor substrate SB, the trench TR is formed in, for example, a stripe shape or a lattice shape in a plan view. Herein, when the trench TR is formed in a stripe shape in a plan view, the plurality of trenches TR respectively extending in a first direction are arranged at a prescribed interval in a second direction in a plan view. Alternatively, when the trench TR is formed in a lattice shape in a plan view, the plurality of trenches TR respectively extending in the first direction, and arranged at a given interval in the second direction, and the plurality of trenches TR respectively extending in the second direction and arranged at a prescribed interval in the first direction cross with each other. Incidentally, the first direction and the second direction herein referred to represent the directions crossing with (orthogonal to) each other.

The trench TR is formed in such a manner as to penetrate through (pass through) the $n^+$ type semiconductor region NR and the p type semiconductor region PR in the semiconductor substrate SB, and to terminate in the n type semiconductor substrate SB, namely, in the n type substrate region NSB. Accordingly, the bottom surface of the trench TR is deeper than the bottom surface of the $n^+$ type semiconductor region NR (i.e., the interface between the $n^+$ type semiconductor region NR and the p type semiconductor region PR), and deeper than the bottom surface of the p type semiconductor region PR (i.e., the interface between the p type semiconductor region PR and the n type substrate region NSB). However, the bottom surface of the trench TR does not reach the p type semiconductor region CL for a collector, and is situated partway (partway in the depth direction) of the n type substrate region NSB.

Herein, the region of the semiconductor substrate SB which is kept in the n type state when formed as an n type semiconductor substrate is referred to as an n type substrate region NSB. In the semiconductor substrate SB, there are formed the $n^+$ type semiconductor region NR, the p type semiconductor region PR, and the p type semiconductor region CL. The region except for these, and not doped with an impurity after manufacturing of the n type semiconductor substrate SB corresponds to the n type substrate region NSB.

Whereas, the "depth" or the "depth position" corresponds to the distance from the main surface of the semiconductor substrate SB (the distance in the direction perpendicular to the main surface of the semiconductor substrate SB). Then, the side closer to the main surface of the semiconductor substrate SB is referred to as a shallower side. Whereas, the side more distant from the main surface of the semiconductor substrate SB (in other words, the side closer to the back surface of the semiconductor substrate SB) is referred to as a deeper side.

Each trench TR and each gate electrode GE embedded therein shown in FIG. 12 extend in a direction perpendicular to the paper plane of FIG. 12. However, the gate electrodes GE are integrally coupled to one another in a region not shown in the cross sectional views of FIGS. 12 and 13. The gate electrodes GE of the plurality of unit transistor cells Q1 formed in the semiconductor substrate SB are electrically coupled to one another, and are also electrically coupled to a gate wire M1G described later.

Then, the layers above the semiconductor substrate SB will be described.

Over the main surface of the semiconductor substrate SB, an insulation film (interlayer insulation film) IL is formed in such a manner as to cover the gate electrode GE. The insulation film IL is an interlayer insulation film, and is formed of, for example, a silicon oxide film.

In the insulation film IL, there are formed contact holes (openings or through holes) CT1 and CT2. The contact hole CT1 is a contact hole for an emitter, and is formed (arranged) between the trenches TR adjacent to one another in a plan view. The contact hole CT1 penetrates through the insulation film IL, and further is dug into a part of the semiconductor substrate SB. Thus, from the contact hole CT1, there are exposed the n$^+$ type semiconductor region NR and the p type semiconductor region PR.

The contact hole CT2 is a contact hole for a gate. In the case of FIG. 13, a gate lead-out wire part (gate lead-out part) GE1 integrally formed with the gate electrode GE is allowed to extend over the semiconductor substrate SB outside the trench TR. Over the gate lead-out wire part GE1, there is formed the contact hole CT2. At the bottom of the contact hole CT2, there is exposed a part of the gate lead-out wire part GE1. The gate lead-out wire part GE1 is an extension portion resulting from leading out of the gate electrode GE in the trench TR to over the surface of the semiconductor substrate SB outside the trench TR, and can be regarded as a gate lead-out part. Namely, the gate lead-out wire part GE1 is a gate lead-out part integrally formed with the gate electrode GE embedded in the trench TR, and extending over the semiconductor substrate SB outside the trench TR.

Over the insulation film IL, there are formed wires M1 formed of a conductive film (conductor). The wires M1 include an emitter wire M1E and a gate wire M1G. The emitter wire M1E and the gate wire M1G are formed at the same layer in the same step. The wire M1, a nickel layer ME1 thereover, and a gold layer ME2 thereover form a pad which is a terminal (coupling terminal). For this reason, the wire M1 can be regarded as a conductive film pattern for a pad (terminal or coupling terminal). Whereas, the emitter wire M1E, the nickel layer ME1 thereover, and the gold layer ME2 thereover form the pad for an emitter (emitter pad) PDE which is a terminal (coupling terminal) for an emitter. For this reason, the emitter wire M1E can be regarded as a conductive film pattern for an emitter pad (emitter terminal). Whereas, the gate wire M1G, a nickel layer ME1 thereover, and a gold layer ME2 thereover form a pad for a gate (gate pad) PDG which is a terminal (coupling terminal) for a gate. For this reason, the gate wire M1G can be regarded as a conductive film pattern for the gate pad (gate terminal).

In the present embodiment, the wire M1 is formed of a lamination film (lamination metal film) of a main conductor film (main conductor layer) MC containing aluminum (Al) as a main component, and a conductor film (conductor layer or conductive barrier film) BR formed over the main conductor film MC.

The main conductor film MC is formed of a metal film containing aluminum (Al) as a main component, and specifically, is formed of an aluminum film or an aluminum alloy film. When an aluminum alloy film is used as the main conductor film MC, an aluminum alloy film doped with silicon (Si), namely, an Al—Si alloy film can be preferably used. When the main conductor film MC contains silicon (Si), namely, an aluminum alloy film doped with silicon (Si) is used as the main conductor film MC, the silicon (Si) forming the semiconductor substrate SB can be inhibited or prevented from penetrating into the main conductor film MC. For this reason, the main conductor film MC contains aluminum (Al) as a main component, and more preferably further contains silicon (Si).

Incidentally, when an aluminum alloy film is used as the main conductor film MC, an aluminum (Al)-rich aluminum alloy film is preferable. Herein, being aluminum (Al)-rich means that the composition ratio of aluminum (Al) is larger than 50 atomic %. Therefore, the main conductor film MC is a metal film containing aluminum (Al) in an amount of more than 50 atomic %. Accordingly, the aluminum (Al) content of the main conductor film MC is larger than 50 atomic %, and more preferably 98 atomic % or more. When the main conductor film MC also contains silicon (Si), the content of silicon (Si) is desirably about from 0.5 atomic % to 1 atomic % or less.

Further, the thickness of the main conductor film MC can be set at, for example, about 3000 to 5000 nm.

The conductor film BR is a titanium (Ti) film, a tungsten (W) film, or a titanium tungsten (TiW) film. The conductor film BR is formed over the entire top surface of the main conductor film MC.

Accordingly, the emitter wire M1E is formed of a lamination film of the main conductor film MC, and the conductor film BR formed over the main conductor film MC. Whereas, the gate wire M1G is also formed of a lamination film of the main conductor film MC, and the conductor film BR formed over the main conductor film MC.

The emitter wire M1E and the gate wire M1G are separated from each other, and are not connected with each other. Namely, the emitter wire M1E and the gate wire M1G are not connected with each other through a conductor.

The emitter wire M1E is formed over the insulation film IL, and a part of the emitter wire M1E fills the inside of the emitter contact hole CT1. The portion of the emitter wire M1E filling the inside of the emitter contact hole CT1 is referred to as "the via part of the emitter wire M1E" or "the emitter via part".

The gate wire M1G is formed over the insulation film IL, and a part of the gate wire M1G fills the inside of the gate contact hole CT2. The portion of the gate wire M1G filling the inside of the gate contact hole CT2 is referred to as "the via part of the gate wire M1G" or "the gate via part".

Further, herein, a description is given to the case where the emitter via part is integrally formed with the emitter wire M1E, and the gate via part is integrally formed with the gate wire M1G. As another form, the following is also possible:

the emitter via part (the conductive part filling the inside of the emitter contact hole CT1) is formed separately from (by a different step from that for) the emitter wire M1E, and the gate via part (the conductive part filling the inside of the gate contact hole CT2) is formed separately from (by a different step from that for) the gate wire M1G.

The emitter wire M1E is formed in the entire plane region (transistor cell region) in which a plurality of unit transistor cells Q1 are formed. The emitter contact holes CT1 are formed in the upper part of the semiconductor substrate SB between the trenches TR in a plan view in the transistor cell region, and penetrate through the insulation film IL and the n$^+$ type semiconductor region NR. Thus, the bottom of each contact hole CT1 reaches the p type semiconductor region PR. Accordingly, the emitter via part embedded in the emitter contact hole CT1 also penetrates through the insulation film IL and the n$^+$ type semiconductor region NR. Thus, the bottom of the emitter via part reaches the p type semiconductor region PR.

The bottom side surface of the emitter via part is in contact with the n$^+$ type semiconductor region NR. Accordingly, the emitter via part is in contact with the n$^+$ type semiconductor region NR, and is electrically coupled with the n$^+$ type semiconductor region NR. Further, the bottom surface of the emitter via part is in contact with the p type semiconductor region PR. Accordingly, the emitter via part is in contact with the p type semiconductor region PR, and is electrically coupled with the p type semiconductor region PR.

Incidentally, in the case of FIG. 12, the emitter via part is in direct contact with the p type semiconductor region PR. As another form, the following is also possible: at a position in contact with the bottom surface of the emitter via part, and internally included in the p type semiconductor region PR, there is provided a p$^+$ type semiconductor region with a higher impurity concentration than that of the p type semiconductor region PR, and the emitter via part is electrically coupled with the p type semiconductor region PR via the p$^+$ type semiconductor region. When the p$^+$ type semiconductor region is interposed between the emitter via part and the p type semiconductor region PR, the contact resistance of the emitter via part can be reduced. This enables a coupling between the emitter via part and the p type semiconductor region PR at a low resistance.

Thus, the via part of the emitter wire M1E, namely, the emitter via part is electrically coupled with both of the n$^+$ type semiconductor region NR and the p type semiconductor region PR. Therefore, the emitter wire M1E is electrically coupled with both of the n$^+$ type semiconductor region NR and the p type semiconductor region PR. Namely, the n$^+$ type semiconductor region NR and the p type semiconductor region PR thereunder are electrically coupled via the emitter via part with the emitter wire M1E.

Each emitter contact hole CT1 is formed between the adjacent trenches TR in the transistor cell region. Accordingly, a plurality of emitter contact holes CT1 are formed in the transistor cell region. Via the emitter via parts respectively embedded in the plurality of contact holes CT1, the emitter region (n$^+$ type semiconductor region NR) and the p type base region (p type semiconductor region PR) of the plurality of unit transistor cells Q1 provided in the transistor cell region are electrically coupled with the common emitter wire M1E. Therefore, the emitter wire M1E is electrically coupled via the emitter via parts with the emitter region (n$^+$ type semiconductor region NR) and the p type base region (p type semiconductor region PR) of the plurality of unit transistor cells Q1 provided in the transistor cell region.

The gate wire M1G is formed at a position not overlapping with the emitter wire M1E in a plan view. Accordingly, the gate wire M1G is formed around the transistor cell region in a plan view. The gate contact hole CT2 is formed over the gate lead-out wire part GE1. Thus, the gate via part is arranged over the gate lead-out wire part GE1, and is in contact with, and electrically coupled with the gate lead-out wire part GE1. Consequently, the gate electrode GE is electrically coupled via the gate lead-out wire part GE1 and the gate via part with the gate wire M1G. Therefore, the gate wire M1G is electrically coupled via the gate via parts and the gate lead-out wire parts GE1 with the gate electrodes GE of the plurality of unit transistor cells Q1 provided in the transistor cell region.

Further, in the present embodiment, the gate lead-out wire part GE1 integrally formed with the gate electrode GE is allowed to extend over the semiconductor substrate SB outside the trench TR. Over the gate lead-out wire part GE1, there are arranged the gate contact hole CT2 and the gate via part filling it. As a result, the gate lead-out wire part GE1 is coupled with the gate via part. As another form, around the transistor cell region, over the gate electrode GE embedded in the trench TR, there are arranged the gate contact hole CT2 and the gate via part filling it. This also enables the gate electrode GE embedded in the trench TR to be coupled with the gate via part. In that case, the gate lead-out wire part GE1 is not required to be formed outside the trench TR.

The wires M1 (the gate wire M1G and the emitter wire M1E) are covered with the insulation film PA for surface protection. Namely, over the insulation film IL, the insulation film. PA is formed in such a manner as to cover the wires M1 (the gate wire M1G and the emitter wire M1E). The insulation film PA is the film (insulation film) at the uppermost layer of the semiconductor device CP.

In the insulation film PA, there are formed a plurality of openings OP. From each opening OP, there is exposed a part of the wire M1. The wire M1 exposed from the opening OP serves as a bonding pad (pad electrode). Over the wire M1 exposed from the opening OP, there is formed a lamination film (lamination metal film) LM of a nickel layer (Ni layer) ME1 and a gold layer (Au layer) ME2 over the nickel layer ME1. The lamination film LM of the nickel layer ME1 and the gold layer ME2 is selectively formed over the wire M1 exposed from the opening OP, and is not formed over the wire M1 at a portion thereof covered with the insulation film PA. The nickel layer ME1 is preferably a nickel (Ni)-plated layer. The gold layer ME2 is preferably a gold (Au)-plated layer. The nickel layer ME1 can also be said as a nickel film (Ni film). The gold layer ME2 can also be said as a gold film (Au film).

Namely, of the openings OP formed in the insulation film PA, from the opening OPE for forming the emitter bonding pad, there is exposed the emitter wire M1E. Over the emitter wire M1E at a portion thereof exposed from the opening OPE, there is formed a lamination film (lamination metal film) LM of the nickel layer ME1 and the gold layer ME2 over the nickel layer ME1. The emitter wire M1E at a portion thereof exposed from the opening OPE in the insulation film PA, and the lamination film LM thereover form an emitter pad PDE which is the emitter bonding pad. Whereas, of the openings OP formed in the insulation film PA, from the opening OPG for forming the gate bonding pad, there is exposed the gate wire M1G. Over the gate wire M1G at a portion thereof exposed from the opening OPG, there is formed a lamination film (lamination metal film) LM of the nickel layer ME1 and the gold layer ME2 over the nickel layer ME1. The gate wire M1G at a portion thereof exposed from the opening OPG in the insulation film PA, and the lamination film LM thereover form a gate pad PDG which is the gate bonding pad.

Incidentally, the wire M1 at a portion thereof exposed from the opening OP is also kept in a state in which the main conductor film MC is covered with the conductor film BR. This results in a state in which the lamination film LM of the nickel layer ME1 and the gold layer ME2 over the nickel layer ME1 is formed over the conductor film BR at a portion thereof exposed from the opening OP. Namely, over the conductor film BR at a portion thereof exposed from the opening OP, the nickel layer ME1 is selectively formed. Over the nickel layer ME1, the gold layer ME2 is selectively formed.

The thickness of the nickel layer ME1 can be set at, for example, about 1000 to 3000 nm. Whereas, the thickness of the gold layer ME2 can be set at, for example, about 70 to 130 nm.

The nickel layer ME1 has a function as a barrier layer (solder barrier layer) for preventing, when a bonding pad is subjected to solder bonding, the solder components from being diffused toward the wire M1 forming the bonding pad, and further, also has a function of ensuring the bonding strength of the solder. Whereas, the gold layer ME2 is provided in order to prevent the oxidation of the nickel layer ME1, and to improve the wettability of the solder. Alternatively, when a bonding pad is subjected to wire bonding, the gold layer ME2 also has a function of facilitating coupling of the wire. The bonding pad is subjected to solder coupling. This corresponds to the case where a conductive coupling member such as the metal plate MP is bonded to the emitter pad PDE via a solder (corresponding to the adhesive layer BD2).

In a semiconductor device with such a configuration, the operating current of an IGBT flows between the emitter pad PDE (emitter wire M1E) and the collector back surface electrode BE. Namely, the operating current of an IGBT formed in the transistor cell region flows in the thickness direction of the semiconductor substrate SB. Accordingly, the trench gate type IGBT formed in the transistor cell region is also a vertical type transistor. Herein, the vertical type transistor corresponds to a transistor whose operating current flows in the thickness direction of the semiconductor substrate (SB) (the direction generally perpendicular to the main surface of the semiconductor substrate). The gate pad PDG is a terminal (bonding pad or pad) for controlling the conduction between the emitter pad PDE (emitter wire M1E) and the collector back surface electrode BE.

Figure 14:
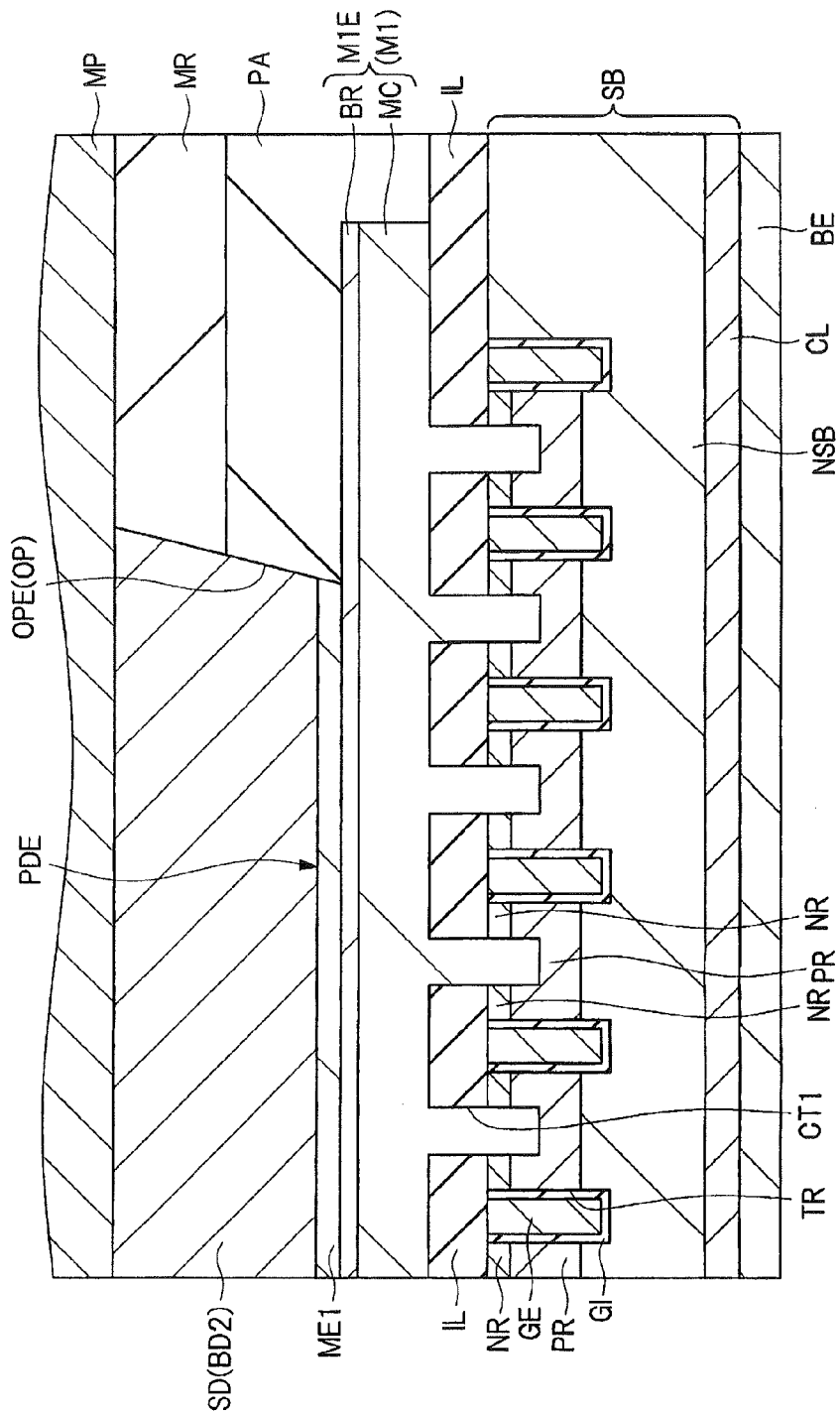
FIG. 14 is an essential part cross sectional view of the semiconductor device of one embodiment.

FIG. 14 is an essential part cross sectional view of the semiconductor device PKG obtained by packaging the semiconductor device (semiconductor chip) CP, and shows a cross section corresponding to FIG. 12.

As described by reference to FIGS. 3 to 9, the metal plate MP is bonded to the emitter pad PDE via an adhesive layer BD2 formed of a solder. Accordingly, FIG. 14 shows the state in which the metal plate MP is bonded via a SD (adhesive layer BD2) to the emitter pad PDE. The solder SD corresponds to the adhesive layer BD2.

Before packaging the semiconductor device (semiconductor chip) CP, namely, before coupling a conductive coupling member such as the metal plate MP or the wire WA to the bonding pad of the semiconductor device CP, as shown in FIGS. 12 and 13, the uppermost layer (outermost layer) of each bonding pad (the emitter pad PDE and the gate pad PDG) of the semiconductor device CP is the gold layer ME2.

However, when a conductive coupling member such as the metal plate MP is solder coupled to the bonding pad of the semiconductor device (semiconductor chip) CP, the gold layer ME2 which has formed the uppermost layer of the bonding pad reacts with a solder, and is incorporated into the solder to be alloyed. From another viewpoint, the gold layer ME2 which has formed the uppermost layer of the bonding pad is rendered in a solder-mixed state. Accordingly, the uppermost layer of the bonding pad subjected to solder coupling is not the gold layer ME2, but the nickel layer ME1.

For this reason, as shown in FIG. 14, when a conductive member such as the metal plate MP is bonded via the solder SD (adhesive layer BD2) to the emitter pad PDE, the gold layer ME2 which has formed the uppermost layer of the emitter pad PDE reacts with the solder SD, and is incorporated into the solder SD to be alloyed. From another viewpoint, the gold layer ME2 which has formed the uppermost layer of the emitter pad PDE is rendered in a mixed state with the solder SD. Accordingly, when the conductive member such as the metal plate MP is bonded via the solder SD (adhesive layer BD2) to the emitter pad PDE, the uppermost layer of the emitter pad PDE is not the gold layer ME2, but the nickel layer ME1. Incidentally, optionally, even when a conductive member such as the metal plate MP is bonded via the solder SD (adhesive layer BD2) to the emitter pad PDE, a part of the gold layer ME2 may be left between the solder SD and the nickel layer ME1.

<Regarding the Configuration and the Operation of IGBT>

Figure 15:
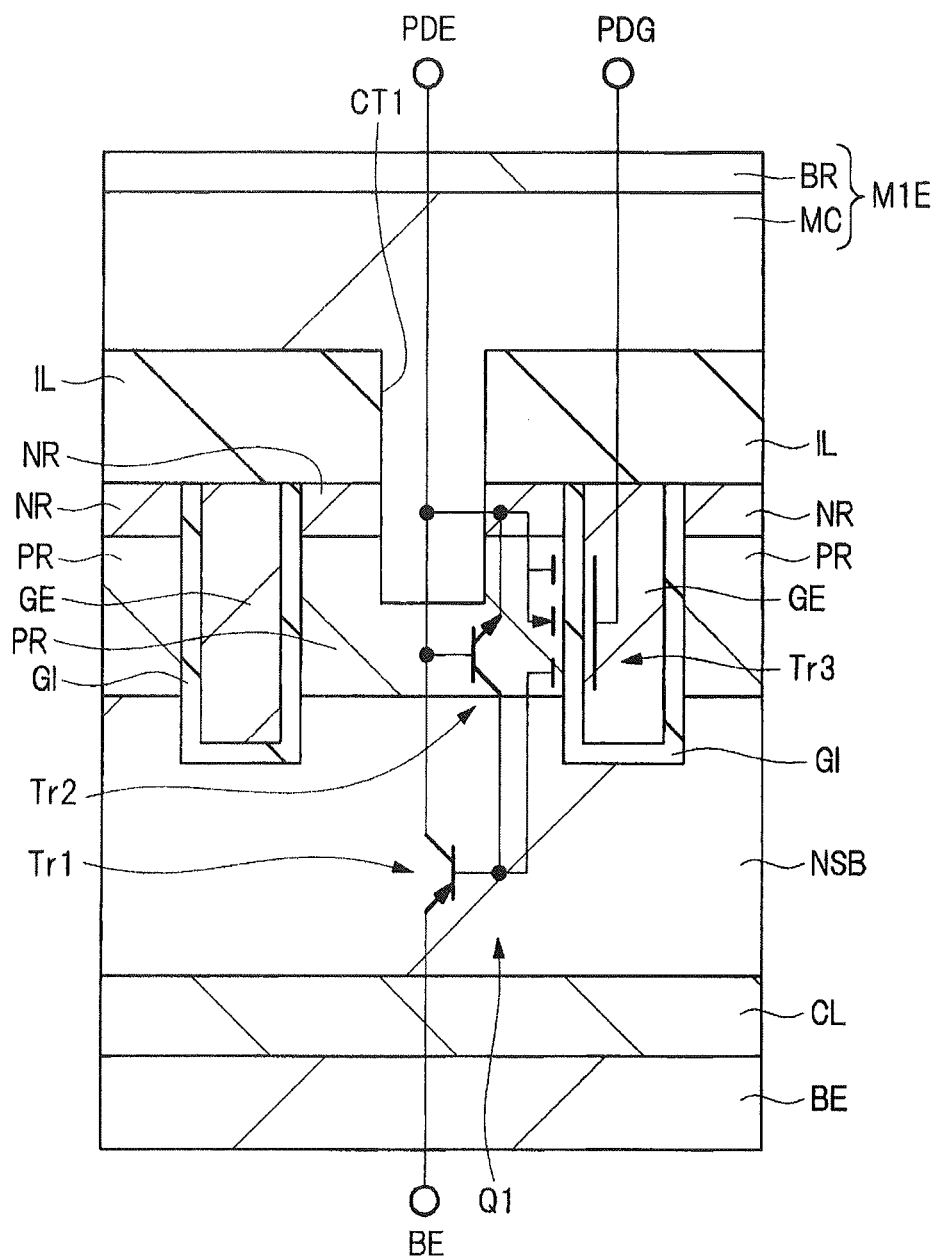
FIG. 15 is an explanatory view of an IGBT formed in a transistor cell region of a semiconductor substrate.

FIG. 15 is an explanatory view showing the correspondence between the circuit configuration and the device structure on the IGBT formed in the transistor cell region of the semiconductor substrate SB. FIG. 15 shows a part (unit transistor cell Q1) of FIG. 12 in an extracted form.

The circuit configuration of the IGBT formed in the semiconductor substrate SB will be described with reference to FIG. 15.

The IGBT forming the unit transistor cell Q1 formed in the transistor cell region of the semiconductor substrate SB has, as shown in FIG. 15, a pnp bipolar transistor Tr1, an npn bipolar transistor Tr2, and a field effect transistor Tr3. Herein, the pnp bipolar transistor Tr1 and the field effect transistor Tr3 form the IGBT. The npn bipolar transistor Tr2 is a parasitic transistor formed parasitically in the device structure. Namely, the main configuration of the IGBT includes the pnp bipolar transistor Tr1 and the field effect transistor Tr3. The npn bipolar transistor Tr2 is a parasitic constituent element.

The pnp bipolar transistor Tr1 is formed of a p type semiconductor region CL (p type collector region), an n type substrate region NSB (n type base region), and a p type semiconductor region PR (p type emitter region). Further, the npn bipolar transistor Tr2 which is a parasitic constituent element is formed of an $n^+$ type semiconductor region NR (n type emitter region), a p type semiconductor region PR (p type base region), and an n type substrate region NSB (n type collector region). Then, the field effect transistor Tr3 is formed of an $n^+$ type semiconductor region NR to be a source region, an n type substrate region NSB to be a drain region, a gate insulation film GI formed at the inner wall of the trench TR, and a gate electrode GE embedded in the trench TR via the gate insulation film GI. The p type semiconductor region PR at a portion thereof situated between the $n^+$ type semiconductor region NR and the n type substrate region NSB, and opposed to the gate electrode GE via the gate insulation film GI becomes the channel formation region of the field effect transistor Tr3.

Then, a description will be given to the coupling relation among the pnp bipolar transistor Tr1, the npn bipolar transistor Tr2, and the field effect transistor Tr3. Between the emitter pad PDE (emitter wire M1E) and the collector back surface electrode BE, there is coupled the pnp bipolar transistor Tr1. Then, the base (n type substrate region NSB) of the pnp bipolar transistor Tr1 is coupled to the drain region (n type substrate region NSB) of the field effect transistor Tr3. The source region (n+ type semiconductor region NR) of the field effect transistor Tr3 is coupled to the emitter pad PDE (emitter wire M1E). At this step, the collector (n type substrate region NSB) of the npn bipolar transistor Tr2 parasitically formed is coupled to the base (n type substrate region NSB) of the pnp bipolar transistor Tr1. The emitter (n+ type semiconductor region NR) of the npn bipolar transistor Tr2 is coupled to the emitter pad PDE (emitter wire M1E). Then, the base (p type semiconductor region PR) of the npn bipolar transistor Tr2 parasitically formed is coupled to the emitter pad PDE (emitter wire M1E).

Then, the operation of the IGBT will be described with reference to FIG. 15.

The collector back surface electrode BE is applied with a high potential (a higher potential than that of the emitter wire M1E); and the emitter pad PDE (emitter wire M1E) is applied with a low potential (a lower potential than that of the back surface electrode BE). In this state, the gate electrode GE of the field effect transistor Tr3 is applied with a gate voltage equal to, or larger than the threshold voltage via the gate wire M1G. Then, the field effect transistor Tr3 is turned on, so that the base current of the pnp bipolar transistor Tr1 flows. As a result, a current flows between the collector back surface electrode BE to which the pnp bipolar transistor Tr1 is coupled, and the emitter pad PDE (emitter wire M1E). Namely, the pnp bipolar transistor Tr1 is turned on (into conduction). In this manner, the IGBT is turned on (into conduction). Subsequently, the gate electrode GE of the field effect transistor Tr3 is applied with a gate voltage equal to or smaller than the threshold voltage. Then, the field effect transistor Tr3 is turned off, so that the base current of the pnp bipolar transistor Tr1 ceases to flow. Accordingly, the current flowing between the collector back surface electrode BE and the emitter pad PDE (emitter wire M1E) according to the base current ceases to flow. Namely, the pnp bipolar transistor Tr1 is turned off, resulting in that the IGBT is turned off. Thus, with the IGBT, by controlling ON/OFF of the field effect transistor Tr3, passage and interruption of the base current of the pnp bipolar transistor Tr1 are controlled. The passage and the interruption of the base current of the pnp bipolar transistor Tr1 resultantly control the passage and the interruption of the collector current of the pnp bipolar transistor Tr1. This controls ON/OFF of the IGBT. Therefore, the IGBT is a semiconductor element combining the high speed switching characteristic and the voltage driven characteristic of the field effect transistor Tr3, and the low ON voltage characteristic of the pnp bipolar transistor Tr1.

The unit transistor cell Q1 including such an IGBT formed therein is formed between the the emitter via part of the emitter wire M1E and the back surface electrode BE. A plurality of such unit transistor cells Q1 are formed and regularly arranged (arrayed) in the transistor cell region of the semiconductor substrate SB. Respective emitter via parts are coupled to the common emitter wire M1E. This results in a state in which a plurality of unit transistor cells Q1 (unit IGBTs) are coupled in parallel with one another between the emitter wire M1E and the back surface electrode BE. The gate electrodes GE of the plurality of unit transistor cells Q1 (unit IGBTs) are electrically coupled to one another, and are electrically coupled via the gate wire M1G to the common gate pad PDG. The plurality of parallel-coupled unit transistor cells Q1 (unit IGBTs) result in that one power transistor (power IGBT) is formed between the emitter wire M1E and the back surface electrode BE, accordingly, between the emitter pad PDE and the back surface electrode BE.

<Regarding Manufacturing Steps of a Semiconductor Device>

Then, one example of the manufacturing steps of the semiconductor device of the present embodiment will be described by reference to FIGS. 16 to 27.

Figure 16:
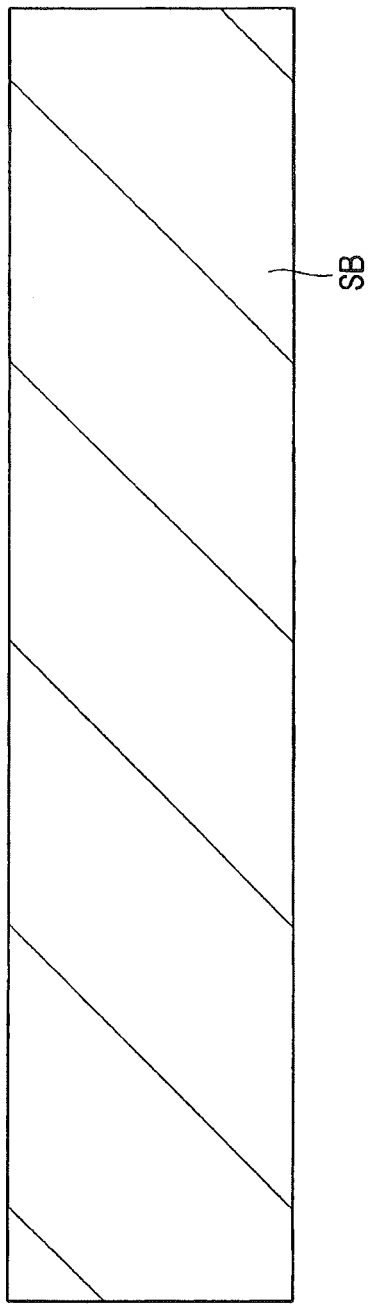
FIG. 16 is an essential part cross sectional view of the semiconductor device of one embodiment during a manufacturing step.

For manufacturing the semiconductor device, first, as shown in FIG. 16, there is provided a semiconductor substrate SB (semiconductor wafer) formed of, for example, an n type single crystal silicon. As the semiconductor substrate SB, it is also possible to use a semiconductor substrate (so-called epitaxial wafer) in which over a substrate main body formed of an n type single crystal silicon substrate, there is formed an epitaxial layer (semiconductor layer) formed of an n type single crystal silicon having a lower impurity concentration than that.

Figure 17:
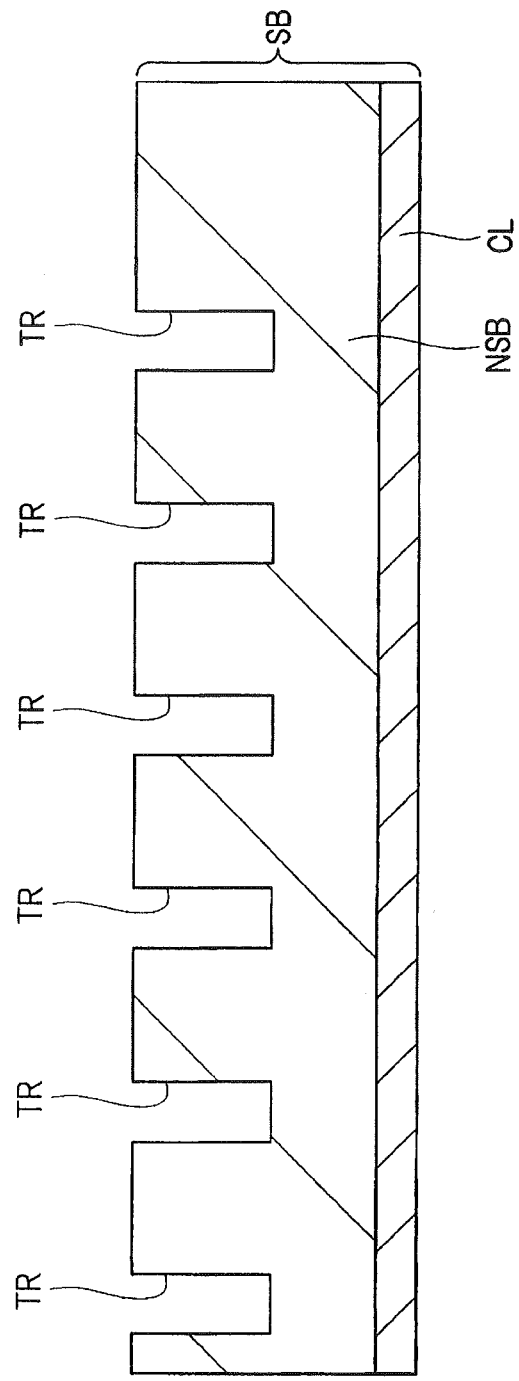
FIG. 17 is an essential part cross sectional view of the semiconductor device during a manufacturing step following FIG. 16.

Then, as shown in FIG. 17, on the back surface side of the semiconductor substrate SB, a p type semiconductor region CL is formed using an ion implantation method, or the like. The p type semiconductor region CL can be formed over the entire back surface of the semiconductor substrate SB, and is formed from the back surface of the semiconductor substrate SB through to a prescribed depth. Incidentally, the p type semiconductor region CL formation step is not required to be performed at this stage, and can be performed at any step stage before forming the back surface electrode BE.

Then, in the main surface of the substrate SB, there are formed trenches TR. The trenches TR can be formed using a photolithography technology and an etching technology.

Figure 18:
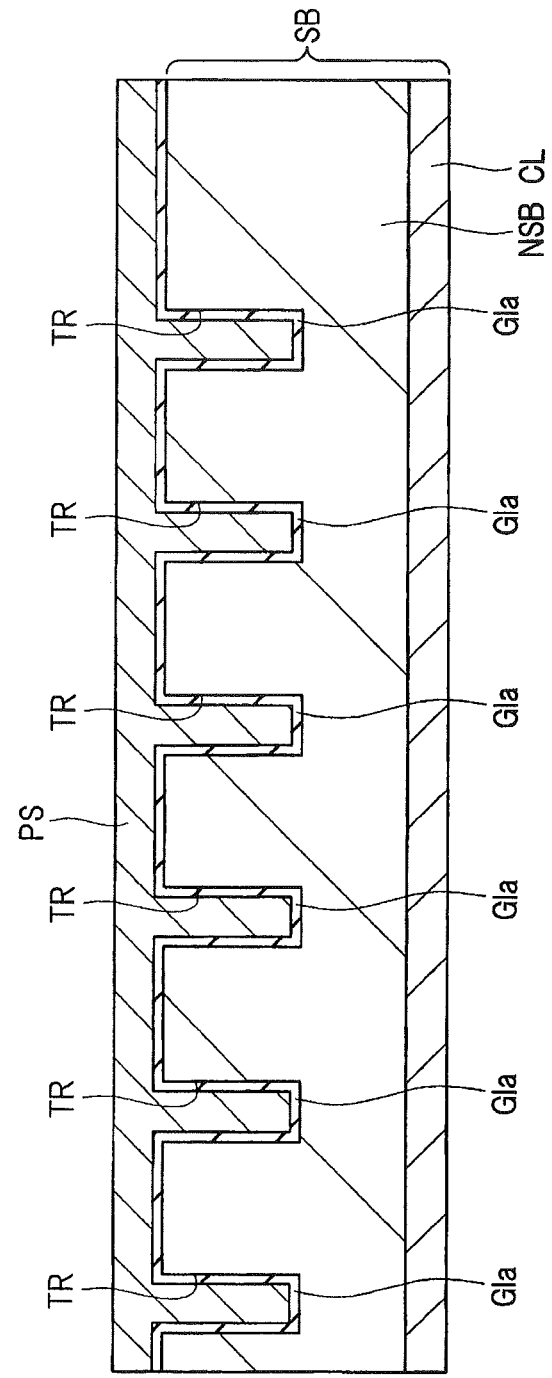
FIG. 18 is an essential part cross sectional view of the semiconductor device during a manufacturing step following FIG. 17.

Then, as shown in FIG. 18, using, for example, a thermal oxidation method, an insulation film GIa formed of a relatively thin silicon oxide film, or the like is formed over the inner wall surface (side surface and bottom surface) of each trench TR, and the like. The insulation film GIa is an insulation film to serve as a gate insulation film GI later, and is formed at the inner wall surface (the side surface and the bottom surface) of the trench TR, and the exposed top surface of the semiconductor substrate SB.

Then, over the entire main surface of the semiconductor substrate SB, a conductive film (conductor film) PS such as a polycrystal silicon film (doped polysilicon film) reduced in resistivity by being doped with an impurity (e.g., n type impurity) is formed in such a manner as to fill the insides of the trenches TR using a CVD method, or the like.

Then, such a photoresist pattern (not shown) as to cover a gate lead-out wire part GE1 forming region, and to expose other regions is formed over the conductive film PS. Using the photoresist pattern as an etching mask, the conductive film PS is etched back (etched or anisotropically etched). By the etching back, the conductive film PS is left in the trenches TR and under the photoresist pattern, and other portions of the conductive film PS are removed. Then, the photoresist pattern is removed. The portion of the insulation film GIa left in each trench TR becomes a gate insulation film GI. The portion of the conductive film PS left in each trench TR becomes a gate electrode GE. The portion of the conductive film PS left under the the photoresist pattern becomes a gate lead-out wire part GE1. Further, in the etching back step of the conductive film PS, there may be removed the insulation film GIa (the portions of the insulation film GIa other than at the inner walls of the trenches TR) at the top surface of the semiconductor substrate SB.

Figure 19:
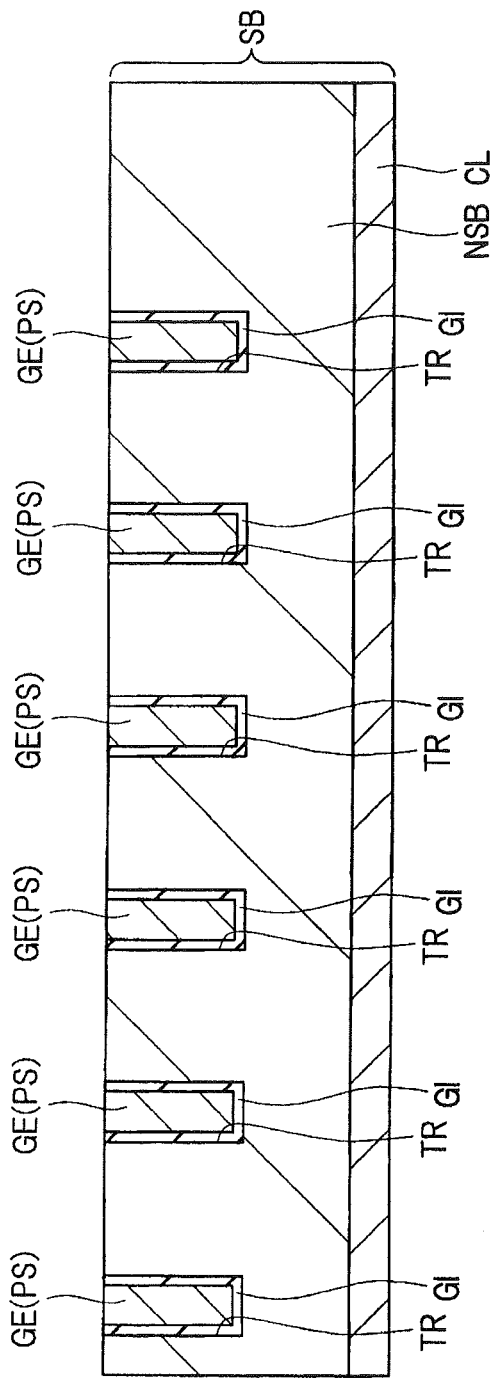
FIG. 19 is an essential part cross sectional view of the semiconductor device during a manufacturing step following FIG. 18.

Thus, as shown in FIG. 19, there is formed a gate electrode GE formed of the conductive film PS embedded in each trench TR. The gate electrode GE is embedded in the trench TR via the insulation film GIa (i.e., the gate insulation film GI). Further, although not shown in FIG. 19, as shown in FIG. 13, the gate lead-out wire part GE1 formed of the conductive film PS, and integrally formed with the gate electrode GE is also formed with the gate electrode GE. When the gate lead-out wire part GE1 is not required to be formed, without forming a photoresist pattern covering the gate lead-out wire part GE1 forming region, the conductive film PS may be etched back to form the gate electrode GE.

Figure 20:
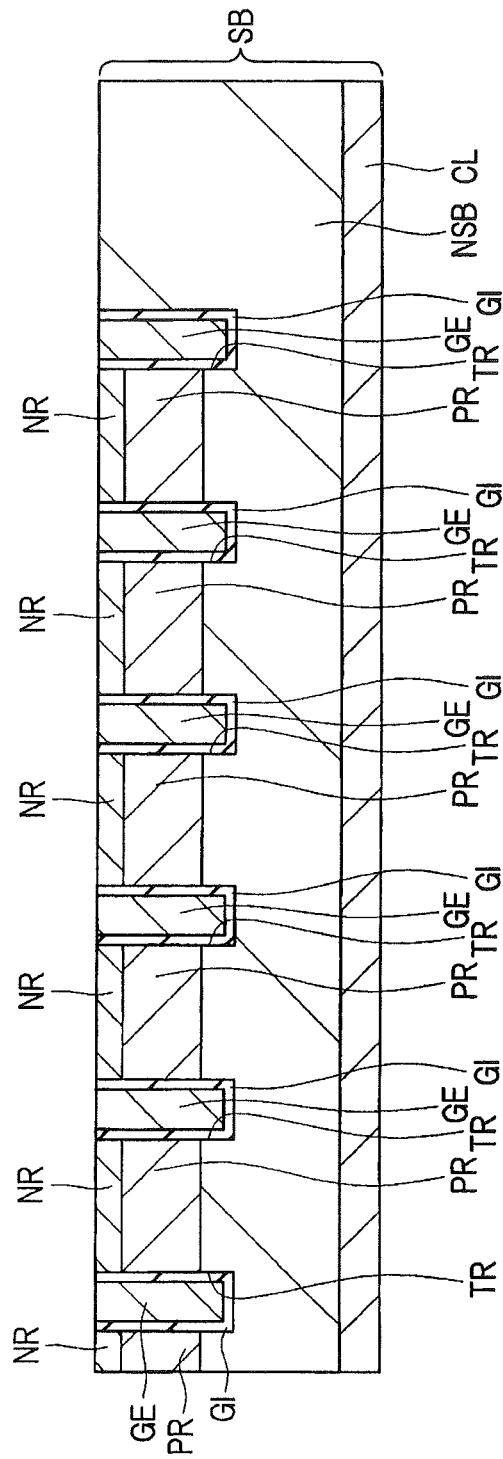
FIG. 20 is an essential part cross sectional view of the semiconductor device during a manufacturing step following FIG. 19.

Then, as shown in FIG. 20, the main surface of the semiconductor substrate SB is ion-implanted with a p type impurity (e.g., boron (B)), thereby to form a p type semiconductor region PR. The p type semiconductor region PR is formed at the upper layer part of the semiconductor substrate SB in the transistor cell region.

Then, the main surface of the semiconductor substrate SB is ion-implanted with an n type impurity (e.g., arsenic (As)), thereby to form an $n^+$ type semiconductor region NR. The depth (the depth position of the bottom) of the $n^+$ type semiconductor region NR is shallower than the depth (the depth position of the bottom) of the p type semiconductor region PR. For this reason, the p type semiconductor region PR and the $n^+$ type semiconductor region NR are formed at the upper layer part (front surface layer part) of the semiconductor substrate SB in the transistor cell region. The $n^+$ type semiconductor region NR is formed over the p type semiconductor region PR. This results in a state in which the p type semiconductor region PR is present under the $n^+$ type semiconductor region NR, and the $n^+$ type semiconductor region NR is present over the p type semiconductor region PR. The $n^+$ type semiconductor region NR and the p type semiconductor region PR are formed shallower than the trench TR. This results in a state in which the trench TR penetrates through the $n^+$ type semiconductor region NR and the p type semiconductor region PR, and terminates in the semiconductor substrate SB (n type substrate region NSB) at the underlying layer.

Further, herein, a description has been given to the case where the p type semiconductor region PR is formed first, and then, the $n^+$ type semiconductor region NR is formed. However, as another form, the following is also possible: the $n^+$ type semiconductor region NR is formed first, and then, the p type semiconductor region PR is formed.

Then, there is performed activation annealing for activating the injected impurity. The activation annealing can be performed at, for example, about 800 to 1000° C. This can activate the impurities injected into respective semiconductor regions (such as the p type semiconductor regions CL and PR, and the $n^+$ type semiconductor region NR) formed in the semiconductor substrate SB.

Figure 21:
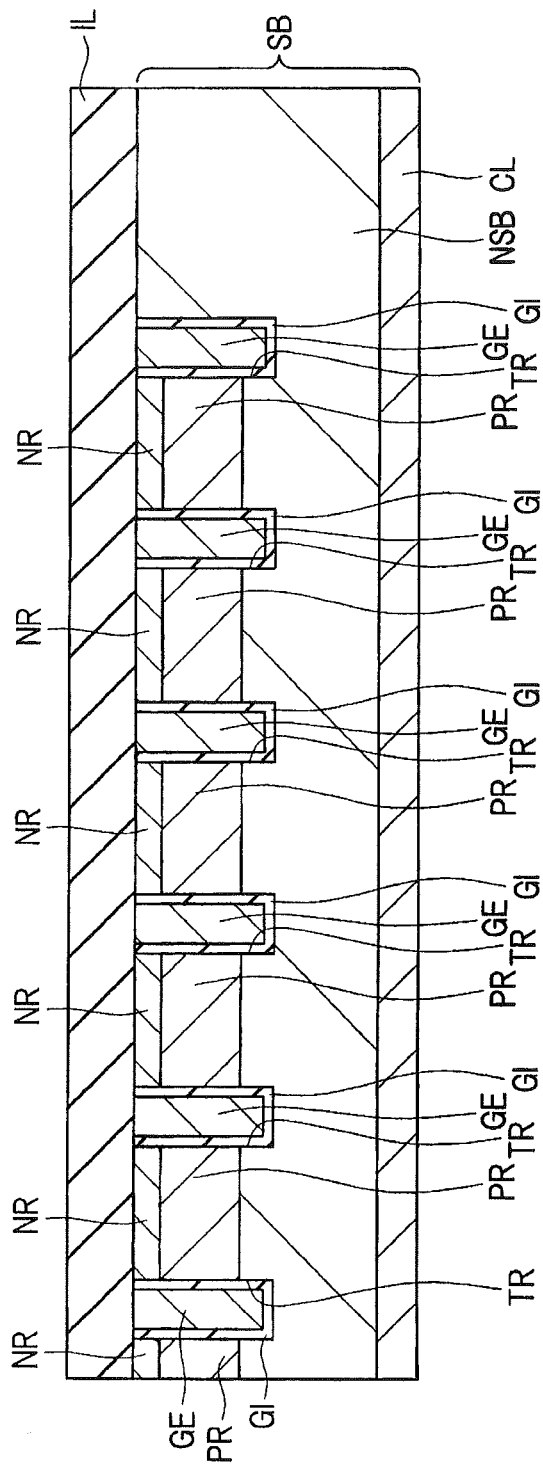
FIG. 21 is an essential part cross sectional view of the semiconductor device during a manufacturing step following FIG. 20.

Then, as shown in FIG. 21, over the main surface of the semiconductor substrate SB, an insulation film IL (e.g., a silicon oxide film) is formed as an interlayer insulation film in such a manner as to cover the gate electrode GE and the gate lead-out wire part GE1.

Figure 22:
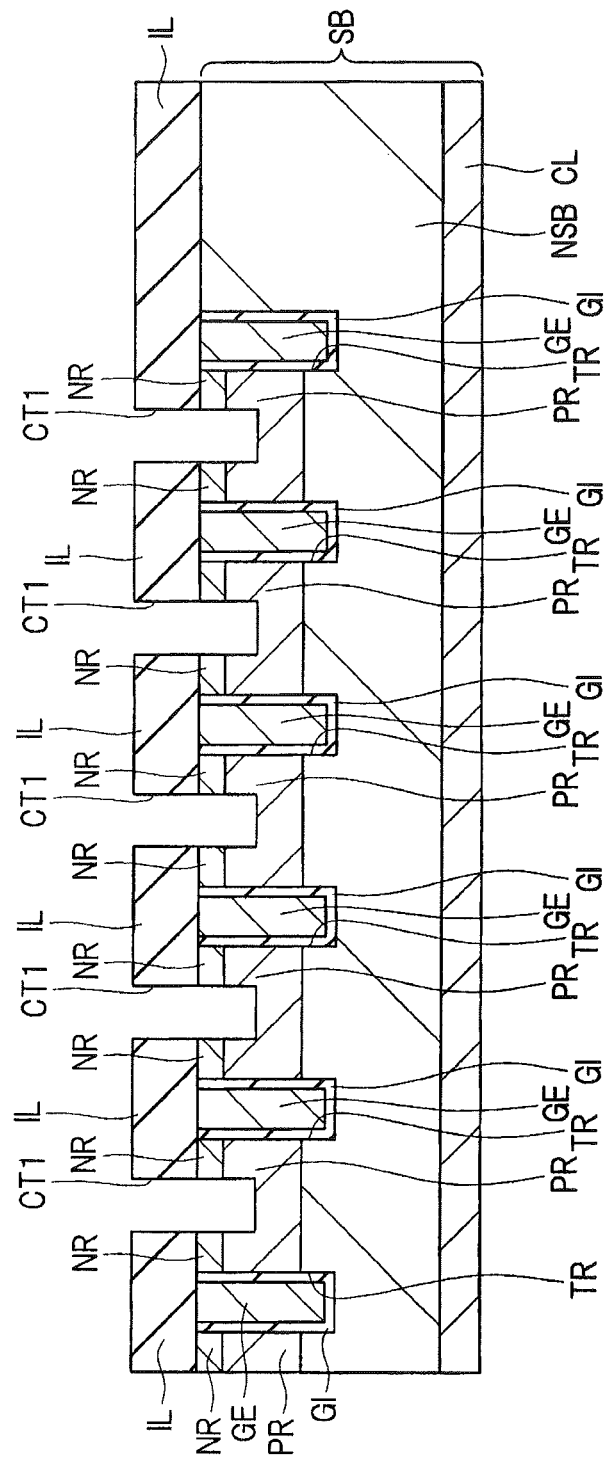
FIG. 22 is an essential part cross sectional view of the semiconductor device during a manufacturing step following FIG. 21.

Then, as shown in FIG. 22, with a photoresist pattern (not shown) formed over the insulation film IL using a photolithography method as an etching mask, the insulation film IL is etched (e.g., dry etched). Further, the semiconductor substrate SB is etched (e.g., dry etched), thereby to form contact holes CT1. Each contact hole CT1 is arranged between the trenches TR adjacent to each other in a plan view, and penetrates through the insulation film IL and the $n^+$ type semiconductor region NR. Thus, the bottom of the contact hole CT1 reaches the p type semiconductor region PR. Accordingly, at the bottom surface of the contact hole CT1, there is exposed the p type semiconductor region PR. At the lower part of the side surface of the contact hole CT1, there is exposed the $n^+$ type semiconductor region NR.

Incidentally, the following is also possible: after forming the contact hole CT1, the p type semiconductor region PR exposed from the bottom surface of the contact hole CT1 is ion-implanted with a p type impurity; as a result, a $p^+$ type semiconductor region having a higher impurity concentration than that of the p type semiconductor region PR is provided at a position in contact with the bottom surface of the contact hole CT1. In that case, the emitter via part is electrically coupled with the p type semiconductor region PR via the $p^+$ type semiconductor region.

Then, although not shown in FIG. 22, as shown in FIG. 13, with a photoresist pattern (not shown) formed over the insulation film IL using a photolithography method as an etching mask, the insulation film IL is etched (e.g., dry etched), thereby to form contact holes CT2. Each contact hole CT2 is formed over the gate lead-out wire part GE1. Thus, at the bottom of the contact hole CT2, there is exposed the gate lead-out wire part GE1. The contact holes CT2 can also be formed by the same step as that for the contact holes CT1.

Figure 23:
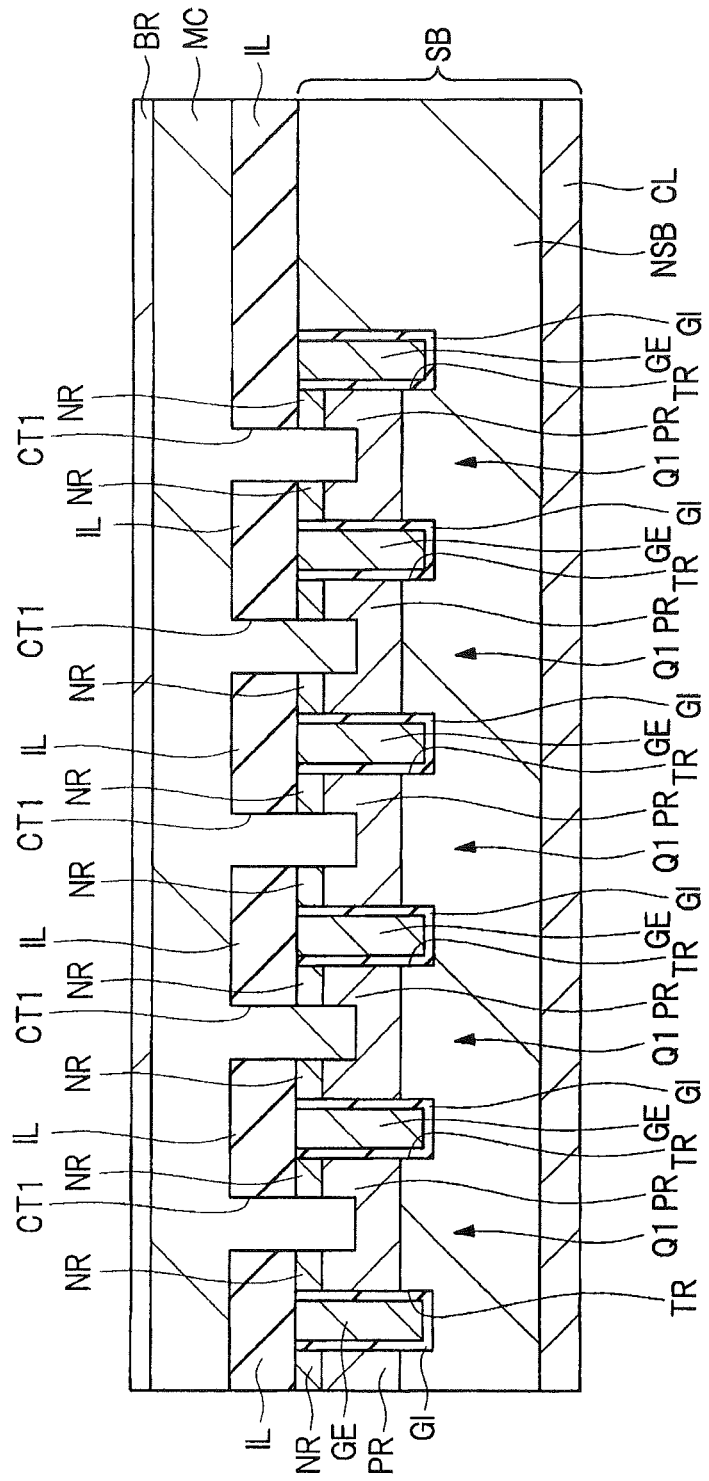
FIG. 23 is an essential part cross sectional view of the semiconductor device during a manufacturing step following FIG. 22.

Then, as shown in FIG. 23, over the entire main surface of the semiconductor substrate SB, namely, over the insulation film IL including the insides of the contact holes CT1 and CT2, there is formed a main conductor film MC containing aluminum (Al) as a main component. Then, over the entire main surface of the semiconductor substrate SB, namely, over the main conductor film MC, a conductor film (conductive barrier film) BR is formed. This results in a state in which a lamination metal film of the main conductor film MC, and the conductor film BR over the main conductor film MC is formed over the insulation film IL including the insides of the contact holes CT1 and CT2. The conductor film BR is formed of a titanium (Ti) film, a tungsten (W) film, or a titanium tungsten (TiW) film, and is formed over the entire top surface of the main conductor film MC. The insides of the contact holes CT1 and CT2 are filled with the main conductor film MC. Accordingly, the conductor film BR formed over the top surface of the main conductor film MC is situated outside the contact holes CT1 and CT2. The main conductor film MC and the conductor film BR can be each formed using, for example, a sputtering method.

Figure 24:
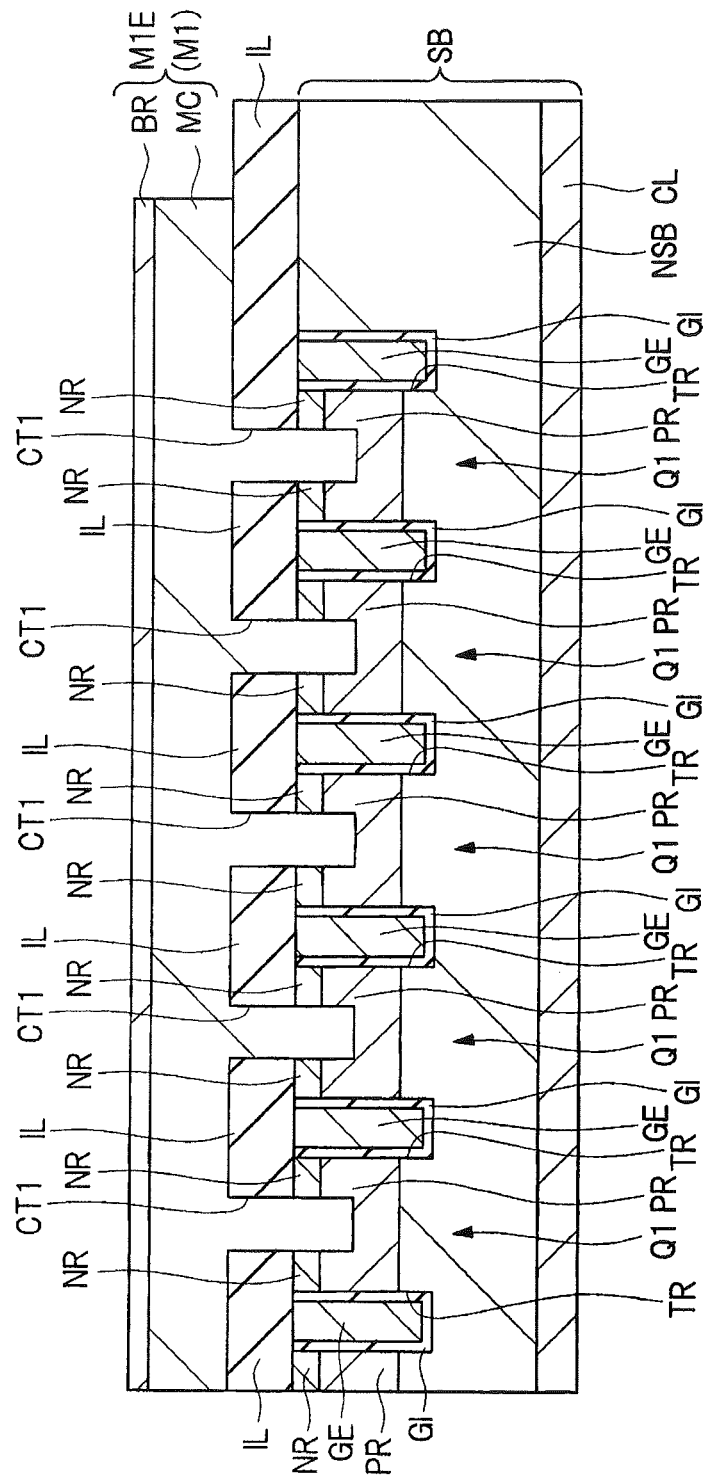
FIG. 24 is an essential part cross sectional view of the semiconductor device during a manufacturing step following FIG. 23.

Then, as shown in FIG. 24, a lamination metal film of the main conductor film MC, and the conductor film BR over the main conductor film MC is patterned using a photolithography technology and an etching technology, thereby to form a wire M1. Specifically, a photoresist pattern (not shown) is formed over the conductor film BR using a photolithography technology. Then, using the photoresist pattern as an etching mask, the lamination metal film of the main conductor film MC, and the conductor film BR over the main conductor film MC is etched (e.g., dry etched). This results in the formation of the wires M1 (the emitter wire M1E and the gate wire M1G) formed of a patterned lamination metal film (a lamination metal film of the main conductor film MC, and the conductor film BR over the main conductor film MC). Then, the photoresist pattern is removed. As described above, the wires M1 include the emitter wire M1E and the gate wire M1G. Incidentally, the gate wire M1G is not shown in FIG. 24, but shown in FIG. 13.

The via part (a portion for filling the inside of the emitter contact hole CT1) of the emitter wire M1E is integrally formed with the emitter wire M1E. The via part (a portion for filling the inside of the gate contact hole CT2) of the gate wire M1G is integrally formed with the gate wire M1G. The via part of the emitter wire M1E is in contact with the type semiconductor region NR and the p type semiconductor region PR in the vicinity of the bottom of the contact hole CT1, and is electrically coupled with them. The via part of the gate wire M1G is in contact with, and is electrically coupled with the gate lead-out wire part GE1 at the bottom of the contact hole CT2.

As another form, the following is also possible: the emitter via part (the conductive part filling the inside of the emitter contact hole CT1) is formed separately from (by a separate step from that of) the emitter wire M1E; and the gate via part (the conductive part filling the inside of the gate contact hole CT) is formed separately from (by a separate step from that of) the gate wire M1G. In that case, after forming the contact holes CT1 and CT2, over the insulation film IL, a conductive film is formed in such a manner as to fill the insides of the contact holes CT1 and CT2. Then, using a CMP method or the like, the portions of the conductive film outside the contact holes CT1 and CT2 are removed. This results in the formation of conductive pugs filling the insides of the contact holes CT1 and CT2. The conductive plug filling the inside of the contact hole CT2 corresponds to the gate via part. The conductive plug filling the inside of the contact hole CT1 corresponds to the emitter via part Then, over the insulation film IL including the conductive plugs embedded therein, there is formed a lamination metal film of the main conductor film MC, and the conductor film BR over the main conductor film MC. Then, using a photolithography technology and an etching technology, the lamination metal film may be patterned, thereby to form the wire M1 (the emitter wire M1E and the gate wire M1G).

Figure 25:
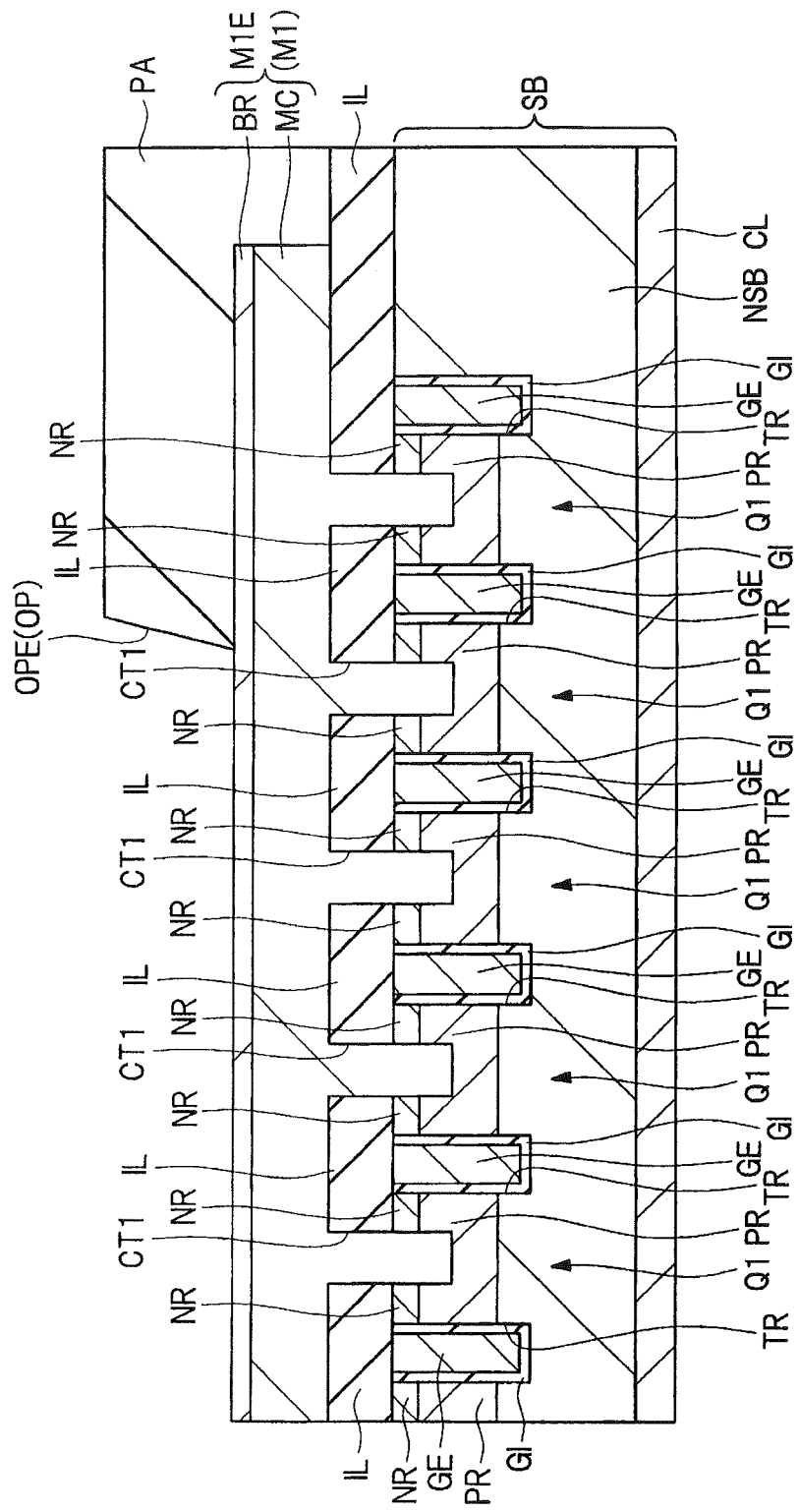
FIG. 25 is an essential part cross sectional view of the semiconductor device during a manufacturing step following FIG. 24.

Then, as shown in FIG. 25, over the main surface of the semiconductor substrate SB, namely, over the insulation film IL, an insulation film PA is formed in such a manner as to cover the wire M1 (the emitter wire M1E and the gate wire M1G). The insulation film PA is formed of a resin film such as a polyimide type resin, and may have a function of surface protection. At the stage of having formed the insulation film PA, the entire wire M1 is covered with the insulation film PA.

Then, an opening OP is formed in the insulation film PA. FIG. 25 shows this stage.

The opening OP can be formed, for example, in the following manner. Namely, the insulation film PA is formed as a photosensitive resin film. Thus, over the insulation film PA formed of a photosensitive resin, a photoresist pattern (not shown) is formed using a photolithography technology. Then, using the photoresist pattern as a mask, the insulation film PA formed of a photosensitive resin is exposed to light. As a result, the insulation film PA at a portion thereof exposed without being covered with the photoresist pattern is exposed to light. Then, the photoresist pattern is removed, and then, the insulation film PA formed of a photosensitive resin is subjected to a development treatment. As a result, the exposed portions of the insulation film PA are removed. The exposure and development treatments selectively remove the insulation film PA at portions thereof to be the openings OP. This can form the openings OP in the insulation film PA. Then, a heat treatment can be performed, thereby to cure the insulation film PA. The openings OP are formed in such a manner as to penetrate through the insulation film PA, so that a part of the wire M1 is exposed from each opening OP.

Further, as another form, the following is also possible. Using a photoresist pattern formed over the insulation film PA using a photolithography technology as an etching mask, the insulation film PA is etched (e.g., dry etched); as a result, the openings OP are formed in the insulation film PA. In that case, the insulation film PA is not required to be a photosensitive resin film.

The openings OP include the emitter opening OPE and the gate opening OPG. The emitter opening OPE and the gate opening OPG are not combined with each other, and are separated from each other. The emitter opening OPE is formed over the emitter wire M1E, and exposes a part of the emitter wire M1E therefrom. Accordingly, the emitter opening OPE is internally included in the emitter wire M1E in a plan view. The gate opening OPG is formed over the gate wire M1G, and exposes a part of the gate wire M1G therefrom. Accordingly, the gate opening OPG is internally included in the gate wire M1G in a plan view. Incidentally, the gate opening OPG is not shown in FIG. 25, but shown in FIG. 13.

Further, the opening OP is formed in the insulation film PA, so that the top surface of the wire M1 is exposed from the opening OP. The wire M1 at a portion thereof exposed from the opening OP is also kept in a state in which the main conductor film MC is covered with the conductor film BR. This results in that the portion exposed from the opening OP is the top surface of the conductor film BR forming the wire M1.

Figure 26:
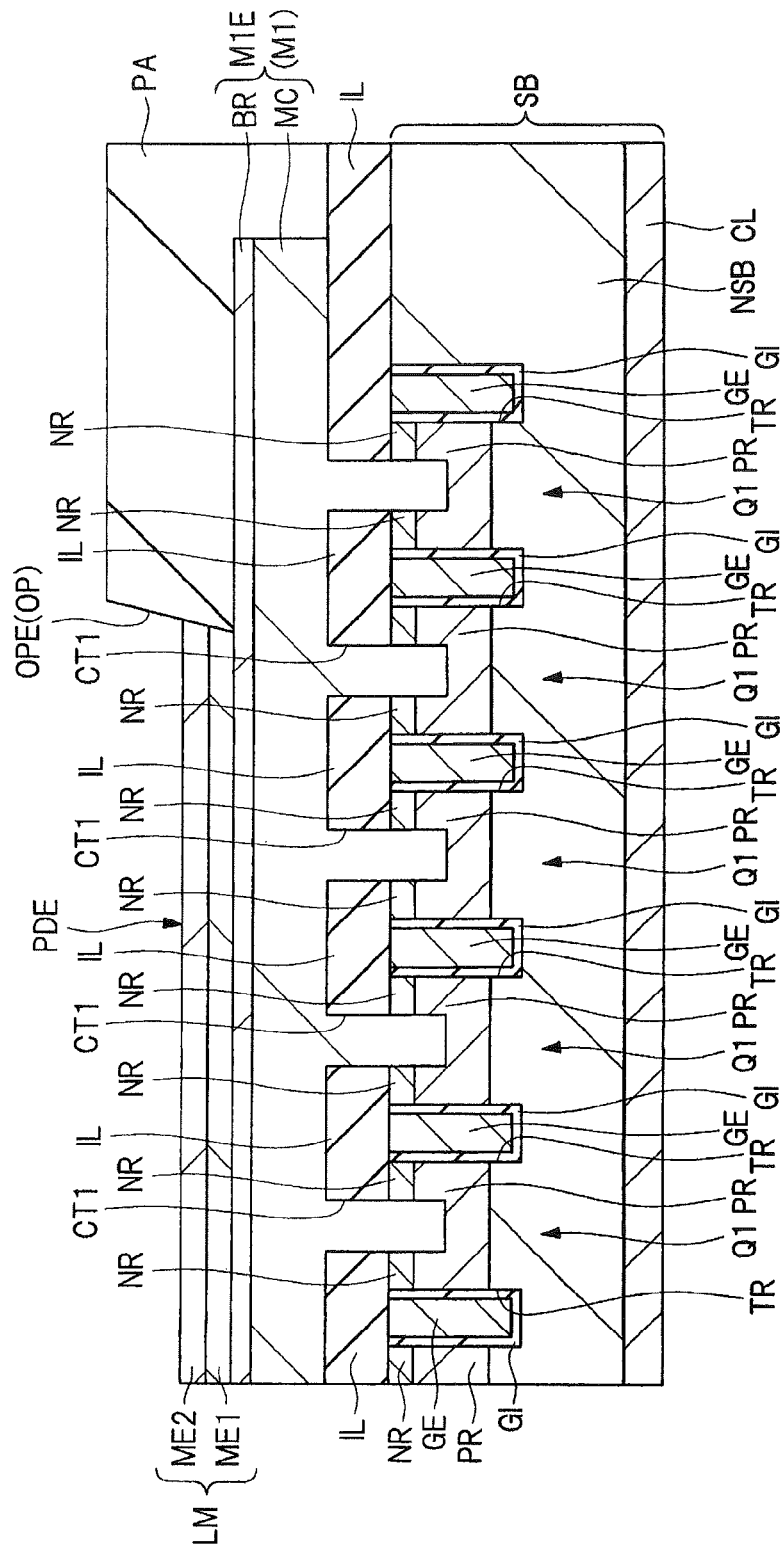
FIG. 26 is an essential part cross sectional view of the semiconductor device during a manufacturing step following FIG. 25.

Then, as shown in FIG. 26, over the wire M1 exposed from the opening OP, namely, over the conductor film BR exposed from the opening OP, a nickel (Ni) layer ME1 and a gold (Au) layer ME2 are sequentially formed. This results in the formation of a lamination film (lamination metal film) LM of the nickel layer ME1, and the gold layer ME2 over the nickel layer ME1. The lamination film LM is formed selectively over the wire M1 exposed from the opening OP, namely, over the conductor film BR exposed from the opening OP. Accordingly, over the wire M1 at a portion thereof covered with the insulation film PA, the nickel layer ME1 and the gold layer ME2 are not formed. The nickel layer ME1 and the gold layer ME2 can be each formed using a plating method (preferably, an electroless plating method).

The formation of the lamination film LM results in a state in which the lamination films LM are formed over the emitter film M1E exposed from the opening OP, and over the gate wire M1G exposed from the opening OP, respectively.

In this manner, there are formed the bonding pads (the emitter pad PDE and the gate pad PDG) on the top surface side of the semiconductor device CP. Namely, the emitter wire M1E at a portion thereof exposed from the opening OP in the insulation film PA, and the lamination film LM formed thereover form the emitter pad PDE which is a bonding pad for an emitter. Whereas, the gate wire M1G at a portion thereof exposed from the opening OP in the insulation film PA, and the lamination film LM formed thereover form the gate pad PDG which is a bonding pad for a gate.

Figure 27:
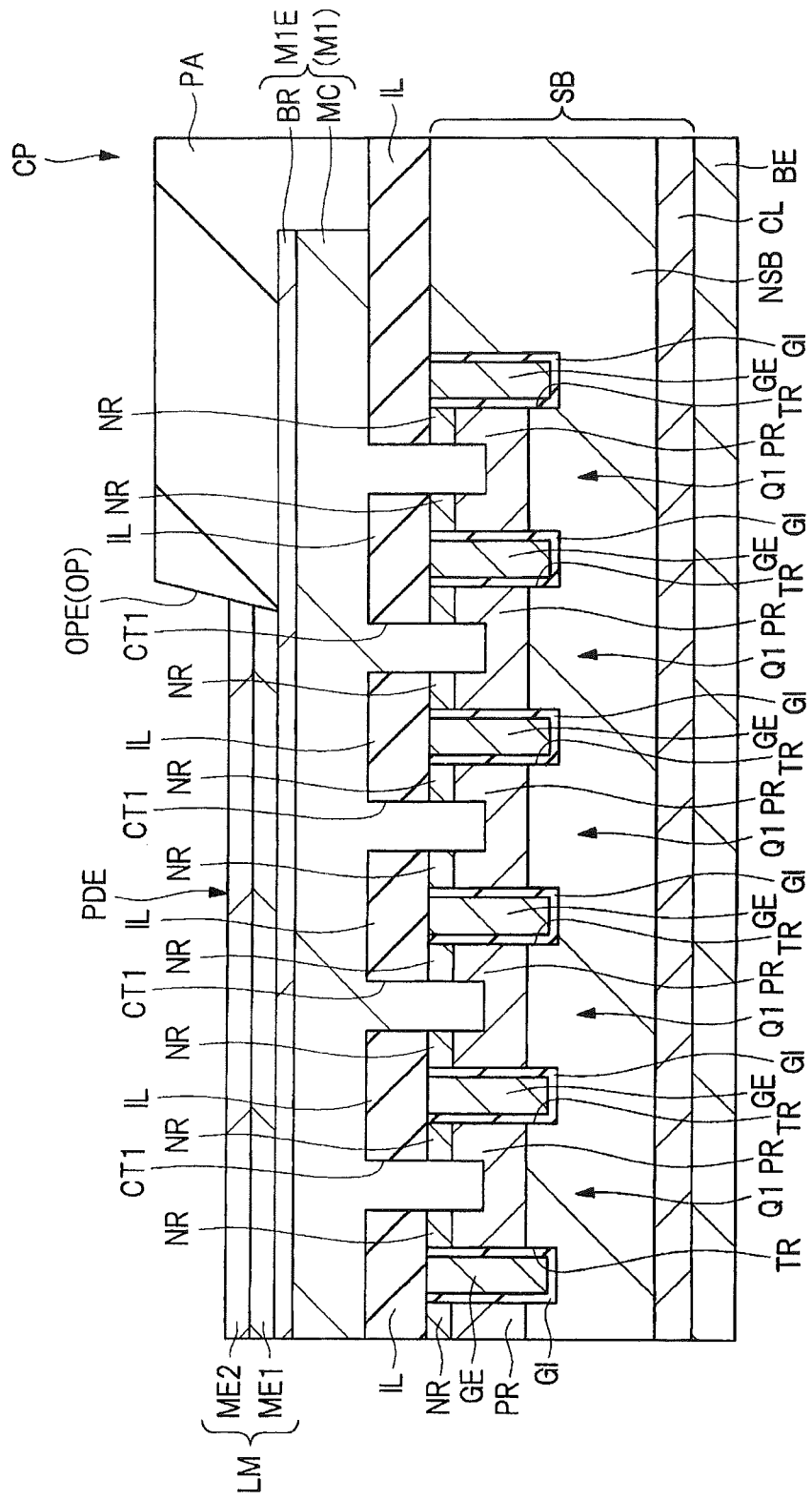
FIG. 27 is an essential part cross sectional view of the semiconductor device during a manufacturing step following FIG. 26.

Then, if required, the back surface (the main surface opposite to the main surface on the side of which the trench TR is formed) of the semiconductor substrate SB is ground or polished, thereby to reduce the thickness of the semiconductor substrate SB. Then, as shown in FIG. 27, a back surface electrode BE is formed over the entire back surface of the semiconductor substrate SB. The back surface electrode BE is formed of a lamination metal film of an aluminum (Al) film, a titanium (Ti) film, a nickel (Ni) film, and a gold (Au) film sequentially from the side closer to the back surface of the semiconductor substrate SB, and can be formed using, for example, a vapor deposition method.

In this manner, the semiconductor device of the present embodiment is manufactured. Then, the semiconductor substrate SB is divided (separated or cut) by dicing or the like. As a result, individual semiconductor chips (semiconductor devices CP) are obtained from the semiconductor substrate SB.

In the present embodiment, as the optimum applied example, a description is given to the case where as a semiconductor element (power semiconductor element) for controlling the conduction between the first terminal (herein, the emitter pad PDE) on the top surface side of the semiconductor device CP and the second terminal (herein, the back surface electrode BE) on the back surface side of the semiconductor device CP, an IGBT (more preferably, a trench gate type IGBT) is formed at the semiconductor substrate SB.

As another form, it is also possible to use a power semiconductor element other than an IGBT as a semiconductor element (power semiconductor element) for controlling the conduction between the first terminal on the top surface side of the semiconductor device CP and the second terminal on the back surface side of the semiconductor device CP. For example, as a semiconductor element (power semiconductor element) for controlling the conduction between the first terminal on the top surface side of the semiconductor device CP and the second terminal on the back surface side of the semiconductor device CP, a trench gate type MISFET (Metal Insulator Semiconductor Field Effect Transistor) can also be formed at the semiconductor substrate SB. In that case, the cross sectional structure is basically the same as the cross sectional structure of FIGS. 12 and 13, except that the p type semiconductor region (collector region) CL is not formed in the semiconductor substrate SB, and that the back surface electrode BE is adjacent to the n type substrate region NSB. In that case, the collector back surface electrode BE functions as a back surface electrode for a drain (a terminal for a drain), the emitter pad PDE functions as a pad for a source (a terminal for a source), and the emitter wire M1E functions as a wire for a source. The trench gate type MISFET is formed of the field effect transistor Tr3 described above. Further, as a semiconductor element (power semiconductor element) for controlling the conduction between the first terminal on the top surface side of the semiconductor device CP and the second terminal on the back surface side of the semiconductor device CP, it is also possible to form a diode (free wheel diode) at the semiconductor substrate SB.

<Regarding the Electronic System Using a Semiconductor Device>

Figure 28:
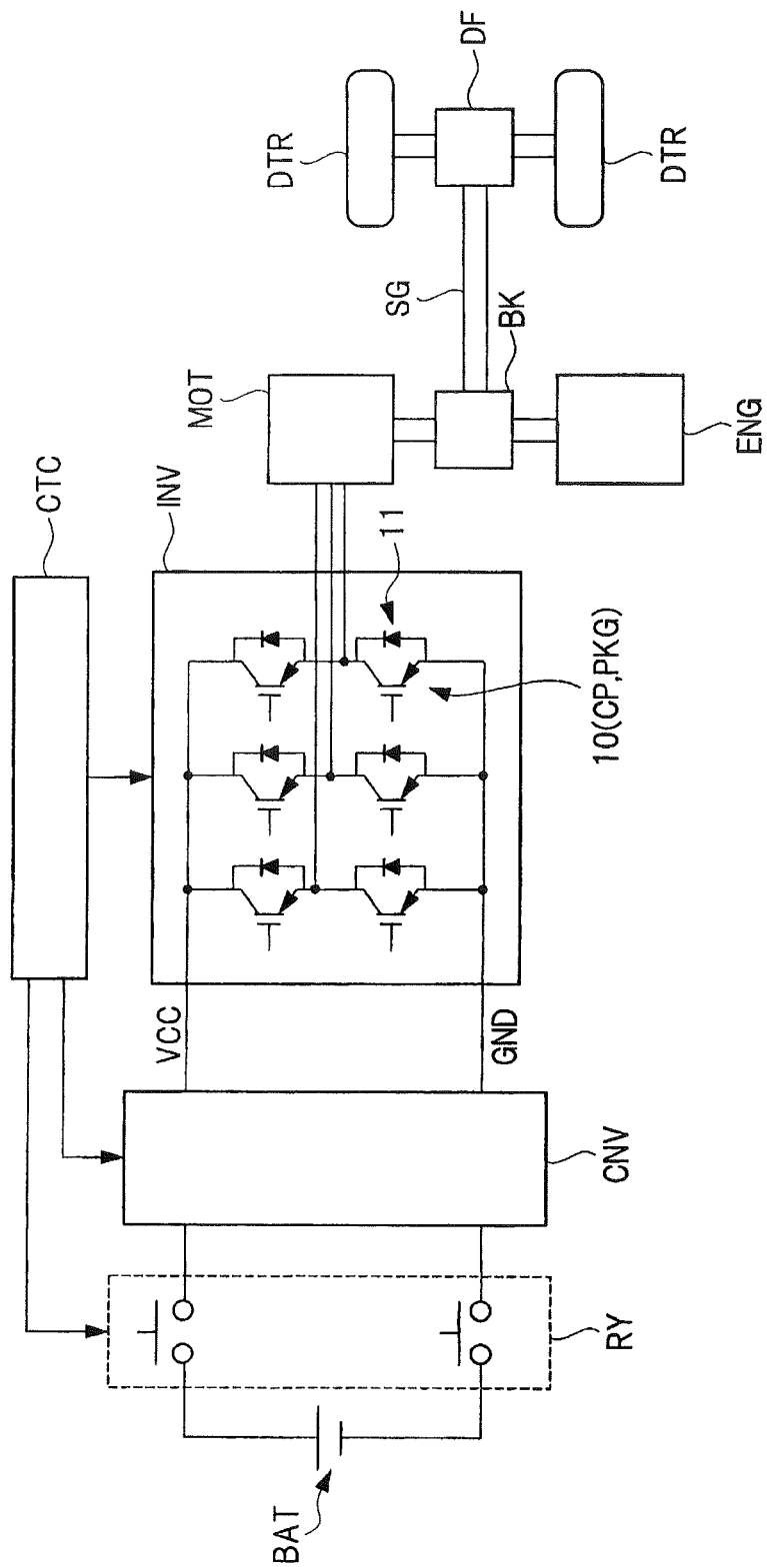
FIG. 28 is an explanatory view showing one example of an electronic system using the semiconductor device of one embodiment.

Then, a description will be given to one example of an electronic system (electronic device) using the semiconductor device CP or the semiconductor device PKG of the present embodiment. FIG. 28 is an explanatory view (circuit block diagram) showing one example of an electronic system (electronic device) using the semiconductor device CP or the semiconductor device PKG of the present embodiment, herein, an electric car system.

The electronic system (herein, the electric car system) shown in FIG. 28 has a load such as a motor MOT, an inverter (inverter circuit) INV, a power supply BAT, and a control part (control circuit) CTC. As the motor MOT, herein, a three-phase motor is used. The three-phase motor is configured so as to be driven by three-phase voltages different in phase. The semiconductor device CP, or the semiconductor device PKG using the semiconductor device CP is a constituent element of the inverter INV.

In an electronic system (herein, an electric car system) of FIG. 28, the power supply BAT is coupled via a relay RY and a converter (booster converter) CNV to an inverter INV. Thus, a voltage (electric power) from the power supply BAT is supplied to the inverter INV. The converter CNV is interposed between the power supply BAT and the inverter INV. Accordingly, the voltage (DC voltage) from the power supply BAT is converted (boosted) to a voltage suitable for motor driving at the converter CNV, and then is supplied to the inverter INV. The relay RY is interposed between the power supply BAT and the converter CNV. Thus, the coupling between the power supply BAT and the converter CNV can be switched by the relay RY between a coupled state and a cut-off state.

Further, to the inverter INV, there is coupled a motor MOT. Thus, the DC current (DC electric power) supplied from the power supply BAT via the converter CNV to the inverter INV is converted to an AC voltage (AC electric power) at the inverter INV, and is supplied to the motor MOT. The motor MOT is driven by the AC voltage (AC electric power) supplied from the inverter INV.

The motor MOT can rotate (drive) the tires (wheels) of a car, and the like.

For example, in the case of a hybrid car, the output shaft of the motor MOT and the output shaft of the engine ENG are synthesized by a power transfer mechanism BK. The torque is transferred to an axle SG. The axle SG operates together with a driving wheel DTR via a differential DF. When a large driving force is required, or in other cases, the motor MOT is driven together with the engine ENG. The output torques are synthesized by the power transfer mechanism BK, and transferred via the axle SG to the driving wheel DTR. As a result, the driving wheel DTR can be driven. When so much driving force is not required (e.g., when running is performed at a given speed), and in other cases, the engine ENG is stopped, and only the motor MOT can drive the driving wheel DTR. Further, in the case of a hybrid car, in addition to the motor MOT, the engine ENG is also required. However, in the case of an electric car not having an engine, the engine ENG can be omitted.

To the inverter INV, there is also coupled a control part (controller) CTC, so that the control part CTC controls the inverter INV. Namely, a DC voltage (DC electric power) is supplied from the power supply BAT to the inverter INV, and is converted to an AC voltage (AC electric power) by the inverter INV controlled by the control part CTC, which is supplied to the motor MOT. As a result, the motor MOT can be driven. The control part CTC is formed of, for example, an ECU (Electronic Control Unit), and includes therein a control semiconductor chip such as a MCU (Micro Controller Unit). The relay RY and the converter CNV can also be controlled by the control part CTC.

The inverter INV has six IGBTs 10 and six diodes (free wheel diodes) 11 in correspondence with the three phases. Each IGBT 10 is formed of the semiconductor device (semiconductor chip) CP. Namely, the inverter INV of FIG. 28 includes six semiconductor devices CP. One semiconductor device CP forms one IGBT 10. Whereas, when the semiconductor device PKG includes one semiconductor device (semiconductor chip) CP, the inverter INV of FIG. 28 includes six semiconductor devices PKG, and one semiconductor device PKG forms one IGBT 10. The reason why the inverter INV includes a total of six pairs of the IGBTs 10 and the diodes 11 is that the motor MOT is a three-phase motor. When the motor MOT is a two-phase motor, the inverter INV includes a total of four pairs of the IGBTs 10 and the diodes 11.

Namely, in each phase of the three phases, between the power supply potential (VCC) supplied from the power supply BAT via the converter CNV to the inverter INV, and the input potential of the motor MOT, the IGBTs 10 and the diodes 11 are coupled in antiparallel with each other. Also between the input potential of the motor MOT and the ground potential (GND), the IGBTs 10 and the diodes 11 are coupled in antiparallel with each other. Namely, in each phase, there are provided two IGBTs 10 and two diodes 11. For the three phases, there are provided a total of six IGBTs 10 and six diodes 11. Then, to the gate electrode of each individual IGBT 10, there is coupled the control part CTC. The control part CTC controls the IGBT 10.

By controlling the current flowing through the IGBT 10 by the control part CTC, the motor MOT is driven (rotated).

Namely, by controlling ON/OFF of the IGBT 10 by the control part CTC, it is possible to drive the motor MOT. When the motor MOT is driven in this manner, the IGBTs 10 are required to be turned ON/OFF. However, the motor MOT includes an inductance. Therefore, when the IGBT 10 is turned off, the inductance included in the motor MOT generates a reverse current in the opposite direction to the direction in which the current of the IGBT 10 flows. The IGBT 10 does not have a function of passing the reverse current. For this reason, a diode 11 is provided in antiparallel with the IGBT 10, thereby to return the reverse current. Thus, the energy accumulated in the inductance is released.

Thus, the electronic system or the electronic device of the present embodiment has the semiconductor device PKG individually electrically coupled to a power supply (herein, the power supply BAT) and a load (herein, the motor MOT), and for driving the load, and a control part (herein, the control part CTC) for controlling the semiconductor device PKG.

<Regarding Study Example>

Then, a description will be given to a semiconductor device of a study example studied by the present inventors.

Figure 29:
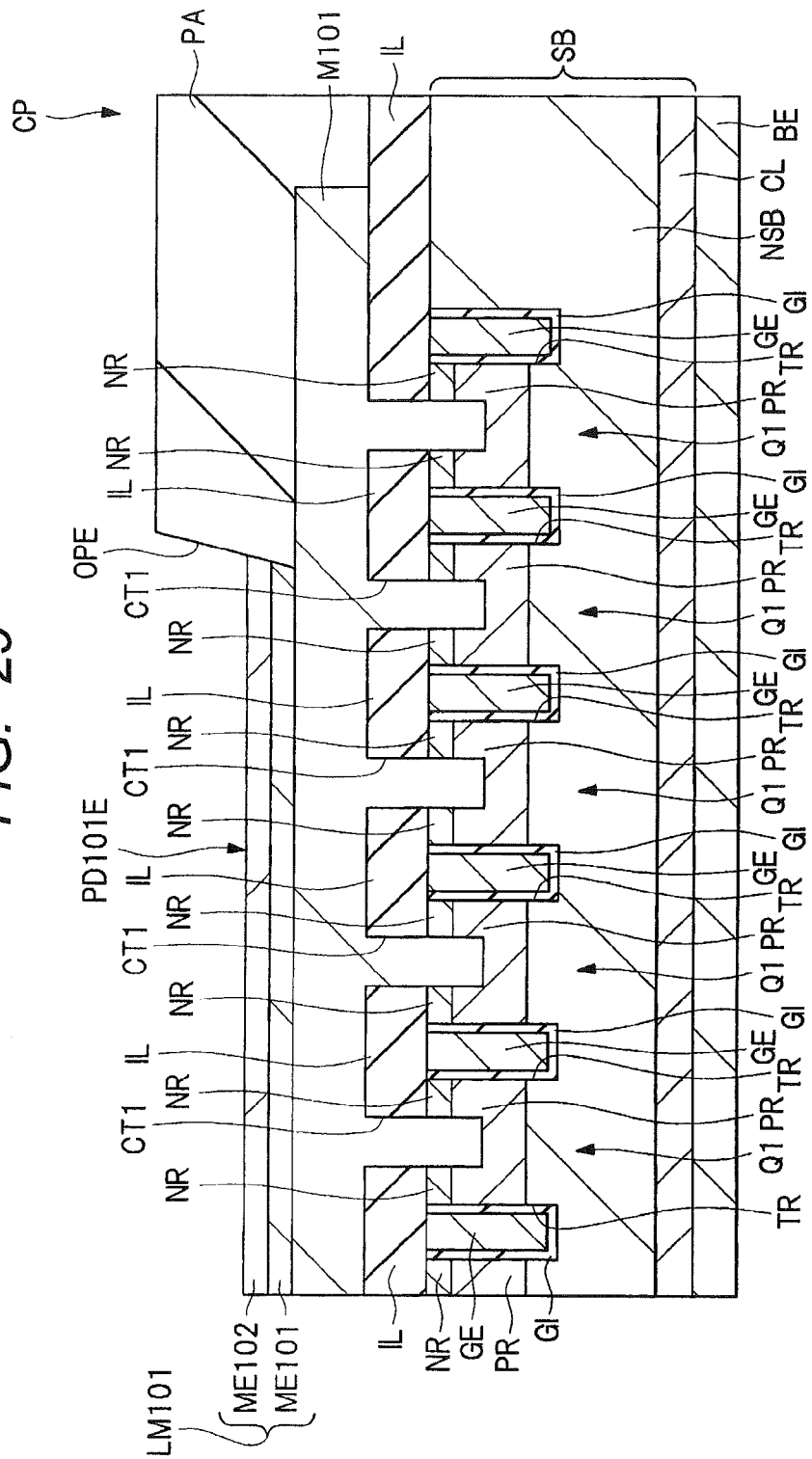
FIG. 29 is an essential part cross sectional view of a semiconductor device of a study example.

FIG. 29 is an essential part cross sectional view of a semiconductor device of the study example studied by the present inventors, and corresponds to FIG. 12.

The semiconductor device of the study example shown in FIG. 29 is also the same as the semiconductor device CP of the present embodiment in configuration of the unit transistor cell Q1 formed in the semiconductor substrate SB. For this reason, the semiconductor device of a comparative example shown in FIG. 29 is also a semiconductor device including an IGBT formed as a power transistor therein. The emitter wire M101 is exposed from an opening OPE in an insulation film PA, resulting in the formation of an emitter pad PD101E which is a bonding pad for an emitter.

Herein, the emitter wire M101 corresponds to the emitter wire M1E of the present embodiment. The emitter pad PD101E corresponds to the emitter pad PDE of the present embodiment. However, the emitter wire M101 in the study example shown in FIG. 29 is different in configuration form the emitter wire M1E in the present embodiment. Therefore, the emitter pad PD101E in the study example shown in FIG. 29 is also different in configuration from the emitter pad PDE in the present embodiment.

Namely, in the semiconductor device of the study example shown in FIG. 29, the emitter wire M101 is formed of a monolayer of an aluminum film. An aluminum alloy film can also be used in place of the aluminum film. Incidentally, in the case of the semiconductor device of the study example shown in FIG. 29, as with the emitter wire M101, the gate wire (the equivalent of the gate wire M1G of the present embodiment) is also formed of a monolayer of an aluminum film.

Then, in the semiconductor device of the study example shown in FIG. 29, over the emitter wire M101 exposed from the opening OPE in the insulation film PA, there is formed a lamination film (lamination metal film) LM101 of a nickel (Ni) layer ME101, and a gold (Au) layer ME102 over the nickel layer. The nickel layer ME101 is a nickel-plated layer, and the gold layer ME102 is a gold-plated layer.

Accordingly, in the semiconductor device of the study example shown in FIG. 29, the emitter pad PD101E is formed of the emitter wire M101 formed of a monolayer of an aluminum film (or an aluminum alloy film), and the lamination film LM101 formed over the emitter wire M101 at a portion thereof exposed from the opening OPE in the insulation film PA. The lamination film LM101 is formed of a lamination film of the nickel layer ME101, and the gold layer ME102 over the nickel layer ME101.

The nickel layer ME101 has a function as a barrier layer of, when the emitter pad PD101E is subjected to solder coupling, preventing the solder components from being diffused toward the emitter wire M101 side, and further also has a function of ensuring the solder bonding strength. The gold layer ME102 is provided in order to prevent the oxidation of the nickel layer ME101, and further, to improve the wettability of the solder. Performing solder coupling to the emitter pad PD101E adapts to, for example, the case where the equivalent of the metal plate MP is bonded via a solder to the emitter pad PD101E. The solder corresponds to the solder SD101 of FIG. 30.

Figure 30:
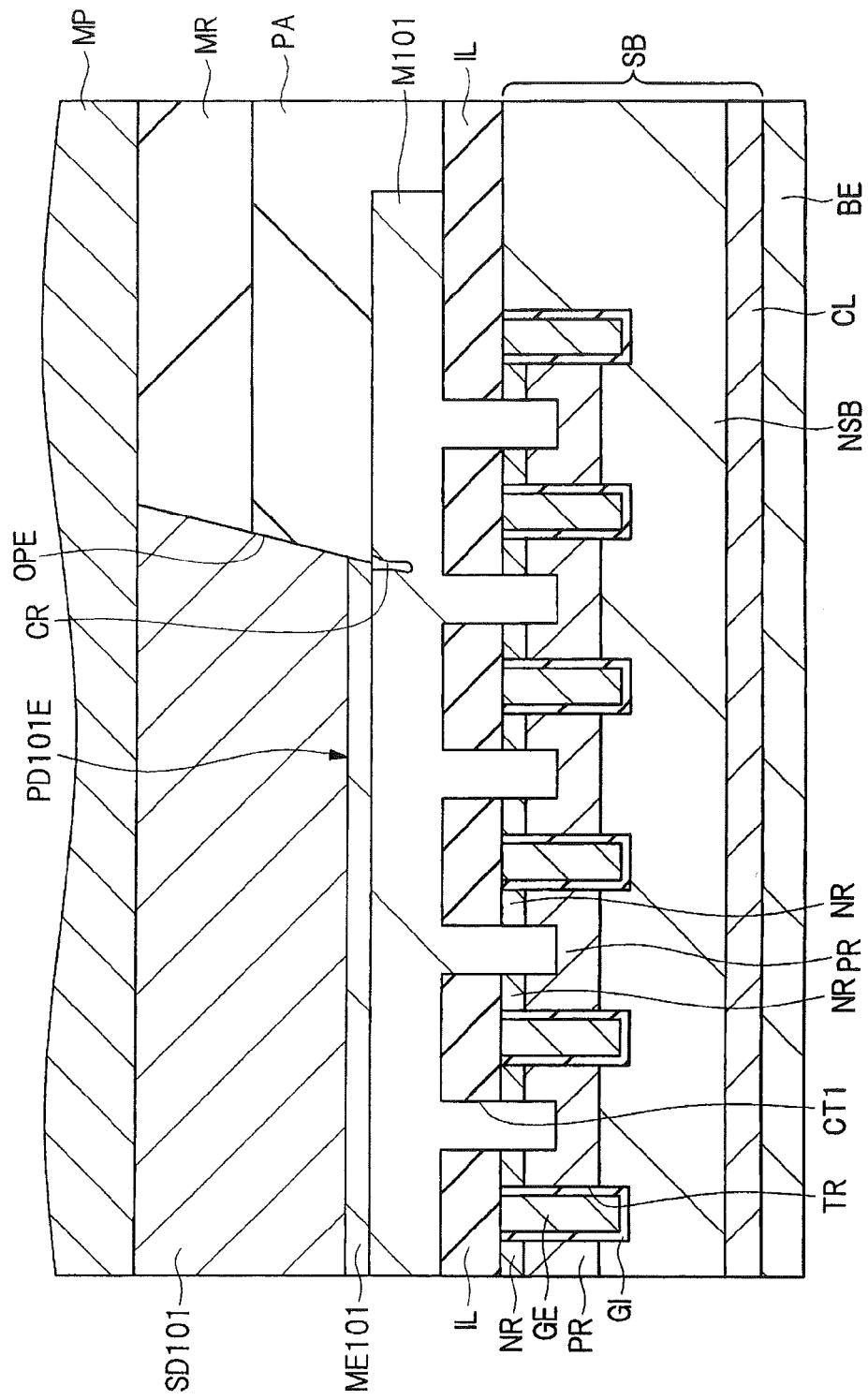
FIG. 30 is an essential part cross sectional view of a semiconductor device of a study example.

The semiconductor device of the study example shown in FIG. 29 is a semiconductor chip before packaging. FIG. 30 shows a cross sectional view of the semiconductor device of the study example shown in FIG. 29 as packaged, and corresponds to FIG. 14.

The semiconductor device (semiconductor chip) of the study example shown in FIG. 29 is packaged. Then, as shown in FIG. 30, the equivalent of the metal plate MP is bonded via the solder SD101 to the emitter pad PD101E. At this step, the gold layer ME102 which has formed the outermost surface layer of the emitter pad PD101E reacts with the solder SD101, and is incorporated into the solder SD101 to be alloyed. From another viewpoint, the gold layer ME102 which has formed the outermost surface layer of the emitter pad PD101E is rendered in a solder-mixed state. Accordingly, in FIG. 30, the outermost surface layer of the emitter pad PD101E is not the gold layer ME102, but is the nickel layer ME101.

For packaging the semiconductor chip, a conductive member such as the metal plate MP is solder coupled to the emitter pad PD101E. During the solder coupling, the emitter pad PD101E, and the solder SD101 in a molten state are at high temperatures, but are then reduced in temperature. When the temperatures become lower than the melting point of the solder SD101, the solder SD101 is cured. The temperatures further decrease, and the temperatures of the emitter pad PD101E and the solder SD101 decrease to room temperature. The material of each metal layer forming the emitter pad PD101E has a positive thermal expansion coefficient. For this reason, with a decrease in temperature after solder coupling to the emitter pad PD101E, each metal layer forming the emitter pad PD101E will shrink.

FIG. 31 is a table showing the thermal expansion coefficients and the elastic moduli of various materials. As shown in the table of FIG. 31, the comparison among the thermal expansion coefficients of various materials indicates that the thermal expansion coefficient of aluminum (Al) is larger than the thermal expansion coefficient of nickel (Ni) and the thermal expansion coefficient of silicon (Si). Accordingly, as compared in terms of thermal expansion coefficient, the thermal expansion coefficient of the emitter wire M101 formed of an aluminum film or an aluminum alloy film is larger than the thermal expansion coefficient of the nickel layer ME101, and further, larger than the thermal expansion coefficient of the semiconductor substrate SB. On the other hand, as compared in terms of elastic modulus, the elastic modulus of aluminum (Al) is smaller than the elastic modulus of nickel (Ni) and the elastic modulus of silicon (Si). Accordingly, the elastic modulus of the emitter wire M101 formed of an aluminum film or an aluminum alloy film is smaller than the elastic modulus of the nickel layer ME101, and further, smaller than the elastic modulus of the semiconductor substrate SB.

For this reason, with a decrease in temperature after performing solder coupling to the emitter pad PD101E, the emitter wire M101 relatively larger in thermal expansion coefficient than the nickel layer ME101 and the semiconductor substrate SB will shrink with respect to the nickel layer ME101 and the semiconductor substrate SB. However, the nickel layer ME101 and the semiconductor substrate SB are larger in elastic modulus than the emitter wire M101 formed of an aluminum film or an aluminum alloy film. Accordingly, a tensile stress is caused in the emitter wire M101 formed of an aluminum film or an aluminum alloy film. The tensile stress caused in the emitter wire M101 tends to be concentrated to a position immediately under the outer circumference (side surface) of the nickel layer ME101 (thus, a position immediately under the sidewall of the opening OPE in the insulation film PA). This is due to the following: the nickel layer ME101 bonded with the solder SD101 and having a large elastic modulus is less likely to be deformed; thus, while the aluminum film (wire M101) at a portion thereof covered with the nickel layer ME101 is fixed to the nickel layer ME101, the aluminum film (wire M101) at a portion thereof not covered with the nickel layer ME101 will shrink with respect to the nickel layer ME101. For this reason, the tensile stress caused in the aluminum film (wire M101) becomes more likely to be concentrated to the vicinity of the boundary between the aluminum film (wire M101) at a portion thereof covered with the nickel layer ME101 and the aluminum film (wire M101) at a portion thereof not covered with the nickel layer ME101.

Accordingly, as shown in FIG. 30, the emitter pad PD101E is bonded with a conductive member such as the metal plate MP via the solder SD101. This results in a state in which under room temperature environment, a strong tensile stress is caused in the emitter wire M101 formed of an aluminum film or an aluminum alloy film. Then, when a thermal cycle (temperature cycle) is generated in the semiconductor device, the tensile stress generated in the emitter wire M101 is relieved with an increase in temperature. On the other hand, with a decrease in temperature, the tensile stress generated in the emitter wire M101 increases as it was. Accordingly, when a thermal cycle is generated in the semiconductor device, a strong load (stress or burden) caused by a tensile stress is applied to the emitter wire M101. As schematically shown in FIG. 30, a crack CR may be caused in the emitter wire M101. The crack CR in the emitter wire M101 tends to be caused at a position at which a tensile stress particularly tends to be concentrated, namely, a position immediately under the outer circumference (side surface) of the nickel layer ME101 (accordingly, a position immediately under the sidewall of the opening OPE in the insulation film PA).

Particularly, in the case of a semiconductor chip including a power semiconductor element (herein, an IGBT) formed therein, the current to be passed therethrough is large. Accordingly, the heat value is large, so that the temperature rise during heat generation is large. For this reason, a relatively larger thermal cycle is caused, so that the crack CR becomes more likely to be caused in the emitter wire M101. Whereas, in the case of an on-board semiconductor device, particularly in the case of a semiconductor device for use in an on-board inverter (corresponding to the inverter INV), the number of generated thermal cycles is large. Accordingly, the crack CR becomes more likely to be caused in the emitter wire M101. Whereas, in the case of the pad (PD101E) to which the metal plate (MP) is coupled via the solder (SD101), the plane area necessarily increases. When the pad area is large, the area of the nickel layer ME101E also increases. This also leads to the following: in association with a thermal cycle, the crack CR becomes more likely to be caused immediately under the outer circumference of the nickel layer ME101.

The formation of the crack CR in the pad conductive film pattern (herein, the emitter wire M101) leads to a reduction of the reliability of the semiconductor device, and hence is desirably minimized.

<Regarding Main Features and Effects>

A semiconductor device CP (CP1) of the present embodiment has a semiconductor substrate SB, an insulation film IL (interlayer insulation film) formed over the main surface of a semiconductor substrate SB, and a conductive film pattern for a coupling terminal formed over the insulation film IL. The conductive film pattern for a coupling terminal (i.e., for a pad) herein corresponds to the wire M1. The semiconductor device CP (CP1) of the present embodiment further has, over the insulation film IL, an insulation film PA formed in such a manner as to cover the wire M1, an opening OP (an opening for a coupling terminal) formed in the insulation film PA, and for exposing a part of the wire M1, and a nickel layer ME1 formed over the wire M1 at a portion thereof exposed from opening OP.

One of the main features of the present embodiment resides in that the wire M1 which is a conductive film pattern for a coupling terminal (i.e., for a pad) is formed of a lamination film having a main conductor film MC (first conductor film) containing aluminum (Al) as a main component, and a conductor film BR (second conductor film) formed over the entire top surface of the main conductor film MC. Another of the main features of the present embodiment resides in that the conductor film. BR is formed of a titanium (Ti) film, a tungsten (W) film, or a titanium tungsten (TiW) film.

Namely, in the present embodiment, over the entire top surface of the main conductor film MC containing aluminum (Al) as a main component, there is formed the conductor film BR formed of a titanium (Ti) film, a tungsten (W) film, or a titanium tungsten (TiW) film. Over the conductor film BR at a portion thereof exposed from the opening OP, there is formed a nickel (Ni) layer ME1. Accordingly, the conductor film BR is interposed between the the top surface of the main conductor film MC and the nickel layer ME1, and between the top surface of the main conductor film MC and the insulation film PA.

Titanium (Ti), tungsten (W), and titanium tungsten (TiW) are all smaller in thermal expansion coefficient than aluminum (Al), and is larger in elastic modulus than aluminum (Al). For this reason, the conductor film BR formed of a titanium film, a tungsten film, or a titanium tungsten film is smaller in thermal expansion coefficient and larger in elastic modulus than the main conductor film MC containing aluminum (Al) as a main component. For this reason, in the present embodiment, in the wire M1, over the entire top surface of the main conductor film MC containing aluminum (Al) as a main component, there is formed the conductor film BR smaller in thermal expansion coefficient and larger in elastic modulus than the main conductor film MC. The nickel layer ME1 is formed over the wire M1 at a portion thereof exposed from the opening OP. Accordingly, over the conductor film BR at a portion thereof exposed from the opening OP, there is formed the nickel layer ME1.

In the case of the study example shown in FIGS. 29 and 30, the equivalent of the conductor film BR is not formed. Over the aluminum film (wire M101), the nickel layer ME101 is locally and directly formed. Then, as compared with the nickel layer ME101, the thermal expansion coefficient of the aluminum film is considerably larger, and the elastic modulus of the aluminum film is considerably smaller. Accordingly, upon generation of a thermal cycle, a stress (load or burden) is concentrated to the vicinity of the boundary between the aluminum film at a portion thereof covered with the nickel layer ME101, and the aluminum film at a portion thereof not covered with the nickel layer ME101. As a result, the crack CR is caused.

In contrast, in the present embodiment, in the wire M1, over the entire top surface of the main conductor film MC containing aluminum (Al) as a main component, there is formed the conductor film BR formed of a titanium film, a tungsten film, or a titanium tungsten film. Over the conductor film BR, the nickel layer ME1 is locally formed. As a result, it is possible to inhibit or prevent a crack equivalent to the crack CR from being caused in the wire M1. The reason for this is as follows.

Namely, the conductor film. BR formed of a titanium film, a tungsten film, or a titanium tungsten film is smaller in thermal expansion coefficient, and larger in elastic modulus than the main conductor film MC containing aluminum (Al) as a main component. For this reason, even when the nickel layer ME1 is locally formed over the conductor film BR at a portion thereof exposed from the opening OP, in the vicinity of the boundary between the conductor film BR at a portion thereof covered with the nickel layer ME1 and the conductor film BR at a portion thereof not covered with the nickel layer ME1, a stress is not so concentrated, so that a crack is less likely to be caused in the conductor film. BR. This is due to the following: the thermal expansion coefficient of the conductor film BR is smaller than the thermal expansion coefficient of the main conductor film MC; accordingly, upon occurrence of a thermal cycle, the conductor film BR is less likely to expand or shrink as compared with the main conductor film MC; thus, even when the conductor film BR at a portion thereof covered with the nickel layer ME1 is fixed to the nickel layer ME1 bonded with the solder SD, the expansion/shrinkage amount or the deformation amount of the conductor film BR at a portion thereof not covered with the nickel layer ME1 is small. Accordingly, the load (stress or burden) caused at a position immediately under the outer circumference (side surface) of the nickel layer ME1 in association with the thermal cycle in the conductor film BR is smaller than the load (stress or burden) caused at a position immediately under the outer circumference (side surface) of the nickel layer ME1 in association with the thermal cycle in the aluminum film (wire M101) in the case of the study example of FIGS. 29 and 30. Therefore, even when a thermal cycle is caused, in the conductor film BR, a crack equivalent to the crack CR is less likely to be caused.

Then, in the wire M1, the conductor film BR is formed over the entire top surface of the main conductor film MC. As compared with the material forming the nickel layer ME1 and the material forming the conductor film BR, the material forming the main conductor film MC is larger in thermal expansion coefficient, and smaller in elastic modulus, and hence is a material which tends to expand or shrink, or to be deformed in association with a thermal cycle. However, over the entire top surface of the main conductor film MC, there is formed the conductor film BR smaller in thermal expansion coefficient, and larger in elastic modulus than the main conductor film MC. The conductor film BR smaller in thermal expansion coefficient, and larger in elastic modulus than the main conductor film MC is less likely to expand or shrink, or to be deformed in association with a thermal cycle than the main conductor film MC. The conductor film BR is formed over the entire top surface of the main conductor film MC, so that the whole main conductor film MC is fixed by the conductor film BR. As a result, the main conductor film MC can also be prevented from expanding or shrinking, or from being deformed in association with a thermal cycle. This can prevent the load (stress or burden) in association with a thermal cycle from being concentrated to a specific position of the main conductor film MC. Further, this can also suppress the magnitude itself of the load (stress or burden) in association with a thermal cycle in the main conductor film MC. Therefore, even when a thermal cycle is caused, it is possible to suppress or prevent a crack equivalent to the crack CR from being caused not only in the conductor film BR but also in the main conductor film MC.

Thus, in the present embodiment, in the wire M1, over the entire top surface of the main conductor film MC containing aluminum (Al) as a main component, there is formed the conductor film BR formed of a titanium film, a tungsten film, or a titanium tungsten film, and the nickel layer ME1 is formed over the conductor film BR. As a result, it is possible to suppress or prevent a crack equivalent to the crack CR from being caused in the wire M1. Therefore, it is possible to improve the reliability of the semiconductor device (the semiconductor device CP and the semiconductor device PKG using the same).

In other words, in the case of the study example of FIGS. 29 and 30, over the aluminum film (wire M101) large in thermal expansion coefficient and small in elastic modulus, the nickel layer ME101 is formed directly and locally. For this reason, the load (stress or burden) in association with a thermal cycle in the aluminum film (wire M101) is concentrated to a position immediately under the outer circumference (side surface) of the nickel layer ME101. As a result, the crack CR is caused therein. In contrast, in the present embodiment, over the entire top surface of the main conductor film MC large in thermal expansion coefficient and small in elastic modulus, there is formed the conductor film BR. This can suppress the expansion or shrinkage or deformation of the main conductor film MC in association with a thermal cycle. Whereas, by forming the nickel layer ME1 over the conductor film BR, it is possible to suppress the load caused at a position immediately under the outer circumference of the nickel layer ME1 in association with a thermal cycle. Therefore, it is possible to suppress or prevent the equivalent of the crack CR from being caused.

Further, as distinct from the present embodiment, the following case can also be considered: not that the conductor film BR is formed over the entire top surface of the main conductor film MC, but that the conductor film BR is locally formed over the main conductor film MC at a portion thereof exposed from the opening OP. In this case, over the main conductor film MC at a portion thereof exposed from the opening OP, there is formed the conductor film BR. However, over the main conductor film MC at a portion thereof covered with the insulation film PA, there is not formed the conductor film BR. In this case, even when the conductor film BR is provided, the effect of preventing the equivalent of the crack CR from being caused cannot be expected. In the main conductor film MC, at a position immediately under the outer circumference (side surface) of the conductor film BR (accordingly, a position immediately under the sidewall of the opening OP in the insulation film PA), the load (stress or burden) in association with a thermal cycle is concentrated. This may cause crack formation. This is due to the following: the conductor film BR smaller in thermal expansion coefficient, and larger in elastic modulus than the main conductor film MC is less likely to be deformed than the main conductor film MC. For this reason, upon generation of a thermal cycle, the main conductor film MC at a portion thereof covered with the conductor film BR is fixed to the conductor film BR. However, the main conductor film MC at a portion thereof not covered with the conductor film BR will expand or shrink with respect to the conductor film BR. For this reason, in the main conductor film MC, the load (stress or burden) in association with a thermal cycle is concentrated to the vicinity of the boundary between the main conductor film MC at a portion thereof covered with the conductor film BR and the main conductor film MC at a portion thereof not covered with the conductor film BR. This may cause the occurrence of a crack.

Further, after forming the opening OP, and exposing a part of the wire M1 therefrom, the nickel layer ME1 is formed over the wire M1 at a portion thereof exposed from the opening OP. However, as distinct from the present embodiment, the following can also be considered: after removing the conductor film BR at a portion thereof exposed from the opening OP, the nickel layer ME1 is formed. In this case, over the main conductor film MC at a portion thereof covered with the insulation film PA, there is formed the conductor film BR. However, over the main conductor film MC at a portion thereof exposed from the opening OP, there is not formed the conductor film BR. Over the main conductor film MC at a portion thereof exposed from the opening OP, there is directly formed the nickel layer ME1. In this case, even when the conductor film BR is provided, the effect of preventing the formation of the equivalent of the crack CR cannot be expected. In the main conductor film MC, the load (stress or burden) in association with a thermal cycle is concentrated to a position immediately under the outer circumference (side surface) of the nickel layer ME1 (accordingly, a position immediately under the sidewall of the opening OP in the insulation film PA). This may cause crack formation. This is due to the following: the nickel layer ME1 and the conductor film BR are different in thermal expansion coefficient from each other; accordingly, in the main conductor film MC, the load (stress or burden) in association with a thermal cycle is concentrated to the vicinity of the boundary between the main conductor film MC at a portion thereof covered with the nickel layer ME1 and the main conductor film MC at a portion thereof covered with the conductor film BR. This may cause crack formation.

In contrast, in the present embodiment, in the wire M1, the conductor film BR is formed over the entire top surface of the main conductor film MC. Namely, in the present embodiment, the conductor film BR is not locally formed over the main conductor film MC at a portion thereof exposed from the opening OP, but is formed over the entire top surface of the main conductor film MC. Accordingly, even when a thermal cycle is caused, the conductor film. BR covering the main conductor film MC acts in such a manner as to fix the whole main conductor film MC. For this reason, it is possible to suppress the expansion and shrinkage, or the deformation of the main conductor film MC in association with a thermal cycle. Therefore, it is possible to prevent the load (stress or burden) in association with a thermal cycle from being concentrated to a specific position of the main conductor film MC. Further, it is also suppress the magnitude itself of the load in association with a thermal cycle in the main conductor film MC. For this reason, it is possible to suppress or prevent the formation of a crack equivalent of the crack CR.

Further, as distinct from the present embodiment, the following can also be considered: as the material for the conductor film BR, there is used a material larger in thermal expansion coefficient than the material for the main conductor film MC. However, in this case, the expansion or shrinkage or the deformation of the conductor film BR in association with a thermal cycle is large. For this reason, the effect of preventing a crack in association with a thermal crack due to the provision of the conductor film BR cannot be expected. Alternatively, the following can also be considered: as the material for the conductor film BR, there is used a material smaller in elastic modulus than the material for the main conductor film MC. However, in this case, when a thermal cycle is caused, the conductor film BR cannot fix the main conductor film MC. This results in that in accordance with expansion or shrinkage of the main conductor film MC, the conductor film BR also expands or shrink. For this reason, the effect of preventing a crack in association with a thermal crack resulting from the provision of the conductor film BR cannot be expected.

In contrast, in the present embodiment, as the conductor film BR, there is adopted a titanium (Ti) film, a tungsten (W) film, or a titanium tungsten (TiW) film. Titanium (Ti), tungsten (W), and titanium tungsten (TiW) are all smaller in thermal expansion coefficient, and larger in elastic modulus than aluminum (Al). For this reason, a titanium (Ti) film, a tungsten (W) film, and a titanium tungsten (TiW) film are each suitable as the conductor film BR, and can precisely provide the effect of preventing a crack in association with a thermal crack resulting from the provision of the conductor film BR. Further, in the present embodiment, as the conductor film BR, there is used a titanium (Ti) film, a tungsten (W) film, or a titanium tungsten (TiW) film. Particularly preferable is a titanium (Ti) film. By using a titanium (Ti) film as the conductor film. BR, it is possible to most precisely obtain the effect of preventing a crack in association with a thermal crack resulting from the provision of the conductor film BR.

The material for the conductor film BR is required to be selected so as to achieve the following: the entire top surface of the main conductor film MC containing aluminum as a main component is covered with the conductor film BR, which can prevent a crack in the main conductor film MC in association with the thermal cycle; in addition, even when the nickel layer ME1 is locally provided over the top surface of the conductor film BR, a crack in association with a thermal cycle becomes less likely to be caused in the conductor film BR. From this viewpoint, as the conductor film BR, a titanium (Ti) film, a tungsten (W) film, or a titanium tungsten (TiW) film is preferable, and a titanium (Ti) film is most preferable.

Further, the conductor film BR is more preferably a monolayer (monolayer film) formed of one film. However, as another form, the conductor film BR can also be a lamination film of a plurality of stacked films. Incidentally, when the conductor film BR is formed of a lamination film, each of the plurality of films forming the lamination film is formed of any of a titanium (Ti) film, a tungsten (W) film, or a titanium tungsten (TiW) film. As one example, a lamination film of a titanium tungsten (TiW) film and a titanium (Ti) film can also form the conductor film. BR. However, for enhancing the effect of preventing a crack in association with a thermal crack resulting from the provision of the conductor film BR, it is more advantageous to adopt a monolayer (monolayer film) than to adopt a lamination film of a plurality of stacked films different in material from one another (accordingly, a plurality of films having mutually different thermal expansion coefficients) as the conductor film BR. For this reason, the conductor film BR is more preferably a monolayer (monolayer film) formed of anyone film of a titanium (Ti) film, a tungsten (W) film, or a titanium tungsten (TiW) film. Further, when the conductor film BR is formed of a lamination film, an increase in number of steps or an increase in manufacturing time is caused. For this reason, also from this viewpoint, the conductor film BR is more preferably a monolayer.

Further, in order to reduce the resistance of the wire M1, the thickness of the main conductor film MC is preferably larger than the thickness of the conductor film BR. Further, the resistivity (specific resistance) of the main conductor film MC is preferably lower than the resistivity of the conductor film BR.

When the conductor film BR is made too thin, the effect of being capable of suppressing or preventing a crack from being caused in the main conductor film MC by the provision of the conductor film BR is reduced. From this viewpoint, the thickness of the conductor film BR is preferably 100 nm or more. As a result, the provision of the conductor film BR can precisely suppress or prevent a crack from being caused in the main conductor film MC.

Further, a too large thickness of the conductor film BR is disadvantageous for reducing the resistance of the wire M1. From this viewpoint, the thickness of the conductor film. BR is more preferably 500 nm or less. This is advantageous for reducing the resistance of the wire M1. Therefore, the thickness of the conductor film. BR is in particular preferably 100 to 500 nm.

Whereas, in the case of a power semiconductor device through which a large current flows (i.e., a semiconductor device including a power semiconductor element such as an IGBT formed therein), the current flowing therethrough is large. Accordingly, the temperature rise upon flowing of a current is large, and hence the magnitude of the thermal cycle (the temperature difference between at high temperatures and at low temperatures) is large. For this reason, in the case of a power semiconductor device, the equivalent of the crack CR becomes more likely to be caused in association with a thermal cycle. In contrast, in the present embodiment, the equivalent of the crack CR can be suppressed or prevented from being caused. For this reason, application of the present embodiment to a power semiconductor device through which a large current flows produces a large effect. The same also applies to the following Second and Third Embodiments.

Namely, the following problem has been found: in a power semiconductor device through which a large current flows, the magnitude of the thermal cycle is large; further, the thermal cycle is repeatedly caused, so that the equivalent of the crack CR is caused. Precisely for this reason, the present inventors have studied the pad structure, and provides the pad structure as in the present embodiment. As a result, in the conductive film forming a pad, a crack can be suppressed or prevented from being caused in association with a thermal cycle. This can improve the reliability of the semiconductor device (the semiconductor device CP and the semiconductor device PKG using the same). The same also applies to the following Second and Third Embodiments.

Further, an on-board semiconductor device to be mounted on a car or the like is required to have a high reliability. Thus, application of the present embodiment thereto can satisfy such a high reliability. Further, it is possible to improve the yield of manufacturing of a semiconductor device satisfying such a high reliability. The same also applies to the following Second and Third Embodiments.

Second Embodiment

Figure 32:
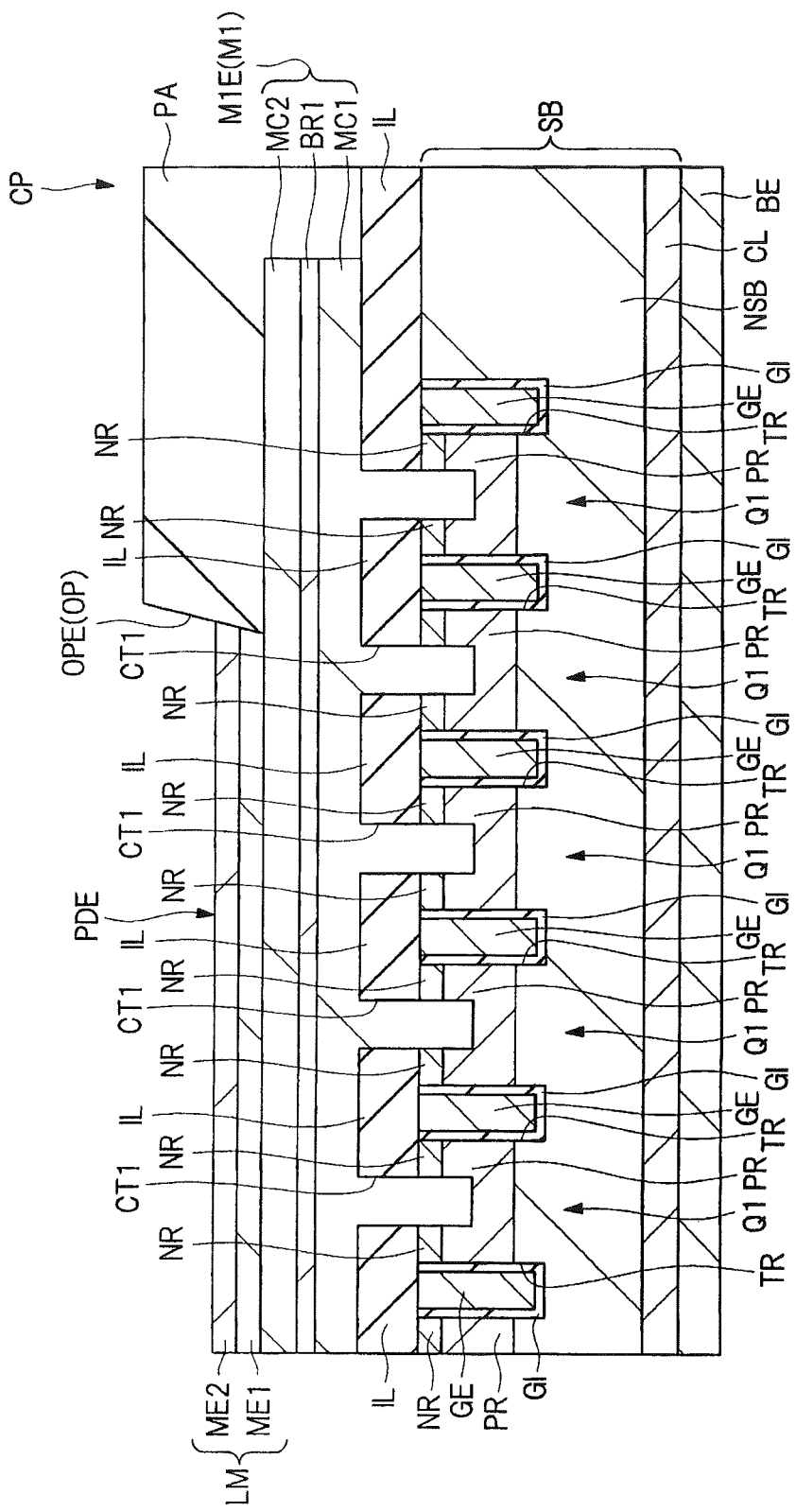
FIG. 32 is an essential part cross sectional view of a semiconductor device of another embodiment.
Figure 33:
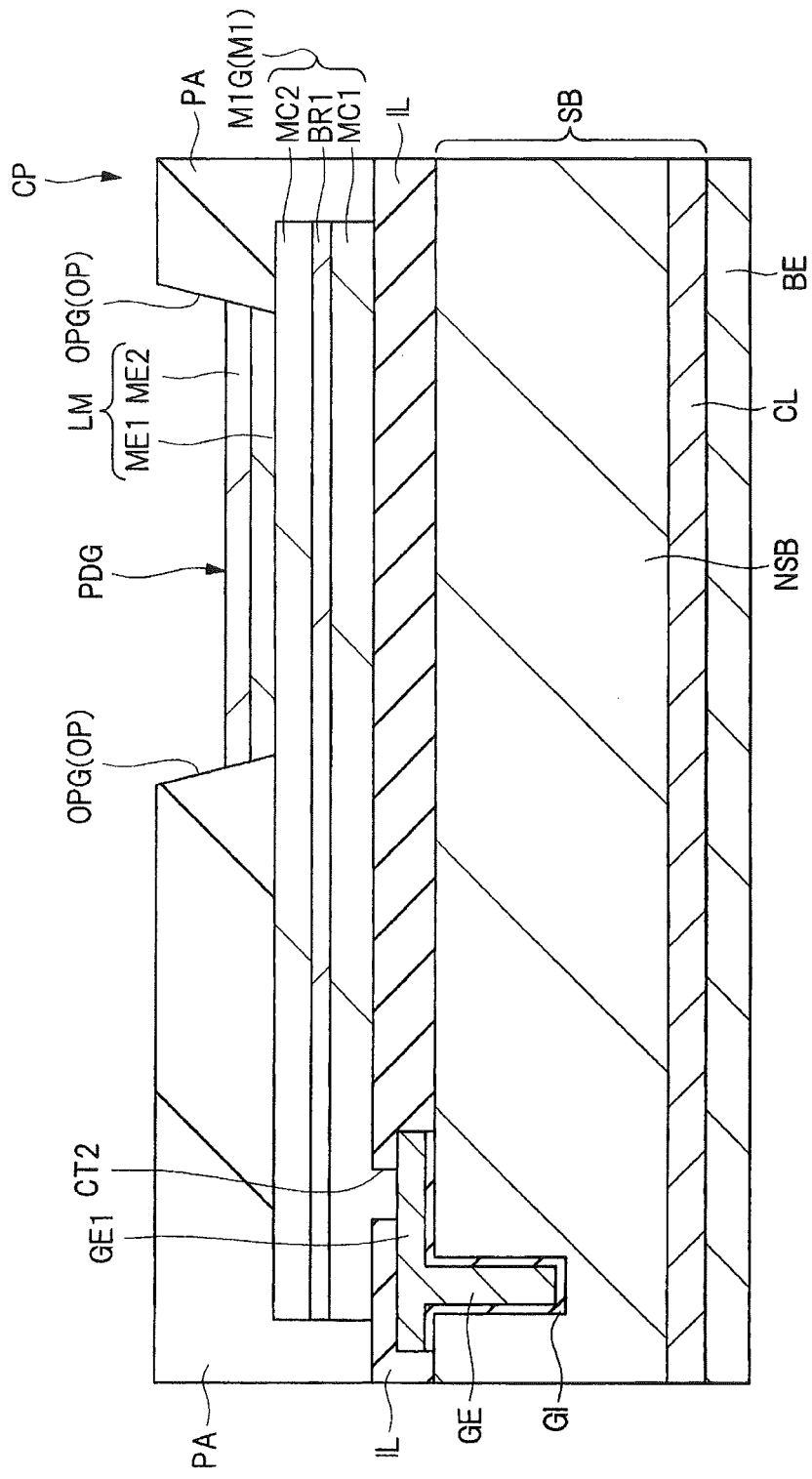
FIG. 33 is an essential part cross sectional view of the semiconductor device of the another embodiment.
Figure 34:
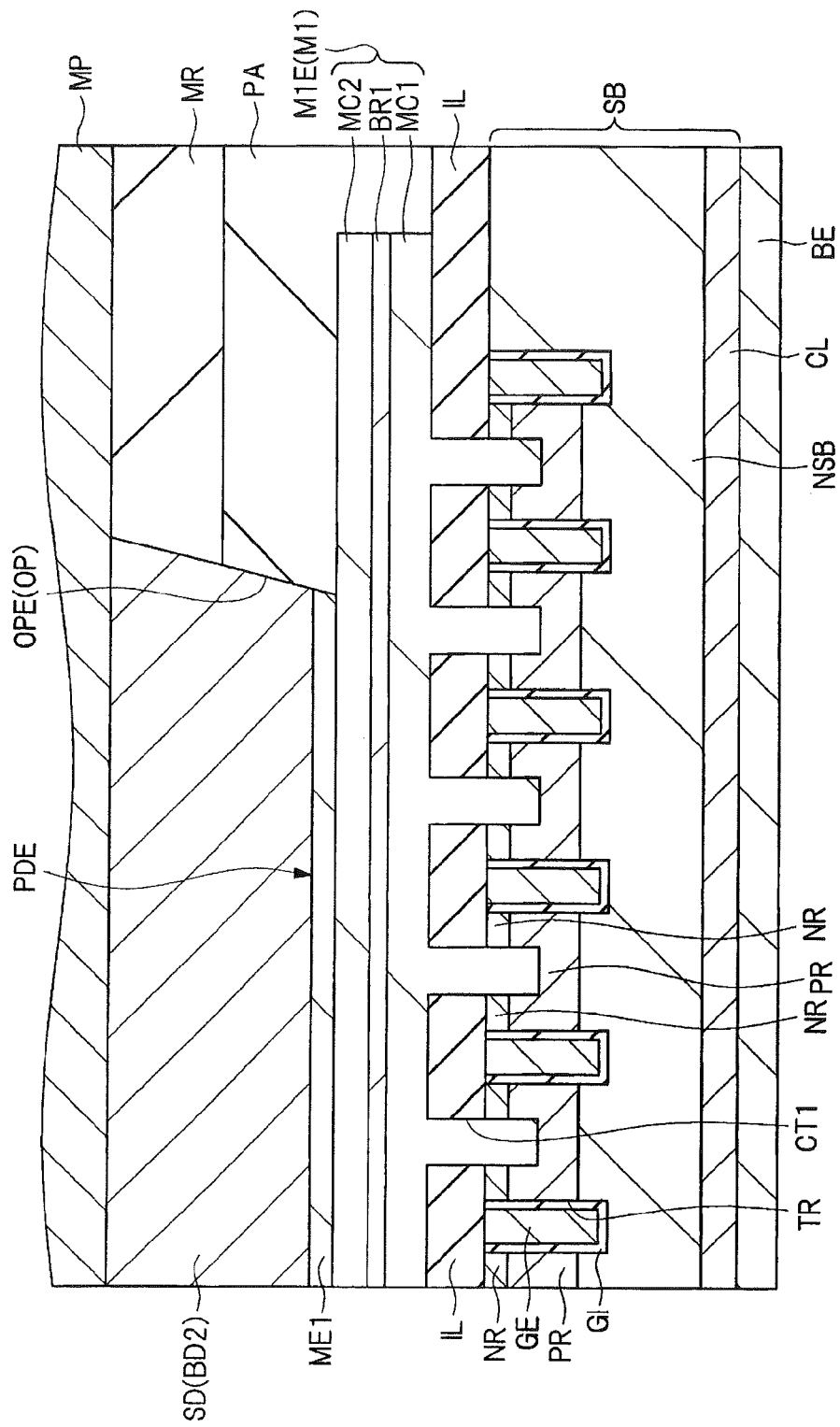
FIG. 34 is an essential part cross sectional view of the semiconductor device of the another embodiment.

FIGS. 32 and 33 are each an essential part cross sectional view of a semiconductor device (semiconductor chip) CP of the present Second Embodiment. FIG. 32 corresponds to FIG. 12 of First Embodiment. FIG. 33 corresponds to FIG. 13 of First Embodiment. FIG. 34 is an essential part cross sectional view of the semiconductor device PKG when the semiconductor device (semiconductor chip) CP of the present Second Embodiment is packaged, and corresponds to FIG. 14 of First Embodiment.

The present Second Embodiment and First Embodiment are different from each other in the lamination structure of the wire M1 in the semiconductor device CP. In other respects, the present Second Embodiment is basically the same as First Embodiment. For this reason, in the present Second Embodiment, a difference from First Embodiment will be described, and the same contents as those of First Embodiment will not be repeatedly described.

In First Embodiment, the wire M1 is formed of a lamination film of the main conductor film MC, and the conductor film BR formed over the main conductor film MC, and the main conductor film MC contains aluminum (Al) as a main component. The conductor film BR is a titanium film, a tungsten film, or a titanium tungsten film. Then, the nickel layer ME1 is formed over the conductor film BR at a portion thereof exposed from the opening OP.

On the other hand, in the present Second Embodiment, as also shown in FIGS. 32 to 34, the wire M1 is formed of a lamination film of a main conductor film (main conductor layer) MC1, a conductor film (conductor layer) BR1 formed over the main conductor film MC1, and a main conductor film (main conductor layer) MC2 formed over the conductor film BR1. In the wire M1, over the entire top surface of the main conductor film MC1, there is formed the conductor film. BR1. Over the entire top surface of the conductor film BR1, there is formed the main conductor film MC2. Accordingly, the wire M1 has a lamination structure in which the conductor film. BR1 is interposed between the main conductor film MC1 and the main conductor film MC2. Then, the nickel layer ME1 is formed over the main conductor film MC at a portion thereof exposed from the opening OP2.

The conductor film BR1 in the present Second Embodiment is basically the same as the conductor film BR1 in First Embodiment, except that they are formed at different positions. For this reason, as with the conductor film BR in First Embodiment, the conductor film BR1 in the present Second Embodiment is also formed of a titanium (Ti) film, a tungsten (W) film, or a titanium tungsten (TiW) film.

Further, in the present Second Embodiment, the main conductor film MC1 and the main conductor film MC2 both contain aluminum (Al) as a main component. Namely, the main conductor films MC1 and MC2 are each formed of a metal film containing aluminum (Al) a main component, and specifically formed of an aluminum film or an aluminum alloy film. As with the main conductor film MC of First Embodiment, each aluminum (Al) content of the main conductor films MC1 and MC2 of the present Second Embodiment is larger than 50 atomic %, and more preferably 98 atomic % or more.

When the main conductor films MC1 and MC2 contain silicon (Si), namely, as each of the main conductor films MC1 and MC2, a silicon (Si)-doped aluminum alloy film is used, the silicon (Si) forming the semiconductor substrate SB can be suppressed or prevented from penetrating into the main conductor films MC1 and MC2. For this reason, the main conductor films MC1 and MC2 each contain aluminum (Al) as a main component, and more preferably, each further contain silicon (Si). When the main conductor films MC1 and MC2 also contain silicon (Si), the content of silicon (Si) is desirably from about 0.5 atomic % to 1 atomic % or less.

However, the main conductor film MC2 is doped with copper (Cu). In contrast, the main conductor film MC1 is not doped with copper (Cu). Namely, the main conductor film MC2 contains therein copper (Cu) in an amount of about 1 atomic % (e.g., 0.5 to 1.5 atomic %). In contrast, the main conductor film MC1 is not doped with copper (Cu).

Incidentally, in FIG. 32, there is shown an emitter wire M1E formed of a lamination film of the main conductor film MC1, the conductor film BR1 over the main conductor film MC1, and the main conductor film MC2 over the conductor film BR1. As with the emitter wire M1E, as shown in FIG. 33, a gate wire M1G is also formed of a lamination film of the main conductor film MC1, the conductor film BR1 over the main conductor film MC1, and the main conductor film MC2 over the conductor film BR1.

In terms of other configurations of the semiconductor device CP, the present Second Embodiment is also the same as the semiconductor device CP of First Embodiment (FIG. 1, FIG. 2, FIG. 12, and FIG. 13). Therefore, herein, a repeated description is omitted. Further, in the semiconductor device PKG of First Embodiment, the semiconductor device CP of the present Second Embodiment can be used. In that case, the difference from the semiconductor device PKG of First Embodiment resides in that in the semiconductor chip CP1 (CP) forming the semiconductor device PKG, the wire M1 is formed of a lamination film of the main conductor film MC1, the conductor film BR1, and the main conductor film MC2. In other respects, the present Second Embodiment is basically the same as the semiconductor device PKG of First Embodiment.

Further, in the electronic system (electronic device) of FIG. 28 of First Embodiment, there can be used the semiconductor device CP of the present Second Embodiment. Alternatively, there can be used a semiconductor package (semiconductor device PKG) using the semiconductor device CP of the present Second Embodiment.

Further, in manufacturing steps of the semiconductor device CP of the present Second Embodiment, in a step corresponding to FIG. 23, over the entire main surface of the semiconductor substrate SB, namely, over the insulation film IL including the insides of the contact holes CT1 and CT2, there is formed the main conductor film MC1. Then, over the main conductor film MC1, there may be sequentially formed the conductor film BR1 and the main conductor film MC2. Thereafter, in a step corresponding to FIG. 24, the lamination film (lamination metal film) of the main conductor film MC1, the conductor film BR1, and the main conductor film MC2 is patterned using a photolithography technology and an etching technology. As a result, it is possible to form the wire M1 formed of a lamination film of the main conductor film MC1, the conductor film BR1, and the main conductor film MC2. In other respects, the manufacturing steps of the semiconductor device CP of the present Second Embodiment is basically the same as those of First Embodiment.

One of the major features of the present Second Embodiment resides in that the wire M1 which is a conductive film pattern for a coupling terminal (i.e., for a pad) is formed of a lamination film having the main conductor film MC1 containing aluminum (Al) as a main component (first conductor film), the conductor film BR1 (second conductor film) formed over the main conductor film MC1, and the main conductor film MC2 (third conductor film) formed over the conductor film BR1, and containing aluminum as a main component. Over the main conductor film MC at a portion thereof exposed from the opening OP, there is formed the nickel layer ME1. Another of the main features of the present Second Embodiment resides in that the conductor film BR1 is formed of a titanium (Ti) film, a tungsten (W) film, or a titanium tungsten (TiW) film. Still another of the main features of the present Second Embodiment resides in the following: the main conductor film MC1 is not doped with copper (Cu), and the main conductor film MC2 is doped with copper (Cu). As a result, in the present Second Embodiment, the following effects can be obtained.

When the nickel layer is formed by a plating method (more preferably, an electroless plating method), as the base film, a film containing aluminum as a main component (an aluminum film or an aluminum alloy film) is in particular preferable, and enables the formation of a nickel layer excellent in adhesion and film property. In the present Second Embodiment, over the main conductor film MC2 at a portion thereof exposed from the opening OP, there is formed the nickel layer ME1. The base of the nickel layer ME1 is the main conductor film MC2 containing aluminum as a main component. Accordingly, it is possible to form the nickel layer ME1 by a plating method (more preferably, an electroless plating method) with more precision. For this reason, it is possible to form the nickel layer ME1 excellent in adhesion and film property.

However, in the present Second Embodiment, over the main conductor film MC2 at a portion thereof exposed from the opening OP, the nickel layer ME1 is locally formed. For this reason, the tensile stress caused in the main conductor film MC2 tends to be concentrated to a position immediately under the outer circumference (side surface) of the nickel layer ME1. Namely, a tensile stress becomes more likely to be concentrated to the vicinity of the boundary between the main conductor film MC2 at a portion thereof covered with the nickel layer ME1 and the main conductor film MC2 at a portion thereof not covered with the nickel layer ME1. Accordingly, when a thermal cycle (temperature cycle) is caused in the semiconductor device, a strong load (stress or burden) caused by the tensile stress is applied to the main conductor film MC2. As a result, in the main conductor film MC2, at a position immediately under the outer circumference (side surface) of the nickel layer ME1 (thus, a position immediately under the sidewall of the opening OP), a crack (the equivalent of the crack CR) may be caused.

In contrast, in the present Second Embodiment, in the wire M1, the conductor film BR1 is interposed between the main conductor film MC1 and the main conductor film MC2. The conductor film BR1 is formed of a titanium film, a tungsten film, or a titanium tungsten film. For this reason, the thermal expansion coefficient of the conductor film BR1 is smaller than each thermal expansion coefficient of the main conductor films MC1 and MC2 each containing aluminum as a main component. Whereas, the elastic modulus of the conductor film BR1 can be set larger than each elastic modulus of the main conductor films MC1 and MC2 each containing aluminum as a main component. Therefore, even when, at a position immediately under the outer circumference of the nickel layer ME1, a crack (the equivalent of the crack CR) is caused in the main conductor film MC2 in association with a thermal cycle, the extension of the crack can be blocked by the conductor film BR1. Accordingly, by interposing the conductor film BR1 between the main conductor film MC1 and the main conductor film MC2, it is possible to suppress or prevent the crack caused in the main conductor film MC2 in association with a thermal cycle from extending to the main conductor film MC1.

Further, in the wire M1, over the entire top surface of the main conductor film MC1 containing aluminum as a main component, there is formed the conductor film BR1 formed of a titanium film, a tungsten film, or a titanium tungsten film. Accordingly, it is possible to suppress the expansion or shrinkage, or the deformation of the main conductor film MC1 in association with a thermal cycle. For this reason, it is possible to suppress or prevent a crack (the equivalent of the crack CR) from being caused in the main conductor film MC1 in association with a thermal cycle.

Further, even when a crack (the equivalent of the crack CR) is caused in the main conductor film MC2 in accordance with a thermal cycle, the provision of the conductor film BR1 can prevent a crack in the main conductor film MC1. Accordingly, the main conductor film MC1 can ensure a conduction (conductive path). As a result, it is possible to suppress an increase in resistance and a reduction of the reliability due to the formation of a crack in the main conductor film MC2.

Thus, in the wire M1, the conductor film BR1 formed of a titanium film, a tungsten film, or a titanium tungsten film is interposed between the main conductor film MC1 containing aluminum as a main component and the main conductor film MC2 containing aluminum as a main component. Accordingly, it is possible to suppress or prevent a crack from being caused in the main conductor film MC1 of the wire M1 in association with a thermal cycle. As a result, it is possible to improve the reliability of the semiconductor device (the semiconductor device CP and the semiconductor device PKG using the same).

Further, in the present Second Embodiment, in the wire M1, the main conductor film MC1 is not doped with copper (Cu), and the main conductor film MC2 is doped with copper (Cu). The reason for this is as follows.

Namely, a film (an aluminum film or an aluminum alloy film) containing aluminum as a main component can be improved in resistance against a temperature stress (thermal stress) by being doped with copper (Cu). However, copper (Cu) is an element which is more likely to be diffused than aluminum (Al). Diffusion of copper (Cu) into the interlayer insulation film or the semiconductor substrate may lead to the reduction of the reliability of the semiconductor device, and hence is desirably suppressed.

The main conductor film MC1 is formed over the interlayer insulation film (herein, the insulation film IL). Further, the main conductor film MC1 is embedded in the contact hole CT1. Thus, the main conductor film MC1 is not doped with copper (Cu). As a result, it is possible to prevent copper (Cu) from being diffused from the main conductor film MC1 into the interlayer insulation film (herein, corresponding to the insulation film IL) or the semiconductor substrate SB. Accordingly, it is possible to suppress or prevent copper (Cu) from being diffused into the interlayer insulation film (herein, corresponding to the insulation film IL) or the semiconductor substrate SB.

On the other hand, the main conductor film MC2 is separated from the interlayer insulation film (herein, the insulation film IL) and the semiconductor substrate SB by the conductor film BR1 and the main conductor film MC1. Accordingly, even when copper (Cu) is doped into the main conductor film MC2, the possibility that the copper (Cu) in the main conductor film MC2 is diffused into the interlayer insulation film (herein, the insulation film IL) and the semiconductor substrate SB is very small. For this reason, by doping the main conductor film MC2 with copper (Cu), it is possible to improve the resistance against the the temperature stress (thermal stress) of the main conductor film MC2 without fearing the diffusion of copper (Cu) into the interlayer insulation film (herein, the insulation film IL) and the semiconductor substrate SB. Doping of copper (Cu) improved the resistance against the temperature stress (thermal stress) of the main conductor film MC2. As a result, it is possible to improve the reliability of the wire M1 and the pad (PDE or PDG).

Thus, in the present Second Embodiment, the main conductor film MC2 containing aluminum as a main component is doped with copper (Cu). This can improve the resistance against the temperature stress (thermal stress) of the main conductor film MC2. The main conductor film MC1 containing aluminum as a main component is not doped with copper (Cu). This can prevent the diffusion of copper (Cu) into the interlayer insulation film and the semiconductor substrate SB. As a result, it is possible to improve the reliability of the semiconductor device (the semiconductor device CP and the semiconductor device PKG using the same).

Further, in order to reduce the resistance of the wire M1, the total of the thickness of the main conductor film MC1 and the thickness of the main conductor film MC2 is preferably larger than the thickness of the conductor film BR1. Whereas, respective resistivities (specific resistances) of the main conductor films MC1 and MC2 are preferably lower than the resistivity of the conductor film BR1.

Further, the thickness of the main conductor film MC1 is more preferably larger than the thickness of the main conductor film MC2. The thickness of the main conductor film MC1 is set larger than the thickness of the main conductor film MC2. Then, when a crack (the equivalent of the crack CR) is caused in the main conductor film MC2, the thick main conductor film MC1 can ensure a conduction (conductive path). Accordingly, it becomes easy to suppress the deficiency (such as an increase in resistance) when a crack is caused in the main conductor film MC2.

Whereas, when the conductor film BR1 is made too thin, the effect of being capable of suppressing or preventing a crack from being caused in the main conductor film MC by the provision of the conductor film BR1 is reduced. From this viewpoint, the thickness of the conductor film BR1 is preferably 100 nm or more. As a result, the provision of the conductor film BR1 can precisely suppress or prevent a crack from being caused in the main conductor film MC1.

Further, a too large thickness of the conductor film. BR1 is disadvantageous for reducing the resistance of the wire M1. From this viewpoint, the thickness of the conductor film BR1 is more preferably 500 nm or less. This is advantageous for reducing the resistance of the wire M1. Therefore, the thickness of the conductor film BR1 is in particular preferably 100 to 500 nm.

Whereas, a comparison between First Embodiment and the present Second Embodiment indicates as follows: in the case of the present Second Embodiment, the provision of the conductor film BR1 can prevent a crack in the main conductor film MC1; in contrast, in the case of First Embodiment, the provision of the conductor film BR can prevent a crack in the whole main conductor film MC. For this reason, First Embodiment is more advantageous than the present Second Embodiment in that the reliability of the wire M1 which is a conductive film pattern for a coupling terminal (i.e., for a pad) is improved as much as possible. On the other hand, in the case of the present Second Embodiment, the base of the nickel layer ME1 is the main conductor film MC2 containing aluminum as a main component. For this reason, it becomes easier to form the nickel layer ME1 by a plating method (more preferably, an electroless plating method).

Third Embodiment

The present Third Embodiment is characterized in that, in the semiconductor device (semiconductor chip) CP, a palladium (Pd) layer ME3 is interposed between a nickel (Ni) layer ME1 and a gold (Au) layer ME2. Namely, over the nickel layer ME1, there is formed the palladium layer ME3. Over the palladium layer ME3, there is formed the gold layer ME2. Specifically, the nickel layer ME1 is formed over the wire M1 at a portion thereof exposed from the opening OP. The palladium layer ME3 is formed over the entire top surface of the nickel layer ME1 in the opening OP. The gold layer ME2 is formed over the entire top surface of the palladium layer ME3 in the opening OP.

Figure 35:
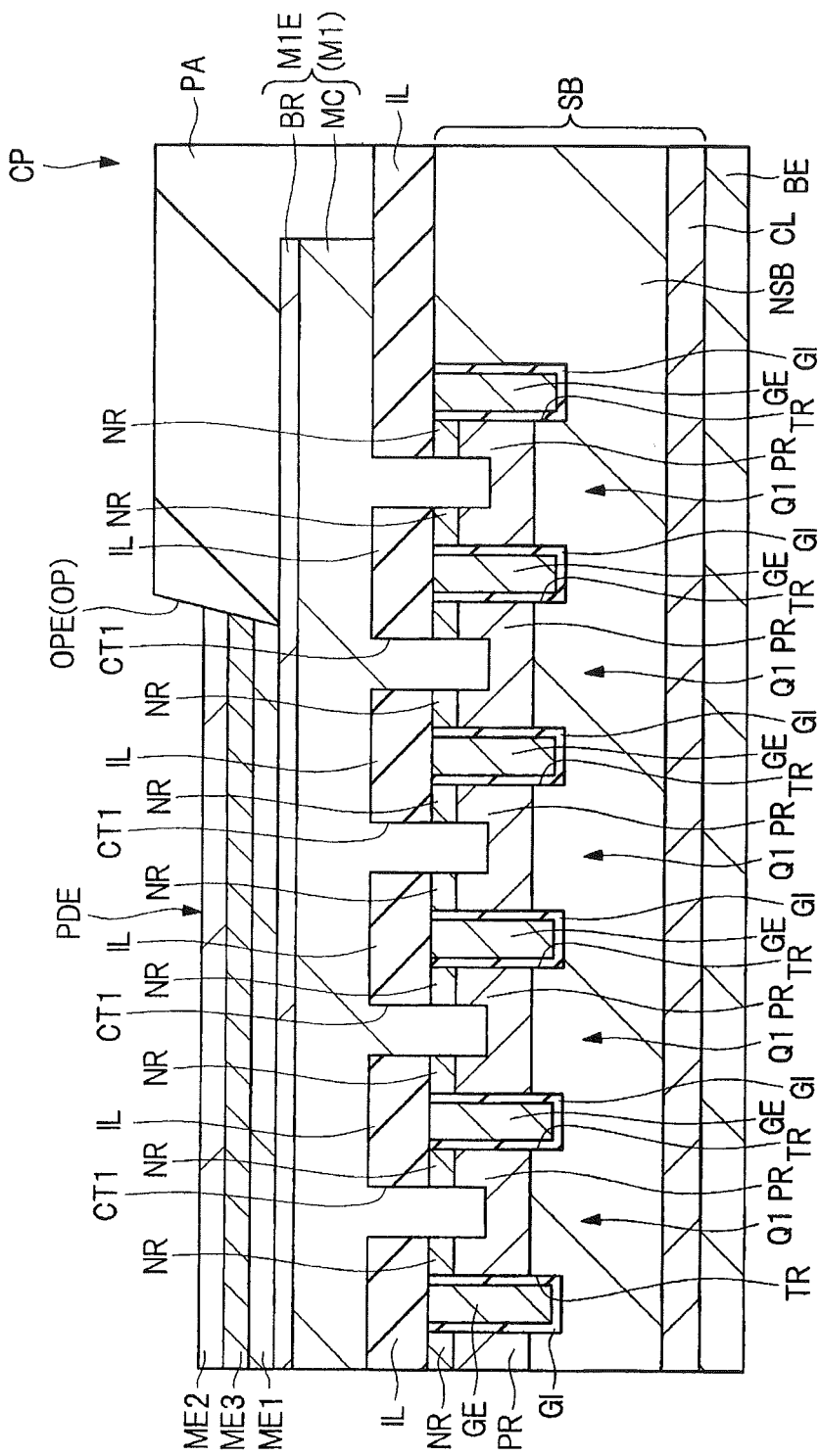
FIG. 35 is an essential part cross sectional view of the semiconductor device of the another embodiment.
Figure 36:
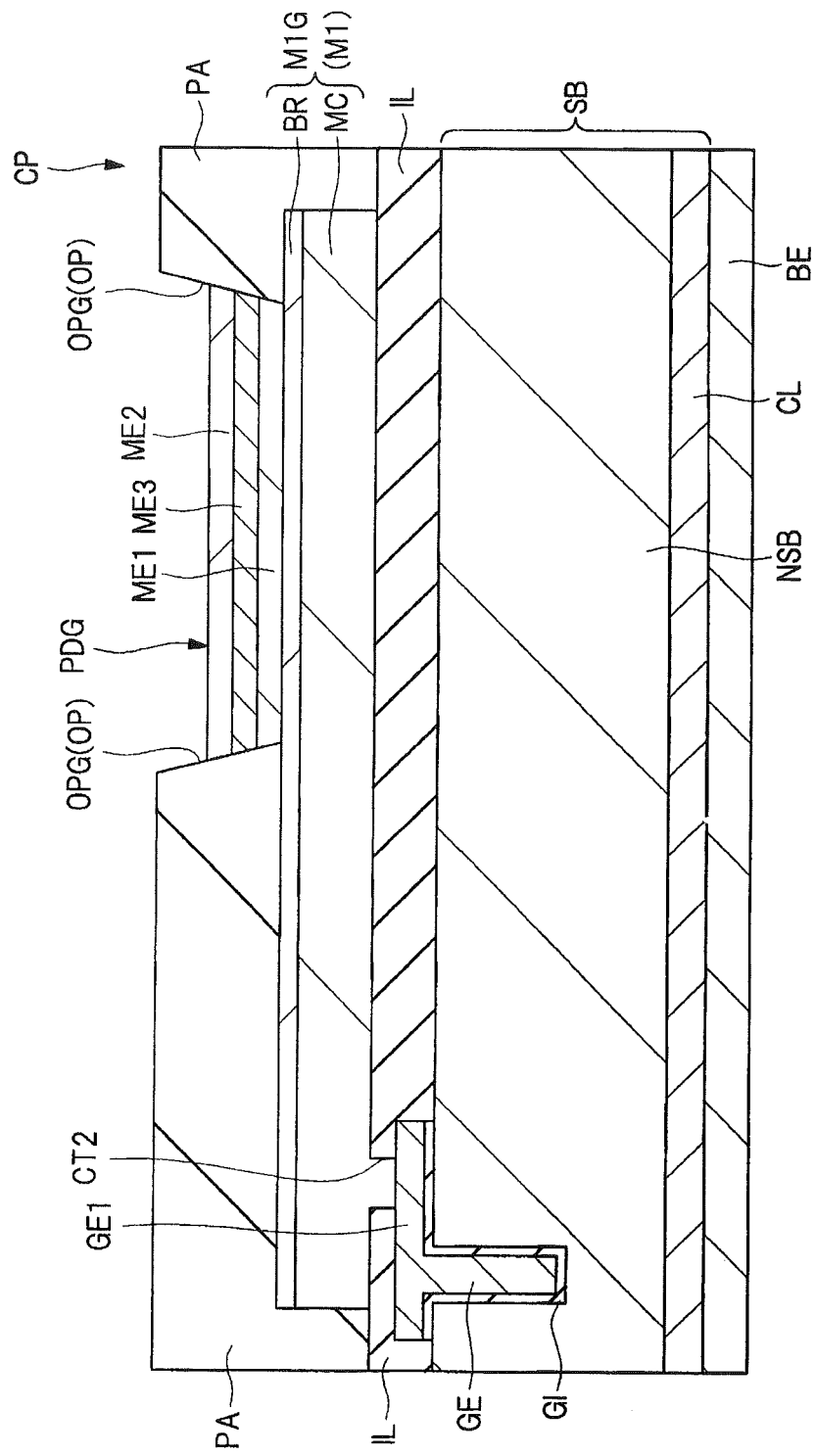
FIG. 36 is an essential part cross sectional view of the semiconductor device of the another embodiment.
Figure 37:
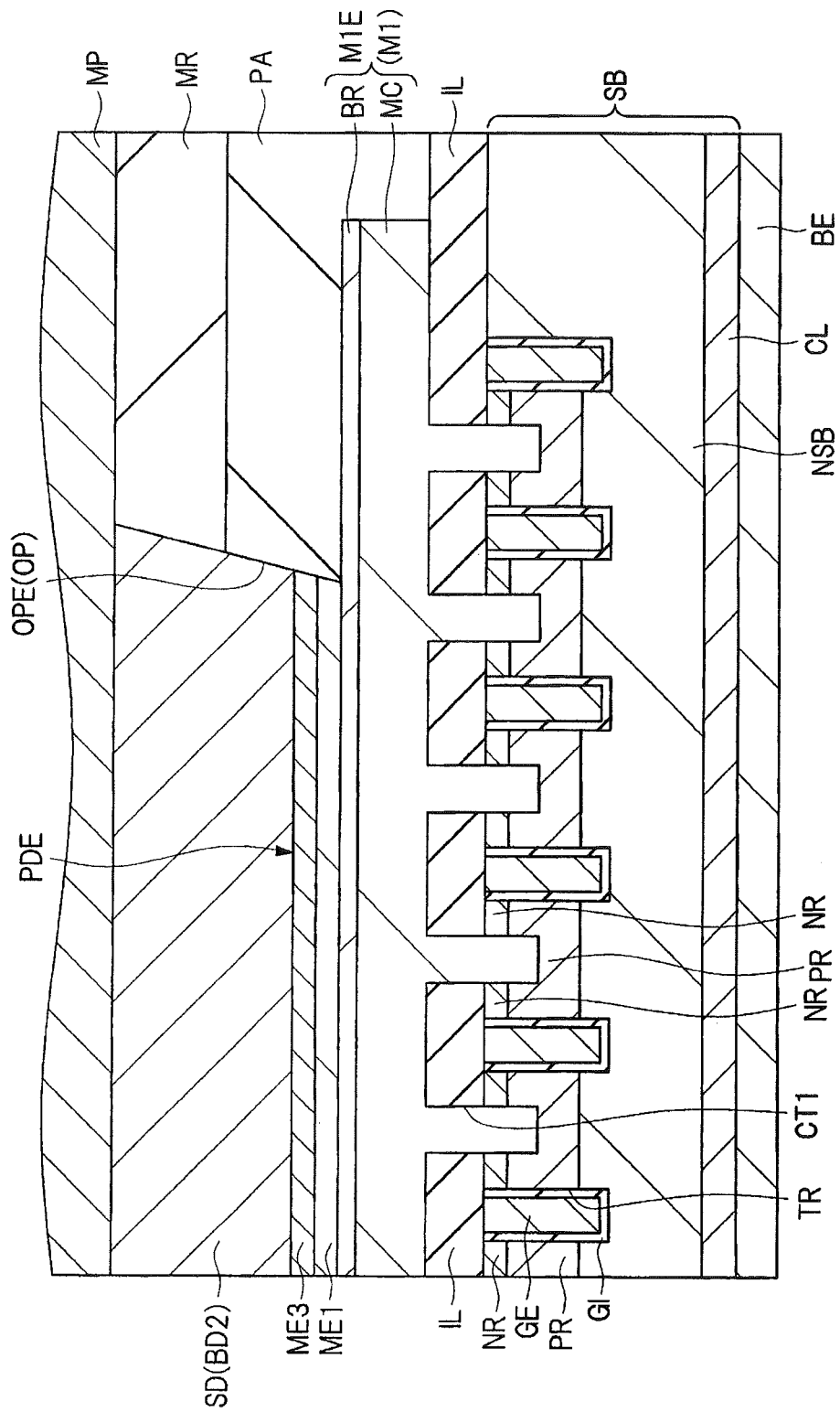
FIG. 37 is an essential part cross sectional view of the semiconductor device of the another embodiment.

The case where the present Third Embodiment is applied to the semiconductor device CP of First Embodiment is shown in FIGS. 35 to 37. Whereas, the case where the present Third Embodiment is applied to the semiconductor device CP of Second Embodiment is shown in FIGS. 38 to 40.

FIGS. 35 and 36 are each an essential part cross sectional view of the semiconductor device (semiconductor chip) CP when the present Third Embodiment is applied to First Embodiment. FIG. 35 corresponds to FIG. 12 of First Embodiment. FIG. 36 corresponds to FIG. 13 of First Embodiment. FIG. 37 is an essential part cross sectional view of the semiconductor device PKG when the present Third Embodiment is applied to First Embodiment, and corresponds to FIG. 14 of First Embodiment. FIGS. 38 and 39 are each an essential part cross sectional view of the semiconductor device (semiconductor chip) CP when the present Third Embodiment is applied to Second Embodiment. FIG. 38 corresponds to FIG. 32 of Second Embodiment. FIG. 39 corresponds to FIG. 33 of Second Embodiment. FIG. 40 is an essential part cross sectional view of the semiconductor device PKG when the present Third Embodiment is applied to Second Embodiment, and corresponds to FIG. 34 of Second Embodiment.

In FIGS. 35 and 36 corresponding to FIGS. 12 and 13, respectively, a palladium layer ME3 is interposed between the nickel layer ME1 and the gold layer ME2. Incidentally, FIG. 35 shows that in the emitter pad PDE, the palladium layer ME3 is interposed between the nickel layer ME1 and the gold layer ME2. Whereas, as shown in FIG. 36, also in the gate pad PDG, the palladium layer ME3 is interposed between the nickel layer ME1 and the gold layer ME2. In other respects, the structure of the semiconductor device CP of FIGS. 35 and 36 is the same as the structure of the semiconductor device CP of First Embodiment (FIG. 1, FIG. 2, FIG. 12, and FIG. 13).

Figure 38:
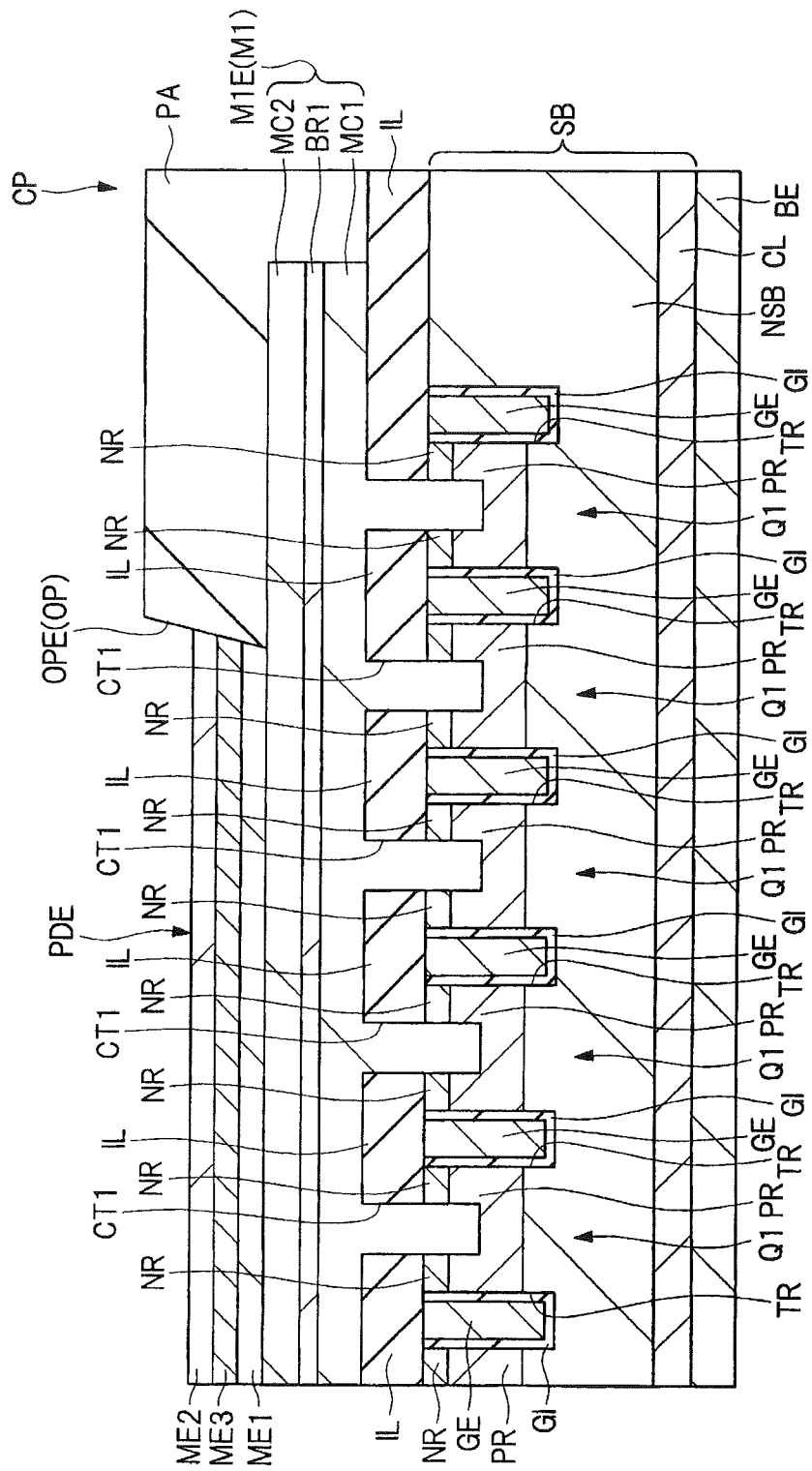
FIG. 38 is an essential part cross sectional view of a semiconductor device of a still other embodiment.
Figure 39:
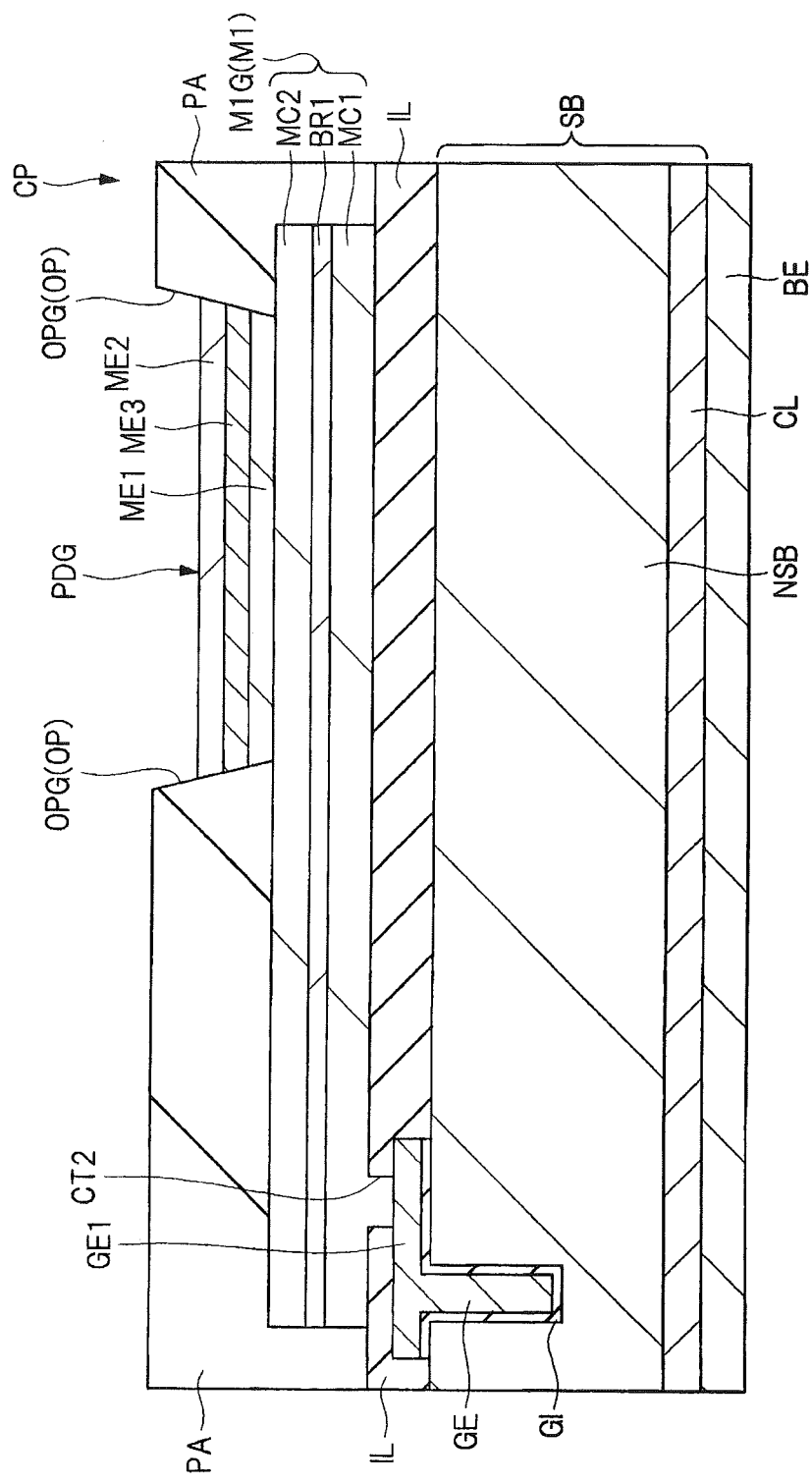
FIG. 39 is an essential part cross sectional view of the semiconductor device of the still other embodiment.

In FIGS. 38 and 39 corresponding to FIGS. 32 and 33, respectively, a palladium layer ME3 is interposed between a nickel layer ME1 and a gold layer ME2. Incidentally, FIG. 38 shows that, in the emitter pad PDE, the palladium layer ME3 is interposed between the nickel layer ME1 and the gold layer ME2. However, as shown in FIG. 39, also in the gate pad PDG, the palladium layer ME3 is interposed between the nickel layer ME1 and the gold layer ME2. In other respects, the structure of the semiconductor device CP of FIGS. 38 and 39 is the same as the structure of the semiconductor device CP of Second Embodiment (FIG. 32 and FIG. 33).

The thickness of the palladium layer ME3 can be set at, for example, about 100 to 400 nm.

In the manufacturing steps of the semiconductor device CP of the present Third Embodiment, in a step corresponding to FIG. 26, over the wire M1 exposed from the opening OP, there may only be sequentially formed the nickel (Ni) layer ME1, the palladium (Pd) layer ME3, and the gold (Au) layer ME2. This results in that, over the wire M1 exposed from the opening OP, there is formed a lamination film (lamination metal film) of the nickel layer ME1, the palladium layer ME3 over the nickel layer ME1, and the gold layer ME2 over the palladium layer ME3. The nickel layer ME1, the palladium layer ME3, and the gold layer ME2 can be each formed using a plating method (preferably, an electroless plating method). In other respects, the manufacturing steps of the semiconductor device CP of the present Third Embodiment are basically the same as those of First Embodiment or Second Embodiment.

A conductive member such as the metal plate MP is bonded via the solder SD (adhesive layer BD2) with the emitter pad PDE shown in FIG. 35, or the emitter pad PDE shown in FIG. 38. Then, the gold layer ME2 which has formed the uppermost layer of the emitter pad PDE reacts with the solder SD, and is incorporated into the solder SD, to be alloyed. From another viewpoint, the gold layer ME2 which has formed the uppermost layer of the emitter pad PDE is rendered in a state mixed with the solder SD. For this reason, when a conductive member such as the metal plate MP is bonded via the solder SD (adhesive layer BD2) with the emitter pad PDE shown in FIG. 35, as shown in FIG. 37, the uppermost layer of the emitter pad PDE is not the gold layer ME2, but the palladium layer ME3. Similarly, when a conductive member such as the metal plate MP is bonded via the solder SD (adhesive layer BD2) with the emitter pad PDE shown in FIG. 38, as shown in FIG. 40, the uppermost layer of the emitter pad PDE is not the gold layer ME2, but the palladium layer ME3. Incidentally, optionally, even when a conductive member such as the metal plate MP is bonded via the solder SD (adhesive layer BD2) with the emitter pad PDE, a part of the gold layer ME2 may be left between the solder SD and the palladium layer ME3.

In the present Third Embodiment, the palladium layer ME3 is provided between the nickel layer ME1 and the gold layer ME2. The palladium layer can also function as a solder barrier layer. However, the nickel layer is superior in function as a solder barrier layer to the palladium layer. However, palladium (Pd) is lower in elastic modulus, and also slightly lower in thermal expansion coefficient (see FIG. 31) than nickel (Ni). For this reason, by forming the palladium layer ME3 over the nickel layer ME1 as in the present Third Embodiment, it is possible to relieve the tensile stress acting on the wire M1 (particularly, the conductor film BR for FIG. 37, and particularly, the main conductor film MC2 for FIG. 40). Further, the palladium layer ME3 is formed over the nickel layer ME1 as in the present Third Embodiment. As a result, it becomes possible to reduce the thickness of the nickel layer ME1 by that much. Accordingly, it is also possible to reduce the tensile stress acting on the wire M1 due to the nickel layer ME1. For this reason, by forming the palladium layer ME3 over the nickel layer ME1 as in the present Third Embodiment, it is possible to further enhance the effect of being capable of suppressing or preventing a crack (the equivalent of the crack CR) from being caused in the wire M1. Therefore, it is possible to further improve the reliability of the semiconductor device (the semiconductor device CP, and the semiconductor device PKG using the same).

Further, the semiconductor device CP to which the present Third Embodiment is applied can be used for the semiconductor device PKG of First Embodiment (see FIGS. 3 to 10). Whereas, the semiconductor device CP to which the present Third Embodiment is applied can be used for the electronic system (electronic device) of FIG. 28 of First Embodiment. Alternatively, the semiconductor package (semiconductor device PKG) using the semiconductor device CP to which the present Third Embodiment is applied can be used for the electronic system (electronic device) of FIG. 28 of First Embodiment.

Up to this point, the invention completed by the present inventors was specifically described by way of embodiments thereof. However, it is naturally understood that the present invention is not limited to the embodiments, and may be variously changed within the scope not departing from the gist thereof.

What is claimed is:

1. A semiconductor device, comprising:
a semiconductor chip having a main surface, and a back surface opposite to the main surface, and having a first terminal on the main surface side, and a second terminal on the back surface side; and
a metal plate electrically coupled to the first terminal of the semiconductor chip via a solder,
wherein the semiconductor chip includes:
a semiconductor substrate;
an interlayer insulation film formed over the semiconductor substrate;
a first conductive film pattern for the first terminal, formed over the interlayer insulation film;
an insulation film formed over the interlayer insulation film in such a manner as to cover the first conductive film pattern;
a first opening for the first terminal formed in the insulation film, and for exposing apart of the first conductive film pattern; and
a first nickel film formed over the first conductive film pattern at a portion thereof exposed from the first opening,
wherein a semiconductor element for controlling the conduction between the first terminal and the second terminal is formed at the semiconductor substrate,
wherein the first terminal is formed of the first conductive film pattern and the first nickel film,
wherein the first conductive film pattern is formed of a lamination film having a first conductor film containing aluminum as a main component, and a second conductor film formed over the entire top surface of the first conductor film,
wherein the first nickel film is formed over the second conductor film at a portion thereof exposed from the first opening, and
wherein the second conductor film is formed of a titanium film, a tungsten film, or a titanium tungsten film.

2. The semiconductor device according to claim 1,
wherein the semiconductor chip further has a control terminal for controlling the conduction between the first terminal and the second terminal on the main surface side, and
wherein the control terminal is formed of a second conductive film pattern at the same layer as the first conductive film pattern, and a second nickel film formed over the second conductive film pattern at a portion thereof exposed from a second opening for the control terminal formed in the insulation film.

3. The semiconductor device according to claim 2,
wherein the semiconductor element is a trench gate type IGBT,
wherein the first terminal is an emitter terminal,
wherein the second terminal is a collector terminal, and
wherein the control terminal is a gate terminal.

4. The semiconductor device according to claim 1,
wherein the semiconductor chip further has a palladium film formed over the first nickel film, and
wherein the first terminal is formed of the first conductive film pattern, the first nickel film, and the palladium film.

5. A semiconductor device, comprising:
a semiconductor substrate;
an interlayer insulation film formed over a main surface of the semiconductor substrate;
a conductive film pattern for a coupling terminal, formed over the interlayer insulation film;
an insulation film formed over the interlayer insulation film in such a manner as to cover the conductive film pattern;
an opening for a coupling terminal, formed in the insulation film, and for exposing apart of the conductive film pattern; and
a nickel film formed over the conductive film pattern at a portion thereof exposed from the opening,
wherein the conductive film pattern is formed of a lamination film having a first conductor film containing aluminum as a main component, and a second conductor film formed over the entire top surface of the first conductor film,
wherein the nickel film is formed over the second conductor film at a portion thereof exposed from the opening, and
wherein the second conductor film is formed of a titanium film, a tungsten film, or a titanium tungsten film.

6. The semiconductor device according to claim 5, further comprising a gold film formed over the nickel film.

7. The semiconductor device according to claim 6, further comprising a palladium film interposed between the nickel film and the gold film.

8. The semiconductor device according to claim 5, further comprising a back surface electrode formed over a back surface opposite to the main surface of the semiconductor substrate,
wherein a semiconductor element for controlling the conduction between the conductive film pattern and the back surface electrode is formed at the semiconductor substrate.

9. The semiconductor device according to claim 8,
wherein the semiconductor element is a trench gate type IGBT,
wherein the conductive film pattern is a conductive film pattern for an emitter, and
wherein the back surface electrode is a back surface electrode for a collector.

10. An electronic device, comprising:
a semiconductor device individually electrically coupled with a power supply and a load, and for driving the load; and
a control part for controlling the semiconductor device,
the semiconductor device, having:
a semiconductor chip having a main surface, and a back surface opposite to the main surface, and having a first terminal on the main surface side, and a second terminal on the back surface side; and
a metal plate electrically coupled to the first terminal of the semiconductor chip via a solder,
wherein the semiconductor chip includes:
a semiconductor substrate;
an interlayer insulation film formed over the semiconductor substrate;
a first conductive film pattern for the first terminal, formed over the interlayer insulation film;
an insulation film formed over the interlayer insulation film in such a manner as to cover the first conductive film pattern;
a first opening for the first terminal, formed in the insulation film, and for exposing apart of the first conductive film pattern; and
a first nickel film formed over the first conductive film pattern at a portion thereof exposed from the first opening,
wherein a semiconductor element for controlling the conduction between the first terminal and the second terminal is formed at the semiconductor substrate, wherein the first terminal is formed of the first conductive film pattern and the first nickel film, wherein the first conductive film pattern is formed of a lamination film having a first conductor film containing aluminum as a main component, and a second conductor film formed over the entire top surface of the first conductor film, wherein the first nickel film is formed over the second conductor film at a portion thereof exposed from the first opening, and wherein the second conductor film is formed of a titanium film, a tungsten film, or a titanium tungsten film.

11. The electronic device according to claim 10, wherein the semiconductor chip further has a control terminal for controlling the conduction between the first terminal and the second terminal on the main surface side, and wherein the control terminal is formed of a second conductive film pattern at the same layer as the first conductive film pattern, and a second nickel film formed over the second conductive film pattern at a portion thereof exposed from a second opening for the control terminal formed in the insulation film.

12. The electronic device according to claim 11, wherein the semiconductor element is a trench gate type IGBT, wherein the first terminal is an emitter terminal, wherein the second terminal is a collector terminal, and wherein the control terminal is a gate terminal.

13. The electronic device according to claim 10, wherein the semiconductor chip further has a palladium film formed over the first nickel film, and wherein the first terminal is formed of the first conductive film pattern, the first nickel film, and the palladium film.

14. The electronic device according to claim 10, wherein the semiconductor device is a constituent element of an inverter.

15. A semiconductor device, comprising:

a semiconductor chip having a main surface, and a back surface opposite to the main surface, and having a first terminal on the main surface side, and a second terminal on the back surface side; and a metal plate electrically coupled to the first terminal of the semiconductor chip via a solder, wherein the semiconductor chip includes:

a semiconductor substrate;

an interlayer insulation film formed over the semiconductor substrate;

a first conductive film pattern for the first terminal, formed over the interlayer insulation film;

an insulation film formed over the interlayer insulation film in such a manner as to cover the first conductive film pattern;

a first opening for the first terminal formed in the insulation film, and for exposing apart of the first conductive film pattern; and a first nickel film formed over the first conductive film pattern at a portion thereof exposed from the first opening, wherein a semiconductor element for controlling the conduction between the first terminal and the second terminal is formed at the semiconductor substrate, wherein the first terminal is formed of the first conductive film pattern and the first nickel film, wherein the first conductive film pattern is formed of a lamination film having a first conductor film containing aluminum as a main component, a second conductor film formed over the first conductor film, and a third conductor film formed over the second conductor film, and containing aluminum as a main component, wherein the first nickel film is formed over the third conductor film at a portion thereof exposed from the first opening, wherein the first conductor film is not doped with copper, wherein the second conductor film is formed of a titanium film, a tungsten film, or a titanium tungsten film, and wherein the third conductor film is doped with copper.

16. The semiconductor device according to claim 15, wherein the semiconductor chip further has a control terminal for controlling the conduction between the first terminal and the second terminal on the main surface side, and wherein the control terminal is formed of a second conductive film pattern at the same layer as the first conductive film pattern, and a second nickel film formed over the second conductive film pattern at a portion thereof exposed from a second opening for the control terminal formed in the insulation film.

17. The semiconductor device according to claim 16, wherein the semiconductor element is a trench gate type IGBT, wherein the first terminal is an emitter terminal, wherein the second terminal is a collector terminal, and wherein the control terminal is a gate terminal.

18. The semiconductor device according to claim 15, wherein the semiconductor chip further has a palladium film formed over the first nickel film, and wherein the first terminal is formed of the first conductive film pattern, the first nickel film, and the palladium film.

19. A semiconductor device, comprising:

a semiconductor substrate;

an interlayer insulation film formed over a main surface of the semiconductor substrate;

a conductive film pattern for a coupling terminal, formed over the interlayer insulation film;

an insulation film formed over the interlayer insulation film in such a manner as to cover the conductive film pattern;

an opening for a coupling terminal formed in the insulation film, and for exposing a part of the conductive film pattern, and;

a nickel film formed over the conductive film pattern at a portion thereof exposed from the opening, wherein the conductive film pattern is formed of a lamination film having a first conductor film containing aluminum as a main component, a second conductor film formed over the first conductor film, and a third conductor film formed over the second conductor film, and containing aluminum as a main component, wherein the nickel film is formed over the third conductor film at a portion thereof exposed from the opening, wherein the first conductor film is not doped with copper, wherein the second conductor film is formed of a titanium film, a tungsten film, or a titanium tungsten film, and wherein the third conductor film is doped with copper.

20. The semiconductor device according to claim 19, further comprising a gold film formed over the nickel film.

21. The semiconductor device according to claim 20, further comprising a palladium film interposed between the nickel film and the gold film.

22. The semiconductor device according to claim 19, further comprising a back surface electrode formed over a back surface opposite to the main surface of the semiconductor substrate, wherein a semiconductor element for controlling the conduction between the conductive film pattern and the back surface electrode is formed over the semiconductor substrate.

23. The semiconductor device according to claim 22,
wherein the semiconductor element is a trench gate type IGBT,
wherein the conductive film pattern is a conductive film pattern for an emitter, and
wherein the back surface electrode is a back surface electrode for a collector.

24. An electronic device, comprising:
a semiconductor device individually electrically coupled with a power supply and a load, and for driving the load; and
a control part for controlling the semiconductor device,
wherein the semiconductor device includes:
a semiconductor chip having a main surface, and a back surface opposite to the main surface, and having a first terminal on the main surface side, and a second terminal on the back surface side; and
a metal plate electrically coupled to the first terminal of the semiconductor chip via a solder,
wherein the semiconductor chip includes:
a semiconductor substrate;
an interlayer insulation film formed over the semiconductor substrate;
a first conductive film pattern for the first terminal, formed over the interlayer insulation film;
an insulation film formed over the interlayer insulation film in such a manner as to cover the first conductive film pattern;
a first opening for the first terminal, formed in the insulation film, and for exposing apart of the first conductive film pattern; and
a first nickel film formed over the first conductive film pattern at a portion thereof exposed from the first opening,
wherein a semiconductor element for controlling the conduction between the first terminal and the second terminal is formed at the semiconductor substrate,
wherein the first terminal is formed of the first conductive film pattern and the first nickel film,
wherein the first conductive film pattern is formed of a lamination film having a first conductor film containing aluminum as a main component, a second conductor film formed over the first conductor film, and a third conductor film formed over the second conductor film, and containing aluminum as a main component,
wherein the first nickel film is formed over the third conductor film at a portion thereof exposed from the first opening,
wherein the first conductor film is not doped with copper,
wherein the second conductor film is formed of a titanium film, a tungsten film, or a titanium tungsten film, and
wherein the third conductor film is doped with copper.

25. The electronic device according to claim 24,
wherein the semiconductor chip further has a control terminal for controlling the conduction between the first terminal and the second terminal on the main surface side, and
wherein the control terminal is formed of a second conductive film pattern at the same layer as the first conductive film pattern, and a second nickel film formed over the second conductive film pattern at a portion thereof exposed from a second opening for the control terminal formed in the insulation film.

26. The electronic device according to claim 25,
wherein the semiconductor element is a trench gate type IGBT,
wherein the first terminal is an emitter terminal,
wherein the second terminal is a collector terminal, and
wherein the control terminal is a gate terminal.

27. The electronic device according to claim 24,
wherein the semiconductor chip further has a palladium film formed over the first nickel film, and
wherein the first terminal is formed of the first conductive film pattern, the first nickel film, and the palladium film.

28. The electronic device according to claim 24, wherein the semiconductor device is a constituent element of an inverter.

* * * * *